(12) United States Patent  
    Udrea et al.

(10) Patent No.:    US 12,640,732 B2  
(45) Date of Patent:     May 26, 2026

---

(54) SEMICONDUCTOR SWITCH

(71) Applicant: Cambridge GaN Devices Limited, Cambridge (GB)

(72) Inventors: Florin Udrea, Cambridge (GB); John William Findlay, Cambridge (GB)

(73) Assignee: CAMBRIDGE GAN DEVICES LIMITED, Cambridge (GB)

( * ) Notice: Subject to any disclaimer, the term of this patent is extended or adjusted under 35 U.S.C. 154(b) by 0 days.

(21) Appl. No.: 18/668,825

(22) Filed: May 20, 2024

(65) Prior Publication Data

US 2025/0096794 A1     Mar. 20, 2025

Related U.S. Application Data

(63) Continuation-in-part of application No. 18/393,946, filed on Dec. 22, 2023.

(30) Foreign Application Priority Data

Sep. 18, 2023    (GB) ..................................... 2314270  
Dec. 22, 2023    (LU) ....................................... 505902

(51) Int. Cl.  
    *H03K 17/567*     (2006.01)  
    *H03K 17/687*     (2006.01)

(52) U.S. Cl.  
    CPC ......... *H03K 17/567* (2013.01); *H03K 17/687* (2013.01); *H03K 2217/0063* (2013.01)

(58) Field of Classification Search  
    CPC ............... H03K 17/567; H03K 17/687; H03K 2217/0063  
    See application file for complete search history.

(56) References Cited

U.S. PATENT DOCUMENTS

| | | | |
|---|---|---|---|
| 5,939,941 A | 8/1999 | Nair et al. | |
| 10,230,294 B2 * | 3/2019 | Zushi ................... | H03K 17/165 |
| 10,818,786 B1 | 10/2020 | Udrea et al. | |
| 11,217,687 B2 | 1/2022 | Udrea et al. | |
| 11,404,565 B2 | 8/2022 | Udrea et al. | |
| 2013/0062626 A1 | 3/2013 | Takao et al. | |

(Continued)

FOREIGN PATENT DOCUMENTS

| | | |
|---|---|---|
| WO | 2018158726 A1 | 9/2018 |
| WO | 2020225359 A1 | 11/2020 |

(Continued)

OTHER PUBLICATIONS

International Search Report and Written Opinion for international application No. PCT/GB2024/052407, dated Dec. 11, 2024, 17 pages.

(Continued)

*Primary Examiner* — Metasebia T Retebo  
(74) *Attorney, Agent, or Firm* — Tarolli, Sundheim, Covell & Tummino LLP

(57) ABSTRACT

A semiconductor switch comprising a high-electron-mobility transistor (HEMT) (e.g. a III-nitride HEMT). The semiconductor switch may be a combined switch also comprising a high voltage transistor device such as an insulated-gate bipolar transistor (IGBT), a metal-oxide-semiconductor field-effect transistor (MOSFET), or a superjunction. The high voltage transistor device may be a silicon or silicon carbide device.

25 Claims, 29 Drawing Sheets

(56) References Cited

U.S. PATENT DOCUMENTS

| | | | |
|---|---|---|---|
| 2014/0185346 A1 | 7/2014 | Liu et al. | |
| 2014/0225162 A1 | 8/2014 | Briere | |
| 2015/0014698 A1 | 1/2015 | Briere | |
| 2016/0261261 A1* | 9/2016 | Bryson | H02H 9/04 |
| 2017/0256538 A1 | 9/2017 | Lu et al. | |
| 2017/0345917 A1 | 11/2017 | Basler et al. | |
| 2017/0365533 A1 | 12/2017 | Cho et al. | |
| 2017/0373682 A1* | 12/2017 | Laschek-Enders | H10D 84/811 |
| 2019/0386652 A1* | 12/2019 | Korner | H03K 17/122 |
| 2020/0105741 A1 | 4/2020 | Lin et al. | |
| 2020/0168599 A1 | 5/2020 | Udrea et al. | |
| 2020/0357907 A1 | 11/2020 | Udrea et al. | |
| 2020/0357909 A1 | 11/2020 | Udrea et al. | |
| 2021/0335781 A1 | 10/2021 | Arnold et al. | |
| 2023/0131602 A1 | 4/2023 | Arnold et al. | |
| 2023/0170882 A1 | 6/2023 | Shah et al. | |
| 2023/0246615 A1 | 8/2023 | Arnold et al. | |
| 2023/0370059 A1 | 11/2023 | Chen | |
| 2025/0096797 A1 | 3/2025 | Udrea et al. | |

FOREIGN PATENT DOCUMENTS

| | | | |
|---|---|---|---|
| WO | 2020225362 A1 | 11/2020 | |
| WO | 2025062120 A1 | 3/2025 | |

OTHER PUBLICATIONS

Molnar, et al., "High Power Switch using IGBT and GaN MOSFET", IEEE 24th International Symposium for Design and Technology in Electronic Packaging, Oct. 25-28, 2018, pp. 43-48, Isai, Romania.

Rahimo, et al., "Characterization of Silicon IGBT and Silicon Carbide MOSFET Cross-Switch Hybrid", IEEE Transactions on Power Electronics, Sep. 2015, pp. 4638-4642, vol. 30, No. 9, Switzerland.

Sambhavi, et al.; "A technical review of modern traction inverter systems used in electric vehicle application"; Energy Reports; Oct. 25, 2023, pp. 3882-3907; 10; Elsevier Ltd.

Florin Udrea, et al., "The smart ICeGaN platform with sensing and protection functions for both enhanced ease of use and gate reliability", IEEE 34th International Symposium on Power Semiconductor Devices and ICS, May 22, 2022, pp. 41-44, Cambridge, UK.

Luxembourg Search Report for LU application No. 505902, dated Aug. 28, 2024, 9 pages.

Office Action for U.S. Appl. No. 18/393,946 dated Apr. 22, 2025, 30 pages.

Exam and Search Report for GB application No. GB2506908.9, dated Nov. 10, 2025, 9 pages.

Office Action for U.S. Appl. No. 18/393,946, dated Oct. 23, 2025, 22 pages.

Search Report for GB application No. GB2506906.3, issued Nov. 7, 2025, 6 pages.

Office Action for U.S. Appl. No. 18/393,946, dated Feb. 3, 2026, 22 pages.

* cited by examiner

470

Driving a control terminal, by a driver via a first driver output, at a first driving voltage.

(S472)

Driving a transistor device gate terminal, by the driver via a second driver output, at a second driving voltage.

(S474)

SEMICONDUCTOR SWITCH

TECHNICAL FIELD

The present disclosure relates to a semiconductor switch. Particularly, but not exclusively, the disclosure relates to a parallel switch based on a high-electron-mobility transistor (HEMT) (e.g. a III-nitride HEMT) and optionally a high voltage transistor device such as an insulated-gate bipolar transistor (IGBT), a metal-oxide-semiconductor field-effect transistor (MOSFET), or a superjunction. The high voltage transistor device may be a silicon or silicon carbide device.

BACKGROUND

IGBTs

Insulated Gate Bipolar transistors (IGBTs) are silicon devices that employ bipolar conduction while maintaining MOS gate control. The bipolar conduction allows for conductivity modulation of the drift region which in turn results in low on-state resistance. The conductivity modulation depends on the current density level. Above a certain current density level (e.g. 0.1 A/cm2), the excess charged (plasma) brought by the bipolar injection of holes and electrons could be larger than the doping charge level of the drift region and therefore resulting an increase in the conductivity of the drift region. The higher the current density, the larger the plasma created in the drift region and therefore the lower the on-state resistance of the drift region. IGBTs are used as switches in high voltage and high power applications. Their typical blocking voltage range is very wide, from 600 V to 6.5 kV, while typical current range is also very wide and varies from a few Amps to thousands of Amps. The on-state voltage drop across the drift region (the region that blocks the voltage during off-state) is directly proportional to the on-state resistance and therefore a smaller on-state resistance results in a lower voltage drop and a more efficient device in the on-state. The simplest equivalent circuit description of an IGBT is that of a metal-oxide-semiconductor field-effect transistor (MOSFET) device driving the base terminal of a bipolar transistor. Most IGBTs are n-channel devices. For these the MOSFET is an n-channel and the transistor is a pnp transistor. The base region of the pnp transistor is the n-type doped drift region of the IGBT. The total on-state voltage drop of the IGBT is approximately given by the sum of the voltage drop across the base-emitter junction of the pnp transistor, the voltage drop across the drift region and the voltage drop across the n-channel of the MOSFET component. The IGBT conducts no current until the base-emitter junction of the pnp transistor is forward-biased. For this, at room temperature, a minimum voltage drop of 0.7 V (at room temperature) is needed between its main terminals. The collector terminal of the IGBT is defined as the high voltage terminal in the forward conduction, while the emitter terminal is defined as the low voltage terminal in the forward conduction. The gate terminal modulates the channel resistance and therefore modulates the electron injection into the base of the pnp transistor.

Note that the collector terminal of the IGBT is in fact the emitter terminal of the pnp transistor and the emitter terminal of the IGBT is in fact both the collector terminal of the pnp transistor and the source terminal of the MOSFET component. The collector junction of the IGBT is the same as emitter-base junction of the PNP transistor.

The IGBT has superior on-state characteristics but in general is quite slow due to the need to build and remove the plasma (excess charge of minority carriers, electrons and holes in equilibrium) during the turn-on and turn-off transients. In particular the removal of the plasma is a slow process dictated by (i) the sweeping action of the depletion region, when the voltage builds up in the depletion region and (ii) by the recombination of carriers.

The IGBT does not conduct until 0.7 V at room temperature. This voltage level goes down as the temperature is increased. The rate at which it goes down is ~1.5 to 2 mV/deg C. Nevertheless this is considered a weakness of the IGBT.

IGBTs are used extensively in motor control applications and they tend to operate at relatively lower frequencies (e.g. 1 to 30 KHz). One of their important applications is that of inverters in electric cars. Here 6 IGBTs (or 6 sets of IGBTs connected in parallel) are used as three half bridges per each of the three phases driving a motor.

IGBTs have an interesting temperature behavior. At relatively low on-state voltage drops (low currents) the IGBTs have a negative temperature coefficient-meaning that their on-state voltage drop decreases with temperature while at relatively higher on-state voltage drops (higher currents) the IGBTs have a positive temperature coefficient-meaning that their on-state voltage drop increases with temperature. At low currents the bipolar effect is prominent while at higher currents and eventually during the channel saturation, the MOSFET effect becomes prominent. For a nominal current the IGBTs are generally designed to have a mild positive temperature coefficient, meaning that their voltage drop increases slightly with temperature. This is a good compromise between avoiding high on-state losses at high temperatures while allowing for easy-paralleling and avoiding runaway thermal effects.

The IGBTs have good short-circuit capability and limited avalanche capability. They also have good reliability and most IGBTs are rated for a maximum junction temperature of 175° C.

Silicon Carbide

Silicon Carbide MOSFETs are unipolar devices (during forward conduction) and are considered good alternatives to the IGBTs. They are faster and they do not have the IGBTs 0.7 V weakness. Unlike silicon MOSFET and silicon Superjunctions, Silicon Carbide MOSFETs and Silicon Carbide superjunctions do not suffer from a very high positive temperature coefficient and in this way they match the high performance of the IGBTs at high temperatures. While drift mobility decreases with temperature, the channel mobility remains constant or even slightly increases with temperature. Silicon Carbide MOSFETs and Silicon Carbide Superjunctions are among the state-of-the-art devices today. When compared to Power MOSFET superjunctions, they have a lower specific on-state drift resistance due to the presence of n-type and p-type pillars in the drift region to further reduce the resistivity of the drift region. Nevertheless, the process of making n/p pillars within the drift region is complex leading to further increase in the cost.

In general, silicon carbide wafers and device processing are still significantly more expensive than those of silicon. Moreover, Silicon Carbide MOSFETs have lower short-circuit capability than the IGBTs and are vulnerable to threshold voltage instabilities and reliability effects during the bipolar reverse conduction.

In applications such as motor control (e.g. inverters in electric cars), the currently preferred devices are vertical switches. Bipolar devices in silicon such as IGBTs or silicon Carbide MOSFETs are the main switches in this market.

IGBTs are widely available, have relatively low cost, and they are currently manufactured in 12 inch wafers. As mentioned, their on-state performance is very good especially at high currents and/or high temperature. However, they only conduct forward currents above 0.7V (at room temperature) and therefore tend to be less efficient in low to medium load conditions. Silicon Carbide MOSFETs on the other hand are expensive and their availability is scarcer.

To scale-up in current (up to values of 1000 A), chips of IGBTs or SiC are placed in parallel within a module. In this way, very large area chips are avoided. This has the advantage of higher yield and creating multiple heat sources which results in a lower temperature increase.

Parallel combinations of Silicon Carbide MOSFETs and IGBTs have also been proposed in the prior art as shown in FIG. 1, which shows an IGBT in parallel with Silicon Carbide MOSFET, reproduced from M. Rahimo, IEEE TRANSACTIONS ON POWER ELECTRONICS, VOL. 30, NO. 9, September 2015, the contents of which are hereby incorporated by reference.

The silicon carbide MOSFET can conduct the forward current up to 0.7 V while both the IGBT and SiC can conduct above 0.7 V. However, the IGBTs and the SiC MOSFETs and superjunctions are vertical devices and therefore cannot integrate any smartness. No monolithic integration of sensing and protection features are present in state-of-the-art IGBTs and SiC MOSFETs.

GaN HEMT

Gallium Nitride (GaN) has been more recently considered as a very promising material for use in the field of power devices. The application areas range from portable consumer electronics, solar power inverters, electric vehicles, and power supplies. The wide band gap of the material (Eg=3.39 eV) results in high critical electric field (Ec=3.3 MV/cm) which can lead to the design of devices with a shorter drift region, and therefore lower on-state resistance if compared to a silicon-based device with the same breakdown voltage.

The use of an Aluminium Gallium Nitride (AlGaN)/GaN heterostructure also allows the formation of a two-dimensional electron gas (2DEG) at the hetero-interface where carriers can reach very high mobility [μ=2000 cm2/(Vs)] values. In addition, the piezopolarization charge present at the AlGaN/GaN heterostructure, results in a high electron density in the 2DEG layer (e.g. 1×1013 cm−2). These properties allow the development of High Electron Mobility Transistors (HEMTs) and Schottky barrier diodes with very competitive performance parameters. One common parameter used to compare power semiconductor transistors is Specific ON-state resistance or Specific Rds(ON). The specific Rds(ON) is the product of the resistance of a device times the area of the device on wafer. An extensive amount of research has focused on the development of power devices using AlGaN/GaN heterostructures.

Layers which constitute the AlGaN/GaN heterojunction transistor are often epitaxially grown on a substrate from a different material for example Silicon, Silicon Carbide or Sapphire. Epitaxial growth of GaN on different substrates has advantages and disadvantages both in terms of the complexity and cost of growing high quality layers and in terms of device performance. A non-exhaustive list of things to consider when choosing a suitable substrate is: substrate lattice constant mismatch with GaN, substrate thermal expansion coefficient mismatch with GaN, substrate cost, substrate thermal conductivity etc. Today, substrates such as silicon (using a transition layer to adapt the mismatch between GaN layers and silicon), semi-insulating silicon carbide, quartz and sapphire are present in the market or in advanced research.

GaN transistors based on a 2DEG are mainly available on a lateral configuration. While this is advantageous from a point of view of integrating additional smart circuits around the main power device, it does pose some limitations in terms of scalability at high currents (in excess of 100 A). Moreover, lateral GaN devices tend to be limited today to below 900 V rating, though this limit is expected to grow to 1.2 kV and beyond in the future.

There are different types of the gate structure available for GaN HEMTs. The p-Gan Gate features a layer of Magnesium doped GaN above the AlGaN layer. It delivers a positive threshold voltage of 1.3 to 1.7 V and results in an enhancement mode (normally-off) transistor. Currently this is the preferred solution in the market. The p-GaN gate technology has also some major disadvantages. If the gate voltage applied to the gate is in excess of 7 V the leakage current becomes very high leading to failure. Moreover, the relatively low threshold voltage does not give sufficient margin for avoiding retriggering on the transistor during the turn-off if the minimum voltage level is zero (ground). For this reason, often such transistors need negative voltage rails which make the driving more cumbersome and could result in some reliability issues such as the dynamic increase in the Rds (ON).

Other alternative technologies are based on an insulated gate or Schottky gate. The insulated gate is problematic for GaN due to traps in the insulated material and at the interface between the GaN or AlGaN and the insulated material. While this could deliver a higher threshold voltage, the reliability and reproducibility are currently poor and therefore there are no devices of this type in the market. The Schottky gate results in normally-on devices (depletion mode devices), which could only be used in a Cascode configuration or direct drive mode to deliver a normally-off solution. The Cascode relies on placing a silicon MOSFET in series with a depletion mode HEMT (based on Schottky gate technology) with the gate of the HEMT connected to the source of the silicon MOSFET and the drain of the Silicon MOSFET connected to the source of the depletion mode HEMT. The main advantage of this solution is the gate of the Cascode device is the insulated gate of the MOSFET which has a high degree of reliability, ease of use and can be easily tailored for a higher threshold voltage and extended voltage range. No negative voltage rail is needed. However, both the Cascode and direct drive configurations are based on two chip solution. Moreover, adjusting the slew rate in the Cascode configuration is not straightforward, as the gate of the depletion mode HEMT has a fixed potential (connected to the source of the MOSFET and not to the driver). While these solutions (i.e. direct drive and Cascode) are present in the market, they have a strong competition from enhancement gate GaN solutions.

It would be of interest to parallel GaN HEMTs with vertical devices such as IGBTs or SiC devices such as Power MOSFETs or Superjunctions. A simple, but problematic combination is shown in FIG. 2. GaN HEMTs are especially efficient at low on-state voltage drops, low on-state currents and lower temperatures, while devices such as IGBTs are inefficient at low currents (due to the forward voltage drop on the base-emitter junction of the pnp transistor) but have superior on-state characteristics at high currents and higher temperatures.

However, enhancement GaN devices cannot be easily paralleled with vertical devices such as IGBTs and/or SiC MOSFETs and/or SiC superjunctions. The gate voltage range for vertical devices is not aligned to that of the p-GaN HEMTs. P-GaN HEMTs tend to have a threshold voltage of around 1.5 V while IGBTs and SiC power MOSFETs and superjunctions have threshold voltages in excess of 3V (e.g. 4V). The maximum drive voltage for the p-GaN HEMT (to turn-on of the device and maintain it in the on-state) is limited to 7V, before the leakage current through the gate becomes too large. In contrast, IGBTs, SiC MOSFETs and Superjunctions are driven with a maximum voltage in excess of 10 V, and often in excess of 15 V (e.g. 20V). If the HEMT could be done with an insulated gate instead of a p-GaN gate, the threshold could be adjusted and the voltage range could be extended. However, insulated gate HEMTs are not currently available and the technology is not ready for the market as explained above.

Another approach in paralleling a HEMT with a vertical switch (in this case an IGBT) has been described by L. Molnar, 2018 IEEE 24th International Symposium for Design and Technology in Electronic Packaging (SIITME), 2018, the contents of which is hereby incorporated by reference (FIG. 3). The circuit implementation provided in FIG. 3 is however very complex with each of the GaN HEMT and the IGBT having a separate gate driver and a common digital control circuit. Furthermore, a monitor feedback circuit is also added for better sharing of current between the two components. The solution is too complex and not cost effective in high power applications.

SUMMARY

Aspects and preferred features are set out in the accompanying claims.

The present disclosure provides a semiconductor switch combining a high-electron-mobility transistor (HEMT), and another transistor device that may be, for example, an insulated-gate bipolar transistor (IGBT), a metal-oxide-semiconductor field-effect transistor (MOSFET), or a superjunction. The HEMT may be a lateral device, made in III-nitride material while the transistor device may be a vertical device, preferably made in silicon or silicon-carbide. Alternatively, the vertical device may be made in Vertical GaN, GaN on GaN or ultra wide bandgap materials such as Gallium Oxide (GaO) or Aluminium Nitride (AlN). While the HEMT and the other transistor device can be based on different material systems, the semiconductor switch according to the present disclosure can enable both devices to be driven using a single control terminal, rather than requiring a dedicated driver for each device. Moreover, given the lateral configuration, other devices or circuits can be monolithically integrated with the HEMT, for sensing and protection, for voltage regulation and for enhanced reliability.

In some examples described herein, the semiconductor switch is referred to as a "combined switch".

In some examples, as already mentioned, the HEMT may be a III-nitride based device, and the high voltage transistor device may be a silicon or silicon carbide based device. The silicon device may be an Insulated Gate Bipolar Transistor (IGBT) while the silicon carbide based device may be a Power MOSFET or a superjunction.

In some examples, driving voltage compatibility between the HEMT and the transistor device is achieved by having the HEMT form part of an integrated circuit, the integrated circuit further comprising an interface circuit operatively connected to the gate terminal of the HEMT and to the control terminal of the semiconductor switch. In some examples the interface circuit comprises an auxiliary HEMT to achieve driving voltage compatibility between the HEMT and the transistor device.

It is an aim of this disclosure to create a switch based on a parallel combination between a lateral GaN HEMT and a vertical high voltage device and featuring a single control terminal which could drive directly or indirectly both the GaN HEMT and the vertical device. The switch according to this disclosure needs a single, common drive circuit, placed preferably externally, rather than a dedicated driver for each of the devices. Moreover, such a combined chip could be co-packaged, in a system in package (SIP) technology or packaged within a module or embedded in a PCB, such that from the outside, the switch resembles a single chip. The vertically high voltage device is preferably an IGBT. Alternatively, it could be a Silicon Carbide device such as a Power MOSFET or a Superjunction.

The module or embedded package or SIP may contain a parallel combination between several HEMT switches and several vertical high voltage devices. This could be seen as a parallel combination of several combined switches according to this disclosure.

The combined switch according to the present disclosure takes advantage of the superior characteristics of the vertical switch at high currents and high temperature (medium to full load) and the superior performance of the lateral GaN HEMT at low currents and lower temperatures (light load). The lateral GaN HEMT could also provide sensing and protection functions which could benefit both the high voltage GaN HEMT and the overall combined switch. The sensing and protection functions may be monolithically integrated (within the same chip) with the high voltage lateral GaN HEMT.

The combined switch could be seen as a single high voltage switch with two main terminals, a low voltage terminal (Terminal 1-T1) and a high voltage terminal (Terminal 2-T2) and a control terminal, as well as potentially further terminals such as current sense terminal, DC low voltage rail terminal (VDD), short-circuit protection terminal and Kelvin.

According to a first aspect of this disclosure, an interface is placed in front of the gate of the high voltage lateral GaN HEMT to adapt the driving voltage of the control terminal to that suitable and allowable for the GaN HEMT. For example, the driving voltage on the gate terminal could be from 0 to 20 V while the driving voltage seen directly by the gate terminal of the lateral high voltage GaN HEMT remains 0 to 7V. The interface may contain other clamping circuits, sensing and protection functions, pull-down devices to ensure a fast and safe turn-off, to enhance immunity against dV/dt and to absorb any transient voltage peaks on the gate. Other sensing and protection functions could also be incorporated.

In an example according to the present disclosure, the interface is or comprises a low voltage GaN HEMT (Auxiliary HEMT or Aux HEMT) in front of the intrinsic gate of the high voltage GaN HEMT to absorb any differences in the voltage between the voltage applied to the control terminal of the combined switch (which for example could go up to 20 V) and that of the gate of the lateral GaN HEMT (which for the p-GaN gate structure could only go up to ~7 V). Furthermore, the addition of the low voltage GaN HEMT allows for an increase in the threshold voltage (wherein the threshold voltage in this context may refer to the voltage applied between the control terminal and the GaN HEMT source terminal) at which the high voltage GaN HEMT turns-on and this could be matched or be closer to the threshold voltage of the vertical switch (typically larger than 3 V).

The combined switch could be driven with voltages between 0V and 20 V (or −5 V to 20 V if desired).

Additional devices and circuits could be integrated monolithically with the High Voltage GaN HEMT. In other words, the combined switch can be described as a GaN Power Integrated Circuit (GaN Power IC) in parallel with a high voltage device (e.g. IGBT). Besides the Aux HEMT and the high voltage GaN HEMT, the GaN power IC could conveniently incorporate (monolithically integrated) other devices and/or circuits, such as a Miller clamp HEMT (pull-down device), voltage regulators, Current Sources, Current sense HEMTs, Sensing load resistor, Slew rate control circuit, dV/dt control drive circuits, short-circuit detection and protection circuits, over current and over temperature protection circuits, start-up devices/circuits, Electro-static Discharge (ESD) devices or circuits, logic circuits, capacitors, resistors and diodes (e.g. Schottky diodes or diodes made of a HEMT transistor by connecting the gate to one of its other terminals, source or drain). Some of these circuits/devices and their use have been disclosed in detail in, for example, US2020/0168599, US2020/0357909, U.S. Pat. No. 10,818, 786, US2021/0335781, and US20230131602, the contents of all of which are hereby incorporated by reference.

Multiple high voltage GaN HEMTs could be placed in parallel with the IGBT. Similarly, multiple IGBTs could be used in parallel with one or multiple high voltage GaN HEMTs. This could be preferred for higher power applications or for thermal reasons (as multiple heat sources rather than a single cumulative heat source results in lower maximum temperature increase). A single AUX HEMT could be placed in the gate of the multiple GaN devices. Alternatively, individual GaN HEMTs (and possibly individually placed Miller Clamps/pull down devices/circuits) could be connected to each of the high voltage GaN HEMTs. Possibly parallel GaN power ICs further connected in parallel with an IGBT (or other vertical device or multiple parallel vertical devices) could be used in the combined switch.

The IGBT may be a reverse conducting IGBT (RC-IGBT) and therefore could incorporate a reverse conducting bipolar diode. This diode could become in parallel with the unipolar reverse-biased diode of the GaN HEMT. The reverse-bias diode of the GaN HEMT may not be able to sufficiently carry out the reverse conducting current especially in applications where freewheeling is present. Therefore, the bipolar diode of the RC IGBT could be used for surge protection or for minimizing the reverse conduction losses.

Alternatively, an extra external high voltage diode could be placed in parallel with the combined switch for enhanced reversed conduction or for minimizing reverse recovery losses during the reverse recovery transients. The diode could be a silicon bipolar diode such as a PIN diode or could be a Silicon Carbide Schottky diode. Its blocking capability should be similar to that of the vertical power device (IGBT). State-of-the art Silicon Carbide Schottky diodes are superior to silicon diodes as they offer zero reverse conducting losses, but they are more expensive. A Silicon Carbide Junction Barrier Schottky diode featuring a combination of p+ rings and Schottky contact could be used for a good trade-off between a low leakage current and low on-state losses.

Described herein is semiconductor switch comprising a first main terminal, a second main terminal, and a control terminal, the semiconductor switch comprising:

a III-nitride integrated circuit, the III-nitride integrated circuit comprising:

a high voltage HEMT, the high voltage HEMT comprising a high voltage HEMT source terminal, a high voltage HEMT drain terminal, and a high voltage HEMT gate terminal; and at least part of an interface circuit;

wherein the semiconductor switch further comprises a high voltage transistor device, the high voltage transistor device comprising a transistor device first terminal, a transistor device second terminal, and a transistor device gate terminal;

wherein the high voltage HEMT source terminal and the transistor device first terminal are operatively connected to the first main terminal;

wherein the high voltage HEMT drain terminal and the transistor device second terminal are operatively connected to the second main terminal; and wherein the high voltage HEMT gate terminal is operatively connected to the control terminal via the interface circuit, wherein the interface circuit is configurable to adjust a voltage applied to the control terminal to be operatively compatible with the high voltage HEMT gate terminal.

It will be understood that the "vertical device" described herein generally refers to the high voltage transistor device.

The integrated circuit may comprise the whole III-nitride interface circuit, or the interface circuit may be partly disposed on a separate circuit (from the III-nitride integrated circuit). For example, the interface circuit may be partly disposed on a separate III-nitride or silicon circuit.

In some examples, the interface circuit comprises:

a low voltage auxiliary HEMT, the low voltage auxiliary HEMT comprising an auxiliary HEMT source terminal, an auxiliary HEMT drain terminal, and an auxiliary HEMT gate terminal; and a voltage limiter operatively connected to the auxiliary HEMT gate terminal;

wherein the auxiliary HEMT source terminal is operatively connected to the high voltage HEMT gate terminal;

wherein the high voltage HEMT source terminal and the transistor device first terminal are operatively connected to the first main terminal;

wherein the high voltage HEMT drain terminal and the transistor device second terminal are operatively connected to the second main terminal;

wherein the auxiliary HEMT drain terminal is operatively connected to the control terminal; and wherein the voltage limiter is operatively connected to the high voltage HEMT source terminal and to the auxiliary HEMT gate terminal, further wherein the voltage limiter is configurable to limit a voltage across the high voltage HEMT gate terminal and the high voltage HEMT source terminal.

The interface circuit may also be configured to perform other functions such as sensing and protection (e.g. current sensing and over-current protection). The interface circuit may comprise "smartness" or intelligence to aid a safe and reliable drive of the high voltage HEMT.

The interface circuit may for example be configured that higher currents (medium to full load conditions) and/or higher temperatures, the gate voltage of the HEMT could be lowered as to allow more current to flow through the first switch and thus protecting the GaN HEMT from over currents.

Preferably, the high voltage HEMT source terminal, the high voltage HEMT drain terminal, and the high voltage HEMT gate terminal are all disposed on a same surface of the high voltage HEMT (this may be referred to as a lateral arrangement or a lateral device).

Preferably, the transistor device first terminal and the transistor device gate terminal are disposed on a first side of the high voltage transistor device, and the transistor device second terminal is disposed on second side of the high voltage transistor device, opposite the first side of the high voltage transistor device (this may be referred to as a vertical arrangement or a vertical device).

In more detail, the high voltage HEMT is preferably based on a lateral arrangement wherein the main terminals (source, drain and gate terminals) are displaced laterally on the same surface of the device. The lateral HEMT may also contain a substrate terminal on the opposite surface (bottom surface). The substrate terminal may be operatively connected to the source terminal. Alternatively, the substrate may have a different potential to that of the source terminal or may be left floating. In a lateral arrangement, the on-state current flows largely laterally through the GaN HEMT from the drain to the source terminals and is modulated by the gate terminal to source terminal voltage.

The high voltage transistor device is preferably based on a vertical arrangement wherein the emitter/source and gate terminals are placed on the same surface (top surface) of the device and wherein the collector/drain terminal is placed on the opposite surface. In a vertical arrangement, the on-state current flows largely vertically through the high voltage transistor device from the collector/drain to the emitter/source terminals and is modulated by the gate terminal to emitter/source terminal voltage.

Further described herein is a semiconductor switch comprising a first main terminal, a second main terminal, and a control terminal, the semiconductor switch further comprising:

> a high voltage high-electron-mobility transistor (HEMT), the high voltage HEMT comprising a high voltage HEMT source terminal, a high voltage HEMT drain terminal, and a high voltage HEMT gate terminal;
> a low voltage auxiliary HEMT, the low voltage auxiliary HEMT comprising an auxiliary HEMT source terminal, an auxiliary HEMT drain terminal, and an auxiliary HEMT gate terminal;
> a voltage limiter operatively connected to the auxiliary HEMT gate terminal; and a high voltage transistor device, the high voltage transistor device comprising a transistor device first terminal, a second transistor device second terminal, and a transistor device gate terminal;
> wherein the auxiliary HEMT source terminal is operatively connected to the high voltage HEMT gate terminal;
> wherein the high voltage HEMT source terminal and the transistor device first terminal are operatively connected to the first main terminal;
> wherein the high voltage HEMT drain terminal and the transistor device second terminal are operatively connected to the second main terminal;
> wherein the auxiliary HEMT drain terminal and the transistor device gate terminal are operatively connected to the control terminal; and
> wherein the voltage limiter is operatively connected to the high voltage HEMT source terminal and to the auxiliary HEMT gate terminal, further wherein the voltage limiter is configured, or configurable, to limit a voltage across the high voltage HEMT gate terminal and the high voltage HEMT source terminal.

The auxiliary HEMT described above could be part of an interface between the control terminal and the high voltage HEMT gate terminal.

The high voltage HEMT may be a III-nitride HEMT and preferably an enhancement mode (normally-off) device. The high voltage HEMT may be preferably designed to have a slightly higher breakdown voltage than the high voltage transistor device. Its breakdown may be limited by leakage rather than avalanche. In contrast the high voltage switch may break via avalanche before unacceptable high leakage is present in the high voltage HEMT. The high voltage transistor device can provide avalanche capability to the combined switch and can clamp the breakdown voltage of the combined switch to the avalanche voltage of the high voltage transistor device. As a result of this clamping effect, the high voltage HEMT may not need to be over engineered in terms of its own blocking capability, leading to smaller gate to drain or source to drain dimensions (or smaller GaN epi stack) and as a result lower specific on-state resistance Rds (ON). Note that in general stand-alone HEMTs are over engineered and they are designed to have a large margin between their rated voltage and the voltage at which leakage becomes very high. Here we take advantage of the avalanche provided by the vertical high voltage device, which means that the over engineering and the extra margin is not needed.

The auxiliary HEMT may be a III-nitride HEMT.

It will be understood that an operative connection may comprise, or may be, an electrical connection.

The high voltage transistor device may comprise a material, or materials system, other than a III-nitride material. In some examples, the high voltage transistor device is a silicon and/or silicon carbide transistor.

The high voltage HEMT and the auxiliary HEMT may be made in lateral configuration (that is to say that the main terminals are placed laterally displaced from each other on the same surface). The high voltage transistor may be made in a vertical configuration (that is to say that the main terminals may be on opposite surfaces and the current conduction is mainly vertical between such terminals).

It will be understood that the terms "high voltage" and "low voltage" as used herein are merely relative terms. The high voltage HEMT may equivalently be referred to as a "first HEMT", and the low voltage auxiliary HEMT may equivalently be referred to as a "second HEMT", or simply an "auxiliary HEMT". Similarly, the high voltage transistor device may be referred to as simply a "transistor device".

A "III-nitride" transistor, device, or integrated circuit, as used herein, may refer generally to a transistor or device based on the group III-nitride family of materials, including GaN, AlN, InN, and alloys thereof.

Advantageously, the auxiliary HEMT can absorb any difference in voltage between the voltage applied to the control terminal and the voltage of the gate terminal of the (e.g. lateral) high voltage HEMT. In addition, the auxiliary HEMT enables an increase in the threshold voltage at which the high voltage HEMT turns on, which may therefore be matched (or be made closer to) the threshold voltage of the (e.g. vertical) transistor device.

The auxiliary HEMT drain terminal may be operatively connected to the control terminal by a first resistance (e.g. a resistor, or a device or circuit providing a resistance).

Also described herein is a semiconductor switch comprising a first main terminal, a second main terminal, and a control terminal, the semiconductor switch comprising: an integrated circuit, the integrated circuit comprising:

a high voltage HEMT, the high voltage HEMT comprising high voltage HEMT source terminal, a high voltage HEMT drain terminal, and a high voltage HEMT gate terminal; and an interface circuit;

wherein the semiconductor switch further comprises a high voltage transistor device, the high voltage transistor device comprising a transistor device first terminal, a transistor device second terminal, and a transistor device gate terminal;

wherein the high voltage HEMT source terminal and the transistor device first terminal are operatively connected to the first main terminal;

wherein the high voltage HEMT drain terminal and the transistor device second terminal may be operatively connected to the second main terminal;

wherein the transistor device gate terminal is operatively connected to the control terminal; and wherein the high voltage HEMT gate terminal is operatively connected to the control terminal via the interface circuit, wherein the interface circuit is configured, or configurable, to adjust a voltage applied to the control terminal to be operatively compatible with the high voltage HEMT gate terminal.

The integrated circuit may be a III-nitride integrated circuit.

The high voltage transistor device may comprise a material, or materials system, other than a III-nitride material. For example, preferably the high voltage transistor device is not a III-nitride transistor.

The voltage limiter could be made of one or several diodes or transistor like diodes put in series. Alternatively, a threshold amplification HEMT could be provided. A description of an example of a voltage limiter is provided in US20230131602. When the voltage limiter is provided with a forward current, the voltage drop across it saturates to a known voltage, the voltage limiter could be supplied with such forward current via a current source connected to the control terminal. A description of an example of a current source is provided in US20230131602.

The high voltage HEMT could preferably be a normally off HEMT (an enhancement mode HEMT). That means its threshold voltage is positive. The auxiliary HEMT could be either a normally-off (enhancement mode) or normally on (depletion mode) HEMT.

In some examples, the high voltage transistor device may be a silicon and/or silicon carbide transistor.

Advantageously, the interface circuit can absorb any difference in voltage between the voltage applied to the control terminal and the voltage of the gate terminal of the (e.g. lateral) high voltage HEMT. In addition, the interface circuit enables an increase in the threshold voltage at which the high voltage HEMT turns on, which may therefore be matched (or be made closer to) the threshold voltage of the (e.g. vertical) transistor device.

The provision of an integrated circuit may also advantageously enable monolithic integration of other circuits and devices, as described herein, to provide a compact and robust device package.

As described herein, the high voltage transistor device may comprise an insulated-gate bipolar transistor (IGBT). The transistor device first terminal may be an IGBT emitter terminal and the transistor device second terminal may be an IGBT collector terminal.

As described herein, the high voltage transistor device may comprise a metal-oxide-semiconductor field-effect transistor (MOSFET). The transistor device first terminal may be a source terminal (referred to as a MOSFET source terminal) and the transistor device second terminal may be a drain terminal (referred to as a MOSFET drain terminal).

As described herein, the high voltage transistor device may comprise a superjunction structure. The transistor device first terminal may be a source terminal (referred to as a superjunction source terminal) and the transistor device second terminal may be a drain terminal (referred to as a superjunction drain terminal).

In some examples, the transistor device gate terminal may be operatively connected to the control terminal via a resistance (which may be referred to as a second resistance) (e.g. a resistor, or a device or circuit providing a resistance and providing for example slew-rate control).

In some examples, the transistor device gate terminal may be operatively connected to an output of the interface circuit, e.g. such that the interface circuit may be configurable to control the transistor device.

In some examples, the high voltage HEMT source terminal, the high voltage HEMT drain terminal, and the high voltage HEMT gate terminal are laterally spaced from one another, e.g. the high voltage HEMT may be a lateral device.

In some examples, the transistor device first terminal and the transistor device second terminal are vertically spaced from one another, e.g. the high voltage transistor device may be a vertical device.

In some examples, the high voltage HEMT and the high voltage transistor device may be disposed on separate (e.g. different) substrates. For example, the high voltage HEMT may be disposed on a first semiconductor substrate, and the high voltage transistor device may be disposed on a second semiconductor substrate, different from the first semiconductor substrate.

For example, the semiconductor substrate on which the III-nitride high voltage HEMT is disposed may comprise silicon, silicon carbide, and/or sapphire.

The semiconductor switch may be configured to turn-on or be in an on-state when the control terminal is driven with a voltage of 10 V or more. The semiconductor switch may be configured to turn-off or be in an off-state when the control terminal is driven with a voltage of 0 V, or approximately 0 V. The semiconductor switch may be configured to turn off when the control terminal is driven with a voltage of less than a lower of: a threshold voltage of the high voltage HEMT; and a threshold voltage of the high voltage transistor device.

In some examples, the integrated circuit described herein further comprises one or more of:

A Miller clamp HEMT (or pull-down HEMT);

a pull-down circuit;

a voltage regulator;

a current source;

a sensing load resistor;

a slew rate control circuit;

a short-circuit detection circuit;

a protection circuit;

an over-current protection circuit;

an over-temperature protection circuit;

a dV/dt control circuit;

a drive circuit;

a start-up circuit;

an electrostatic discharge circuit;

a logic circuit;

a capacitor;

a resistor; and/or a diode.

In some examples, the semiconductor switch described herein comprises a diode operatively connected between the first main terminal and the second main terminal, the diode comprising one or more of:

part of a reverse conducting IGBT;
part of a reverse conducting MOSFET;
a silicon carbide diode;
a Schottky diode;
a junction barrier Schottky diode;
a silicon diode; and/or
a bipolar diode.

In some examples, the semiconductor switch described herein comprises an integrated circuit, which may be referred to as a second integrated circuit, comprising one or more of:

a DC voltage regulator;
a slew rate control circuit;
a short-circuit detection circuit;
an over-current protection circuit;
an over-temperature protection circuit;
a dV/dt control circuit;
a drive circuit; and/or
a logic and/or timing circuit.

The second integrated circuit may be a silicon integrated circuit.

The range of blocking voltages for the semiconductor switch according to this invention can be from 100 V to 3.5 kV. In particular the range of 600V to 1.7 kV is of interest with various applications including in motor control and traction inverters. For the range of 600 V to around 900 V, the preferred substrate for the high voltage GaN HEMT could be silicon, though sapphire is also possible. Above 900 V (e.g. 1.2 kV), the quartz-based or semi-insulating SiC substrates could be used. Alternatively, a thick epi of GaN on silicon could be used to enhance the breakdown voltage, The range of on-state currents for the combined switch can vary from Amps to thousands of Amps. The range of interest could be from 100 Amps to 1000 Amps. Current can be increased by placing multiple switches in parallel. Within the switch it is preferable that the high voltage device (the vertical device) such as the IGBT, to have a higher current capability than the lateral HIGH Voltage HEMT. As an example, at full load the IGBT could carry 60 to 90% of the current while the high voltage HEMT can carry 40% to 10% of the current. This ratio could also be function of the ambient or the self-heating temperature. At higher temperatures it is expected that the ratio of the current in the vertical switch over that in the lateral high voltage HEMT may increase.

The switch is expected to operate at frequencies similar to those of the vertical device, as the GaN HEMT is expected to be faster than the vertical switch and therefore unlikely to largely limit the frequency of operation of the combined switch. If the vertical device is an IGBT, the frequency range may be below 100 KHz and if the vertical device is a Silicon Carbide MOSFET, the frequency may be below 500 KHz.

Series multiple GaN HEMTs could also be used in the combined switch. For example, two 650V GaN HEMTs (one on the low-side and one on the high side) could be placed in series with a 1.2 kV IGBT. This could be a favorable option as it is easier to make vertical devices at higher voltages than lateral HEMTs at higher voltages. An interface is still provided between the gate terminal of the low side high voltage HEMT and the control terminal. The high side GaN HEMT could be driven with the signal for the low-voltage GaN HEMT through an additional level shifter. The level shifter could be integrated with any of the high voltage GaN HEMTs.

According to a third aspect of the disclosure, there is provided a Cascode device in parallel with a high voltage device, wherein the high voltage device can be an IGBT, a silicon carbide MOSFET or superjunction.

For example, a semiconductor switch may comprise a first main terminal, a second main terminal, and a control terminal, the semiconductor switch comprising:

a Cascode device, the Cascode device comprising:
a MOSFET comprising a MOSFET drain terminal, a MOSFET gate terminal and a MOSFET source terminal;
a high voltage depletion mode III-nitride HEMT comprising a depletion HEMT drain terminal, a depletion HEMT gate terminal and a depletion HEMT source terminal;
wherein the MOSFET drain terminal is operatively connected to the depletion HEMT source terminal;
wherein the semiconductor switch further comprises a high voltage transistor device comprising a transistor device first terminal, a transistor device second terminal, and a transistor device gate terminal;
wherein the MOSFET source terminal and the transistor device first terminal are operatively connected to the first main terminal;
wherein the depletion HEMT drain terminal and the transistor device second terminal are operatively connected to the second main terminal;
wherein the MOSFET gate terminal is operatively connected to the control terminal.

The high voltage transistor device may comprise an IGBT, a silicon carbide MOSFET or a superjunction; and the MOSFET may comprise an n-channel MOSFET in vertical or quasi-vertical configuration.

The depletion HEMT gate terminal may be operatively connected to the MOSFET source terminal and the first main terminal; and the transistor device gate terminal and the MOSFET gate terminal may be operatively connected to the control terminal.

The high voltage transistor device may comprise a bipolar junction transistor, and the depletion HEMT gate terminal may be operatively connected to the MOSFET source terminal and the first main terminal; and the transistor device gate terminal may be operatively connected to the MOSFET drain terminal and the depletion HEMT source terminal, and the MOSFET gate terminal may be operatively connected to the control terminal.

The high voltage transistor device may comprise a bipolar junction transistor, and the transistor device gate terminal may be operatively connected to the MOSFET drain terminal and the depletion HEMT source terminal, and the MOSFET gate terminal may be operatively connected to the control terminal, and the depletion HEMT gate terminal may be operatively connected to the control terminal via an interface circuit, and the interface circuit may be configured to adjust a voltage applied to the control terminal to be operatively compatible with the depletion HEMT gate terminal.

The Cascode device comprises a MOSFET in series with a depletion mode GaN HEMT. The gate of the depletion mode GaN HEMT is connected to the source of the MOSFET. The MOSFET could be preferably an n-channel MOSFET in vertical or quasi-vertical configuration. A blocking voltage of the MOSFET is preferably much smaller than that of the depletion mode HEMT. For example, the MOSFET blocking voltage could be 40 V for a 650V HEMT.

The gate of the MOSFET could be shorted to the gate of the high voltage switch (e.g. IGBT) and further connected to the control terminal of the combined switch. Alternatively, either of the gates could be connected to the control terminal via slew rate structures (which could be simply resistors or resistors with diodes).

According to a fourth aspect of this disclosure, an n-channel MOSFET is provided to drive the base of a high voltage PNP transistor (bipolar junction transistor) and concomitantly be connected to the source of a high voltage depletion mode HEMT. In this configuration the combined switch is based on the parallel conduction through a bipolar junction pnp transistor and through the Cascode device. The MOSFET is responsible for both (i) enabling a negative gate-source voltage for the depletion HEMT during the blocking mode and (ii) providing the electron current to the base of the pnp transistor in the on-state. This embodiment can also be described as a split IGBT in parallel with the Cascode device wherein the MOSFET component of the IGBT is one and the same as the MOSFET component of the Cascode device. Preferably the MOSFET is a stand-alone component made in silicon or silicon-carbide technology and the high voltage PNP transistor could be made in silicon or silicon-carbide technology. The high voltage PNP transistor could have a vertical configuration with a wide n base and a relatively narrow p collector or a relatively narrow n base and a relatively wide p collector. The high voltage PNP transistor could have a breakdown voltage similar or slightly smaller than that of the high voltage depletion mode HEMT. The MOSFET could have a voltage blocking much lower than those of the high voltage depletion mode HEMT or the high voltage PNP transistor.

Alternatively, the MOSFET could also be incorporated in the IGBT itself (using the same layers as the MOSFET component of the IGBT) but this would lead to a more complex design for the IGBT.

The high voltage depletion mode HEMT may comprise a gate formed of p+ islands.

According to a fifth aspect of the disclosure, the Cascode is replaced with a high voltage depletion mode HEMT based on p+ islands in series with a MOSFET (as described in U.S. Pat. No. 11,081,578, the contents of which are hereby incorporated by reference). The two series devices are further placed in parallel with the pnp transistor.

The gate of the MOSFET could be directly connected or indirectly connected (through a slew-rate control structure) to the control terminal.

The gate of the p+ islands depletion mode HEMT could be connected through an interface to the control terminal. The interface could be the same as the one described in the first aspect in this disclosure. The role of such interface is to adapt the driving voltage of the control terminal to that suitable and allowable for the p+ islands depletion mode GaN HEMT. The interface may contain other clamping circuits, sensing and protection functions, pull-down devices to ensure a fast and safe turn-off, to enhance immunity against dV/dt and to absorb any transient voltage peaks on the gate. Other sensing and protection functions could also be incorporated.

Alternatively, the high voltage HEMT source terminal and the transistor device first terminal may be operatively connected to the first main terminal through a passive, and/or inductive, component each. This provides a way to modulate the operation of the combined switch as the inductive component would enable to introduce lead/lag in the operation of the two switches so that at times only one switch may be operating within the combined switch. Based on the load conditions, the GaN HEMT may be operated at light load (beneficial low capacitance when the switching loss smaller) through soft switching, and the IGBT or both the IGBT and HEMT may be operated at high load by using hard switching modulation. Current sensing features of GaN HEMT can help to monitor the current and identify the load conditions. These can be communicated to the external driver to enable the appropriate switching between devices based on the load conditions using the energy storing/balancing capabilities of the inductors. The inductors may be coupled inductors or detached inductors.

For example, the high voltage HEMT source terminal may be operatively connected to the first main terminal via a first inductive component, the first inductive component being operable to produce a first temporal lag between the first main terminal and the high voltage HEMT source terminal. The transistor device first terminal may be operatively connected to the first main terminal via a second inductive component, the second inductive component being operable to produce a second temporal lag between the first main terminal and the transistor device first terminal.

The combined switch can switch faster than an IGBT or a first transistor device alone.

The turn-on of the combined switch could be faster than that of an IGBT alone as the internal input capacitance of the high voltage HEMT is very small compared to the input capacitance of the IGBT and therefore it could be charged quickly. During the turn-on the GAN HEMT can take higher current than during the on-state or steady state (as much as the saturation current) until the IGBT turns-on fully and the current is redistributed (part of the current from the GaN HEMT would be redistributed in the IGBT). As a result, the turn-on losses in a combined switch may be smaller than in an IGBT or a first transistor alone.

The high voltage GaN HEMT (or when taken together the high voltage GaN HEMT and the interface) may have a smaller threshold voltage than that of the first switch (e.g. IGBT), so that the high voltage GaN HEMT turn-on before the first switch (e.g. IGBT) turns on.

The turn-off the combined switch could be faster than that of an IGBT alone as the GAN HEMT is a unipolar device and there is no excess charge (i.e. plasma) present in the GaN HEMT. Moreover during the turn-off the current may redistribute compared to the on-state or steady-state. Thus a larger proportion of the current may be switched off by the high voltage GaN HEMT, minimizing the tail of the IGBT component in the combined switch. As a result the turn-off tail and turn-off losses can be smaller in a combined switch than an IGBT alone.

The Combined switch takes advantage of the superior characteristics of the vertical switch (such as IGBTs/or vertical MOSFETs) such as high current capability in medium to full load conditions and good on-state characteristics at high temperature at and superior performance of GaN HEMTs in light load conditions and transient commutation (turn-on and turn-off) to enable the combined device to operate more efficiently in a range of high power applications such as traction inverters and a variety of motor control applications.

The vertical switch and the lateral GaN HEMT could be co-packaged to form a single switch from an external view (similar to System in Package-SIP). This would reduce the parasitics between the corresponding terminals of the two components (high voltage HEMT and vertical switch) and provide a more compact and cost-effective solution. Metal packages or plastic or ceramic type packages could be used, A side by side technique could be employed wherein the GaN Chip and the vertical switch are placed next to each other within the same package and separated by a distance (for example by employing split paddles). The package may contain a common lead frame. Moulding compound may be placed above both components and the heatsink or a metal thermal plate can be common to the components with an isolation layer may be provided between the high voltage terminals and the metal thermal plate if required. Specific terminals of the GaN chip could be connected via internal pads and bond wires to specific terminals of the first switch, or indirectly connected via the package pins. Alternatively, a stack-die or 3D packaging technique could be used. The GaN chip could be placed or soldered or attached onto the IGBT die such that the substrate of the GaN chip could be in physical contact (via soldering or die attach) to the source metallization of the first switch. Alternatively, flip chip techniques with solder balls, or embedded PCB solutions could be used to house the combined switch.

Multiple combined switches could be placed in parallel in modules or within one or multiple embedded PCBs or high conductivity insulating substrates to increase the power (or current) rating.

For example, a semiconductor switch according to the present disclosure may be disposed in a package to form a singular switch. For example, the package may be such that the singular switch is controllable as a single switch (i.e. the high voltage HEMT and the transistor device may perform together as a single switch).

In some examples described herein, a semiconductor switch according to the present disclosure comprises a first main terminal, a second main terminal, and a control terminal. The semiconductor switch further comprises:

a high voltage HEMT, the high voltage HEMT comprising a high voltage HEMT source terminal, a high voltage HEMT drain terminal, and a high voltage HEMT gate terminal; and a high voltage transistor device, the high voltage transistor device comprising a transistor device first terminal, a transistor device second terminal, and a transistor device gate terminal;

wherein the high voltage HEMT source terminal and the transistor device first terminal are operatively connected to the first main terminal;

wherein the high voltage HEMT drain terminal and the transistor device second terminal are operatively connected to the second main terminal; and wherein the high voltage HEMT gate terminal is operatively connected to the control terminal;

wherein the control terminal is operatively connected to a first driver output of a driver, and wherein the transistor device gate terminal is operatively connected to a second driver output of a driver.

A method of operating a semiconductor switch as described herein is also described. The method may comprise: driving the control terminal, by a driver via a first driver output, at a first driving voltage, or within a first driving voltage range; and driving the transistor device gate terminal, by a driver via a second driver output, at a second driving voltage, or within a second driving voltage range.

The second driving voltage, or driving voltage range, may be different from the first driving voltage, or driving voltage range.

A system is also described herein. The system comprises a semiconductor switch as described herein. The system further comprises a driver, the driver comprising a first driver output and a second driver output; wherein the control terminal is operatively connected to the first driver output, and wherein the transistor device gate terminal is operatively connected to the second driver output.

In examples, the control terminal of the semiconductor switch, or the system, described herein, may be configured to be driven, by the driver via the first driver output, at a first driving voltage, or within a first driving voltage range. The transistor device gate terminal may be configured to be driven, by the driver via the second driver output, at a second driving voltage, or within a second driving voltage range. The second driving voltage, or second driving voltage range, is preferably different from the first driving voltage, or first driving voltage range.

In examples, the first driving voltage, or first driving voltage level, may be within the first driving voltage range. The second driving voltage, or second driving voltage level, may be within the second driving voltage range.

For example, one or more voltage levels within the first driving voltage range may be different from one or more voltage levels within the second driving voltage range at a given instant in time.

At least one of the first driving voltage and the second driving voltage, and/or voltage levels within at least one of the first driving voltage range and the second driving voltage range, may be configured to vary selectably, corresponding to the semiconductor switch being selectably in any of: an on-state mode, an off-state mode, a turn-on mode, or a turn-off mode.

In some examples, a slew rate at the control terminal and/or the transistor device gate terminal is configured to vary selectably, corresponding to the semiconductor switch being selectably in the turn-on mode or the turn-off mode. It will be understood that the slew rates at the control terminal and the transistor device gate terminal, respectively, may be configured to be different at a given instant in time.

Advantageously, according to some examples described herein, dynamic control of the turn-on and/or turn-off curves, and/or slew rate, and/or timing sequences, for the (high voltage) HEMT can be achieved by driving the terminal(s) of a semiconductor switch as described herein.

In some examples, the semiconductor switch comprises an interface circuit. The high voltage HEMT gate terminal may be operatively connected to the control terminal via the interface circuit. As described herein, the interface circuit may be configurable to adjust the voltage levels within the first driving voltage range (or to adjust the first driving voltage) to be operatively compatible with the high voltage HEMT gate terminal.

The semiconductor switch may comprise a feedback circuit (the feedback circuit may form part of the interface circuit). The feedback circuit may comprise at least one output operatively connected to a driver feedback input (e.g. of the driver described herein). The feedback circuit may be configured to provide a feedback signal to the driver feedback input, the feedback signal corresponding to a status of the semiconductor switch. For example, the feedback signal may correspond to the sensed current, sensed voltage, and/or sensed temperature in the semiconductor switch. The driver may be configured to adjust the driving voltage levels, frequencies of the driving voltage levels, slew rates, and/or timing sequences of the driving voltage levels based on the feedback signal.

In some examples, the high voltage HEMT is part of an integrated circuit. In some examples, the interface circuit is monolithically integrated with the high voltage HEMT (e.g. as part of the integrated circuit).

The control terminal may be operatively connected to the first driver output via a first resistor, and/or the transistor device gate terminal may be operatively connected to the second driver output via a second resistor. The first and/or the second resistor(s) may be external to the semiconductor switch. In some examples, the first and/or the second resistor(s) are part of the semiconductor switch, e.g. as part of the integrated circuit and/or as part of the interface circuit.

As described herein, an interface circuit may comprise a low voltage auxiliary HEMT, the low voltage auxiliary HEMT comprising an auxiliary HEMT source terminal, an auxiliary HEMT drain terminal, and an auxiliary HEMT gate terminal; and a voltage limiter operatively connected to the auxiliary HEMT gate terminal; wherein the auxiliary HEMT source terminal is operatively connected to the high voltage HEMT gate terminal; wherein the auxiliary HEMT drain terminal is operatively connected to the control terminal; and wherein the voltage limiter is operatively connected to the high voltage HEMT source terminal and to the auxiliary HEMT gate terminal, further wherein the voltage limiter is configurable to limit a voltage across the high voltage HEMT gate terminal and the high voltage HEMT source terminal.

In some examples, the interface circuit comprises a Miller clamp transistor, the Miller clamp transistor comprising a plurality of Miller clamp gates, wherein the interface circuit is configured such that an on-state resistance of the Miller clamp transistor depends on which Miller clamp gate(s) of the plurality of Miller clamp gates is active.

In some examples, the interface circuit comprises a plurality of Miller clamp transistors having different on-state resistances.

For example, a single or multiple Miller clamp transistors can provide a variable on-state resistance to control the high voltage HEMT dynamically, e.g. in an on-state mode.

For example, the interface circuit may further comprise a logic circuit configured to control activation of each Miller clamp transistor of the plurality of Miller clamp transistors. In some examples, the transistor device gate terminal is operatively connected to the second driver output via the interface circuit.

In some examples, the control terminal is further operatively connected to a third driver output of the driver, wherein:

when the semiconductor switch is in the turn-off mode, the control terminal is configured to selectably receive either:

a regular turn-off signal comprising a first driving voltage level within the first driving voltage range, from the driver via the first driver output; or a delayed turn-off signal, or a slower turn-off signal, comprising a third driving voltage level within the first driving voltage range, from the driver via the third driver output.

In some examples, the transistor device gate terminal is operatively connected to a fourth driver output of the driver, wherein:

when the semiconductor switch is in the turn-off mode, the transistor device gate terminal is configured to selectably receive either:

a regular turn-off signal comprising a second driving voltage level within the second driving voltage range, from the driver via the second driver output; or a delayed turn-off signal, or a slower turn-off signal, comprising a fourth driving voltage level within the second driving voltage range, from the driver via the fourth driver output.

It will be understood that a slower turn-off signal corresponds to a turn-off signal that is slower than the regular turn-off signal.

Advantageously, the turn-off speed of the high voltage HEMT and/or the transistor device may be dynamically controlled due to the selectability of the turn-off signals.

In some examples, the control terminal is operatively connected to the third driver output via a third resistor. A resistance of the third resistor may greater than a resistance of the first resistor to enable the slower turn-off.

In some examples, the transistor device gate terminal is operatively connected to the fourth driver output via a fourth resistor. A resistance of the fourth resistor may be greater than a resistance of the second resistor to enable the slower turn-off.

In some examples, the semiconductor switch (e.g. the interface circuit) comprises a first Miller clamp transistor and a second Miller clamp transistor, the first Miller clamp transistor and the second Miller clamp transistor being operatively connected to the High voltage HEMT gate terminal, the second Miller clamp transistor having a higher on-state resistance than the first Miller clamp transistor. The regular turn-off signal may be configured to activate the first Miller clamp transistor. The delayed turn-off signal, or the slower turn-off signal, may be configured to activate the second Miller clamp transistor. For example, the first Miller clamp transistor may be optimized to enable fast turn-off the power HEMT and/or to avoid a false turn-on of the power HEMT during regular operation of the semiconductor switch. The second Miller clamp transistor may be optimized to turn-off the power HEMT when a slow turn-off is selected.

In some examples, the interface circuit comprises a third Miller clamp transistor, the third Miller clamp transistor comprising a third Miller clamp drain terminal, wherein the third Miller clamp drain terminal is operatively connected to the high voltage HEMT gate terminal.

In some examples, the interface circuit further comprises a fourth Miller clamp transistor, the fourth Miller clamp transistor comprising a fourth Miller clamp drain terminal, wherein the fourth Miller clamp drain terminal is operatively connected to the transistor device gate terminal.

The third and/or fourth Miller clamp transistor(s) may enable regulation or pull-down of the high voltage HEMT, and/or the transistor device, respectively.

In some examples, a semiconductor switch according to the present disclosure comprises a HEMT (e.g. a high voltage HEMT), without another transistor device in parallel. For example, a semiconductor switch may comprise a HEMT, the HEMT comprising a gate terminal, the gate terminal being operatively connected to a first driver output of a driver and to a second driver output of the driver.

When the semiconductor switch is in a turn-off mode, the gate terminal is configured to selectably receive either:

a regular turn-off signal from the first driver output; or a delayed turn-off signal, or a slower turn-off signal, from the second driver output.

It will be understood that a slower turn-off signal corresponds to a turn-off signal that is slower than the regular turn-off signal.

In some examples, when the semiconductor switch is in a turn-on mode, the gate terminal is configured to selectably receive either:

a regular turn-on signal from the first driver output; or a delayed or slower turn-on signal from the second driver output.

Dynamic adjustment of the turn-off and/or turn-on speeds of the switch comprising the HEMT can therefore be controlled as described herein.

BRIEF DESCRIPTION OF THE DRAWINGS

The present invention will now be described by way of example with reference to the following drawings.

DETAILED DESCRIPTION

In the illustrative examples described herein, a semiconductor switch comprises a (high voltage) high-electron-mobility transistor (HEMT), such as a III-nitride HEMT, and optionally a high voltage transistor device such as an insulated-gate bipolar transistor. While the examples of HEMTs described herein are predominantly GaN-based, it will be appreciated that HEMTs based on other III-nitride materials such as InN, AlN, and alloys of InN, AlN, and GaN may also be suitable. Similarly, it will be appreciated that the high voltage transistor device described herein may alternatively comprise a metal-oxide-semiconductor field-effect transistor (MOSFET), and/or a superjunction. The high voltage transistor device may be a silicon or silicon carbide device.

Figure 1:
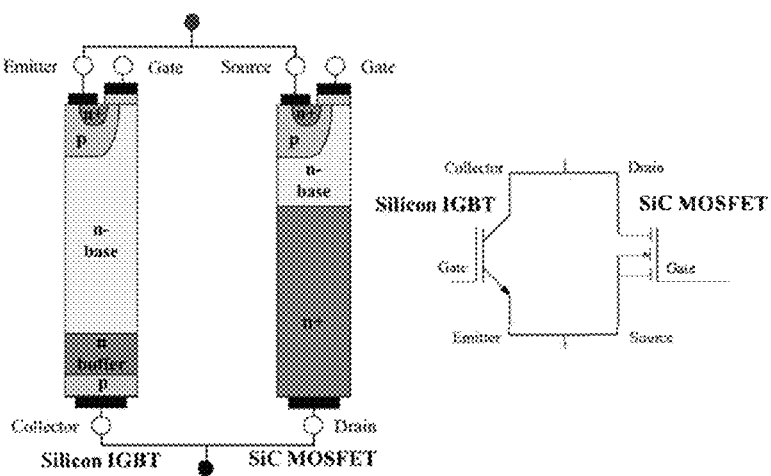
FIG. 1 illustrates a prior art example of an IGBT in parallel with a silicon carbide MOSFET, reproduced from M. Rahimo, IEEE TRANSACTIONS ON POWER ELECTRONICS, VOL. 30, NO. 9, September 2015.
Figure 2:
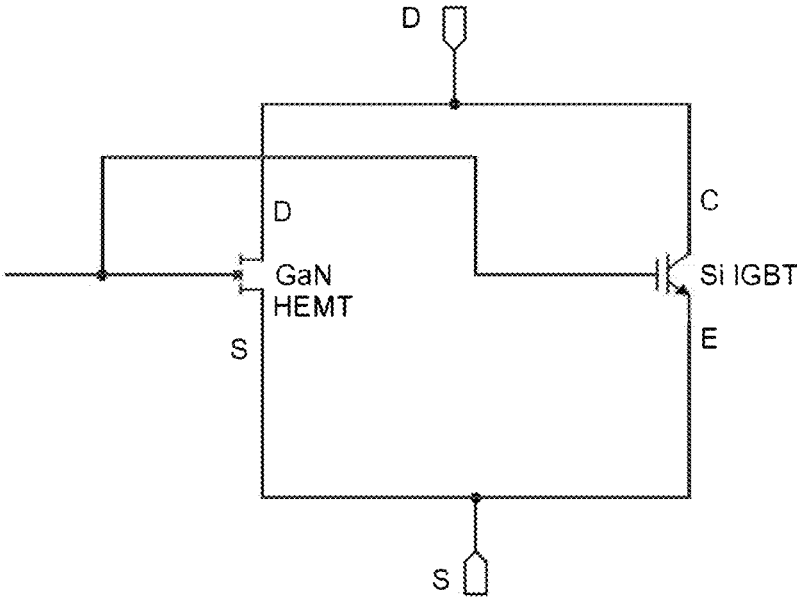
FIG. 2 illustrates a parallel combination between a discrete GaN HEMT and an IGBT.
Figure 3:
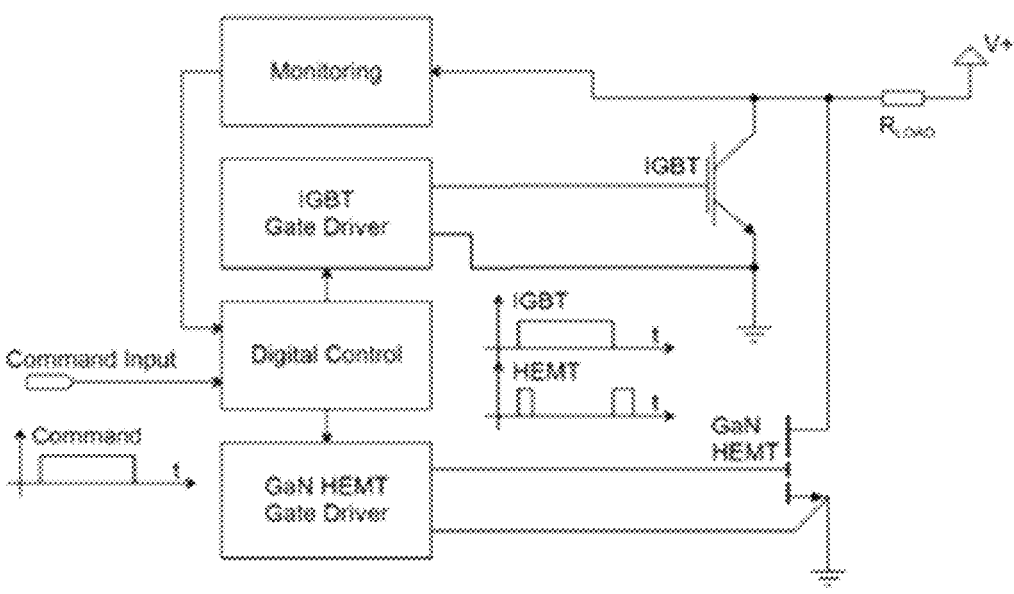
FIG. 3 illustrates a prior art solution for paralleling IGBTs with a GaN HEMT, reproduced from L. Molnar, 2018 IEEE 24th International Symposium for Design and Technology in Electronic Packaging (SIITME), 2018.
Figure 4:
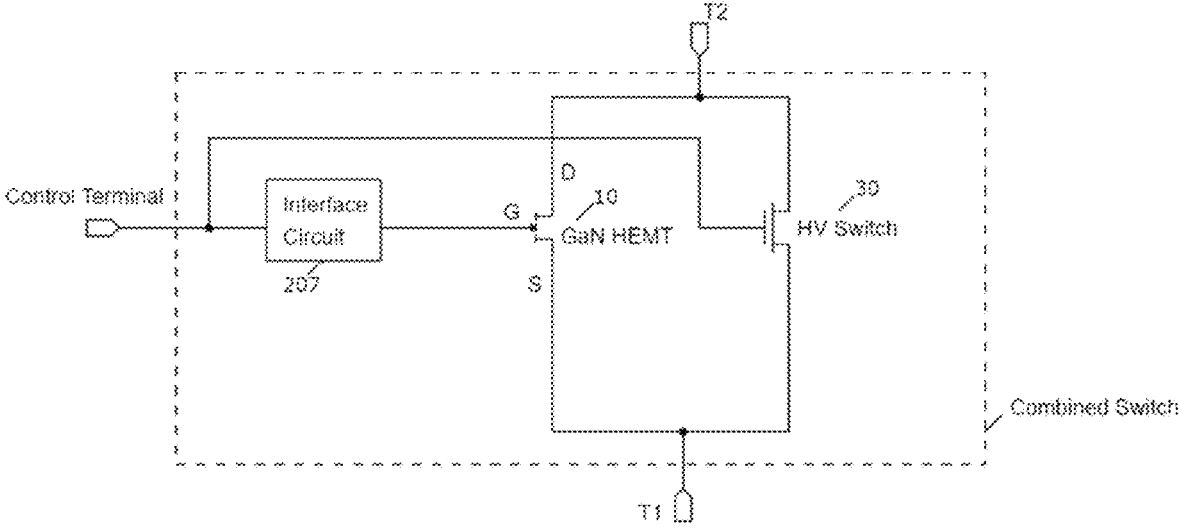
FIG. 4 illustrates an example of a semiconductor switch according to the present disclosure.

FIG. 4 illustrates a combined switch according to the first aspect of the present disclosure, featuring a lateral GaN HEMT (10), an interface circuit (207) and a high voltage transistor (30). The interface circuit (207) is placed in front of the gate of the lateral GaN HEMT to adapt the driving voltage of the control terminal to that suitable and allowable for the GaN HEMT. This interface could be preferably monolithically integrated with the power HEMT for providing lower parasitics, ease of manufacturing and fast reaction time. Alternatively, this interface could be part of a separate chip (such as a silicon companion chip, or a driver chip). The interface circuit may additionally include clamping circuits, sensing and protection functions, pull-down devices to ensure a fast and safe turn-off, to enhance immunity against dV/dt and to absorb any transient voltage peaks on the gate.

Figure 5:
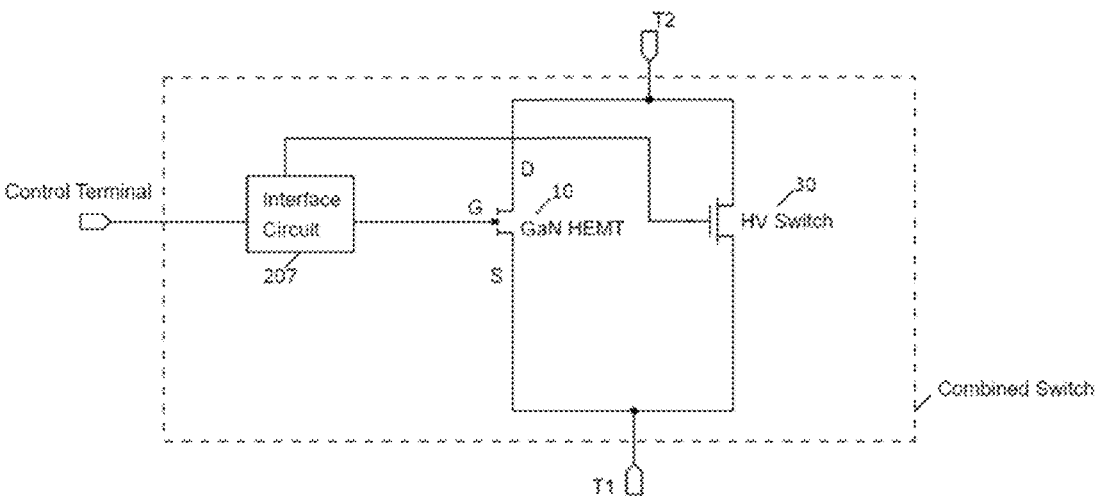
FIG. 5 illustrates an example of a semiconductor switch according to the present disclosure in which the transistor device gate terminal is operatively connected to an output of the interface circuit.

FIG. 5 illustrates an example of the second aspect of the present disclosure, featuring the high voltage transistor (30)

to be connected to another output of the interface circuit. The interface circuit can provide functionality of clamping, voltage limiting, sensing and protection and other control functions for the high voltage transistor (30).

Figure 6:
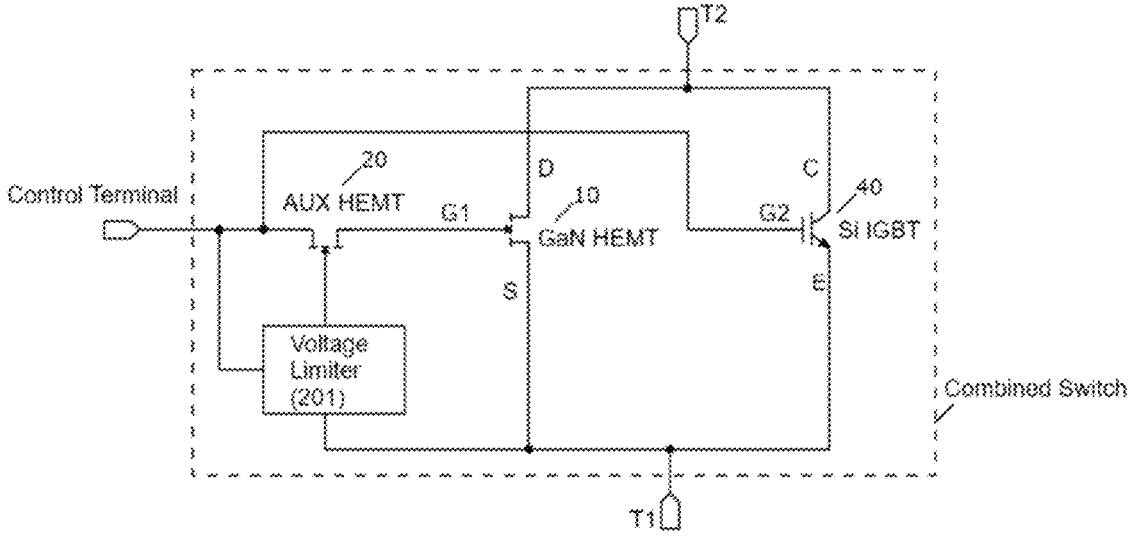
FIG. 6 illustrates an example of a semiconductor switch featuring a lateral GaN HEMT, an auxiliary low voltage HEMT and a high voltage IGBT placed in parallel with the lateral high voltage GaN HEMT according to the present disclosure.

As shown in FIG. 6, the interface circuit may additionally comprise a voltage limiter 201. The voltage limiter may be a circuit block which can limit (or clamp) the maximum voltage at the gate of the auxiliary low voltage HEMT. Through this manner of operation the voltage limiter may overall act to provide a limit on the maximum voltage on the gate terminal of the GaN HEMT. In operation, the voltage applied to the control terminal may be divided between a voltage drop between the drain and source terminal of the aux HEMT (20) and a voltage drop between the gate and source terminal of the GaN HEMT (10). The auxiliary HEMT and the voltage limiter may be monolithically integrated with the GaN HEMT.

FIG. 6 illustrates an example of a combined switch featuring a lateral GaN HEMT (10) placed in parallel with a high voltage IGBT (40) and an example of the interface circuit comprising, an auxiliary low voltage HEMT (20) and a voltage limiter (201). The voltage limiter may be a circuit block which can limit (or clamp) the maximum voltage at the gate of the auxiliary low voltage HEMT. Through this manner of operation the voltage limiter may overall act to provide a limit on the maximum voltage on the gate terminal of the GaN HEMT. In operation, the voltage applied to the control terminal may be divided between a voltage drop between the drain and source terminal of the aux HEMT (20) and a voltage drop between the gate and source terminal of the GaN HEMT (10). The auxiliary HEMT and the voltage limiter may be monolithically integrated with the GaN HEMT.

Figure 7:
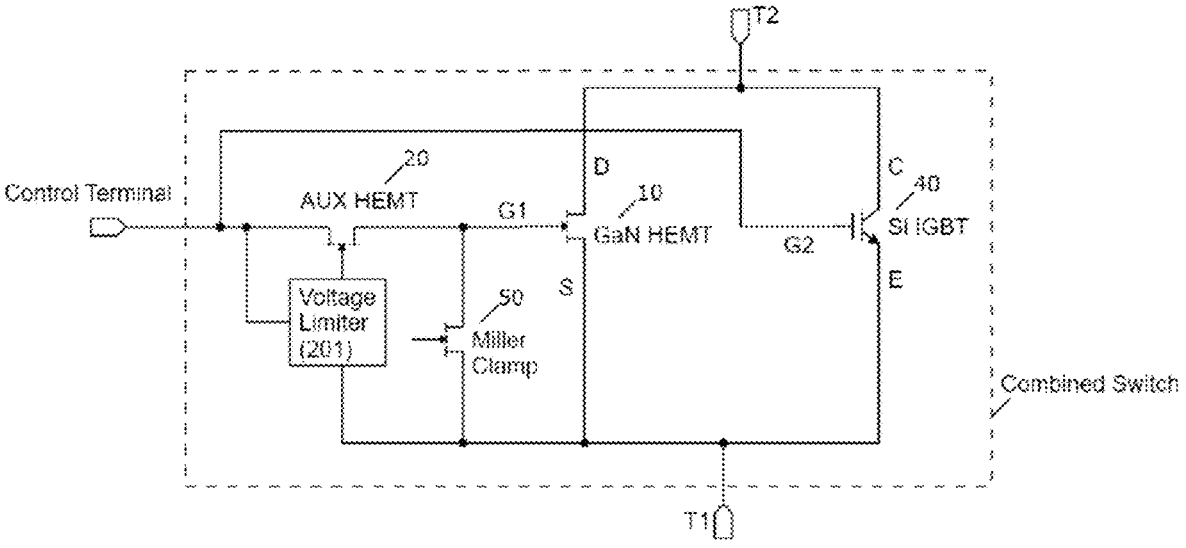
FIG. 7 illustrates an example of a semiconductor switch featuring a lateral GaN HEMT, an auxiliary low voltage HEMT, a pull down device and a high voltage IGBT placed in parallel with the lateral high voltage GaN HEMT, according to the present disclosure.

FIG. 7 illustrates another example of a combined switch according to the present disclosure, featuring a lateral GaN HEMT (10), an auxiliary low voltage HEMT (20), a pull down device (Miller clamp, 50) and a high voltage IGBT (40) placed in parallel with the lateral high voltage GaN HEMT (20). The driving circuit for the Miller Clamp (50) is not shown here. For simplicity the Miller clamp may be an active device, for example it may switch according to a signal applied to the control terminal. The signal to the gate of the Miller clamp may be adjusted in relation to the signal at the control terminal for example it may inverted and/or level shifted. The Miller clamp may be monolithically integrated with the GaN HEMT (10), aux HEMT (20) and Voltage limiter (201).

Figure 8:
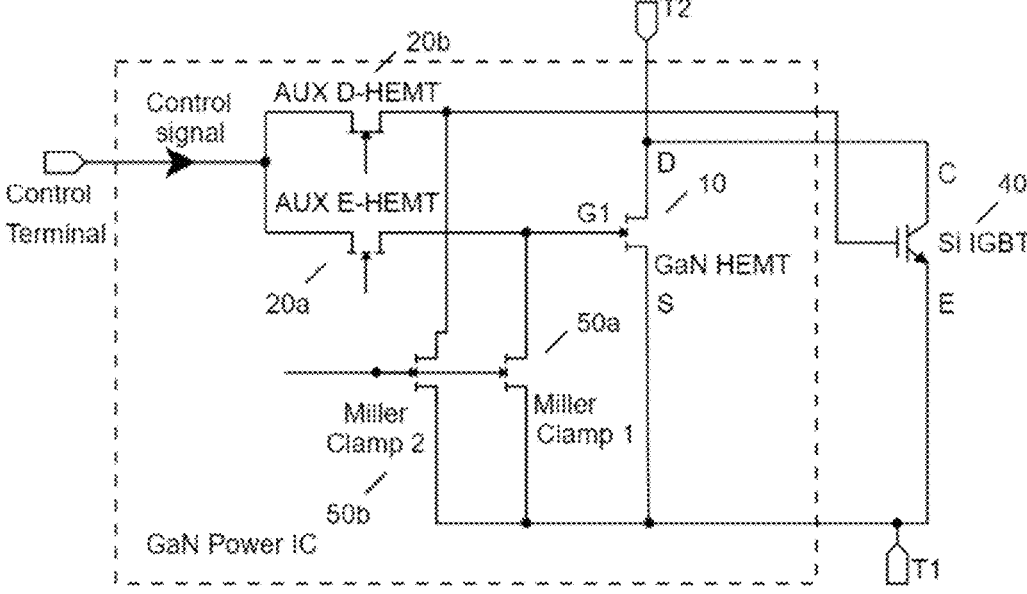
FIG. 8 illustrates an example of a semiconductor switch wherein the interface circuit comprises an auxiliary low voltage HEMT and a pull down device connected to the gate of a GaN HEMT.

FIG. 8 illustrates an example of the second aspect of the present disclosure. The interface circuit comprises an auxiliary low voltage HEMT (20*a*) and a pull down device (Miller clamp, 50*a*) connected to the gate of the GaN HEMT (10) and an additional auxiliary low voltage HEMT (20*b*) and an additional pull down device (Miller clamp, 50*b*) connected between the control terminal and the gate of the high voltage IGBT (40). The additional low voltage HEMT (20*b*) and the additional pull down device (Miller clamp, 50*b*) enable on-chip regulation or pull-down of the gate voltage of the IGBT. The driving/control circuits of the auxiliary HEMTs and Miller clamps are not shown here for simplicity.

Figure 9:
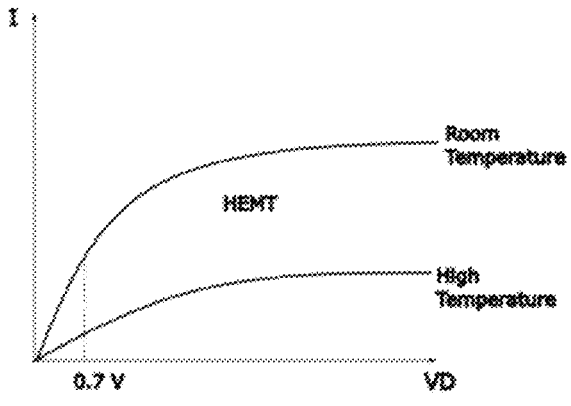
FIG. 9 illustrates the schematic shapes of on-state output I-V characteristics of the high voltage lateral GaN HEMT and the vertical IGBT at room and high temperatures.
Figure 9:
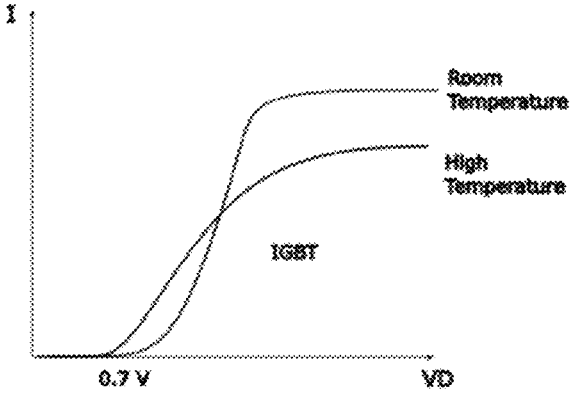

FIG. 9 illustrates the schematic shapes of on-state output I-V characteristics of the high voltage lateral GaN HEMT and the vertical IGBT at room and high temperatures. Note that the HEMT has a linear shape of the characteristics at low currents, while the IGBT does not have any current until 0.7 V and growing super-linearly initially and linearly after 0.7 V (followed by saturation). Note that the HEMT has a severe drop in the current (increased on-state resistance) at high temperatures.

Figure 10:
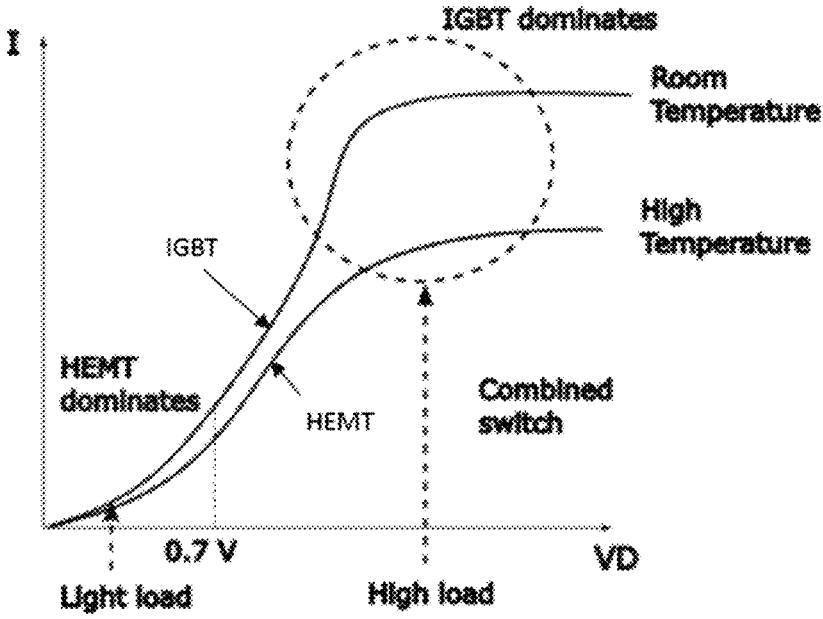
FIG. 10 illustrates the schematic shapes of output on-state I-V characteristics of the combined GaN HEMT and IGBT switch according to the present disclosure.

FIG. 10 illustrates the schematic shapes of output on-state I-V characteristics of the combined GaN HEMT and IGBT switch according to the present disclosure. Note that the HEMT current dominates at lower currents/lower on-state voltage drops (below 0.7V)—low load, while the IGBT currents dominates at higher currents (higher on-state voltage drops). At high temperatures, the IGBT compensates the loss in the current of the HEMT. The two parallel devices offer a complementary behavior with improved performance than either the IGBT or the GaN HEMT.

Figure 11:
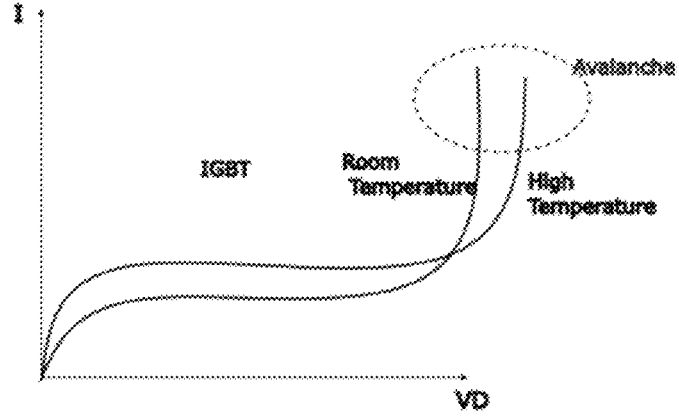
FIG. 11 illustrates the schematic shapes of blocking I-V characteristics of the IGBT and high voltage lateral GaN HEMT at room temperature and high temperature.
Figure 11:
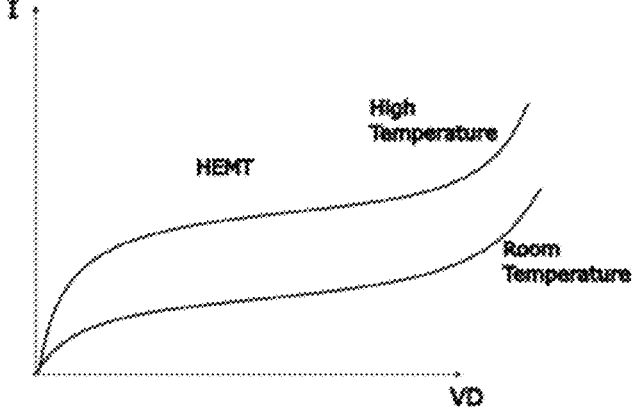

FIG. 11 illustrates the schematic shapes of blocking I-V characteristics of the IGBT and high voltage lateral GaN HEMT at room temperature and high temperature. Note that in both the IGBT and the GaN HEMT the higher the temperature the higher the leakage.

Note that the IGBT breaks via avalanche and typically the avalanche voltage increases with temperature.

Note that lateral GaN HEMT typically break via an increase in the leakage current (typically between the substrate terminal and the drain terminal).

Figure 12:
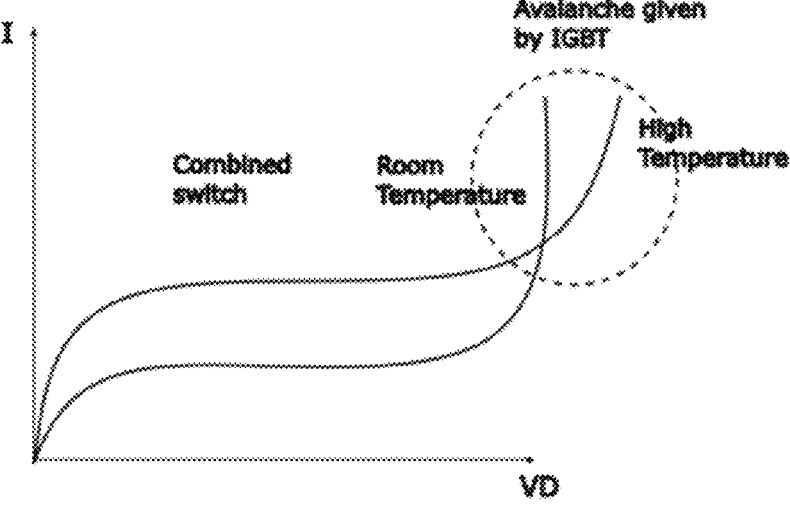
FIG. 12 illustrates schematic shapes of blocking I-V characteristics of the semiconductor switch at room temperature and high temperature.

FIG. 12 illustrates schematic shapes of blocking I-V characteristics of the combined switch at room temperature and high temperature. Note that the IGBT mainly dictates the blocking characteristics and the IGBT clamps the voltage during its avalanche. The avalanche capability of the combined switch is provided by the avalanche capability of the IGBT. The avalanche capability of the combined switch may allow the design of a more competitive GaN HEMT. As the maximum voltage across the combined switch can be limited by the avalanche voltage of the IGBT, there may be a reduced need to over-design the breakdown voltage of the GaN HEMT in order to deal with drain-to-source voltage overshoots in operation.

Figure 13:
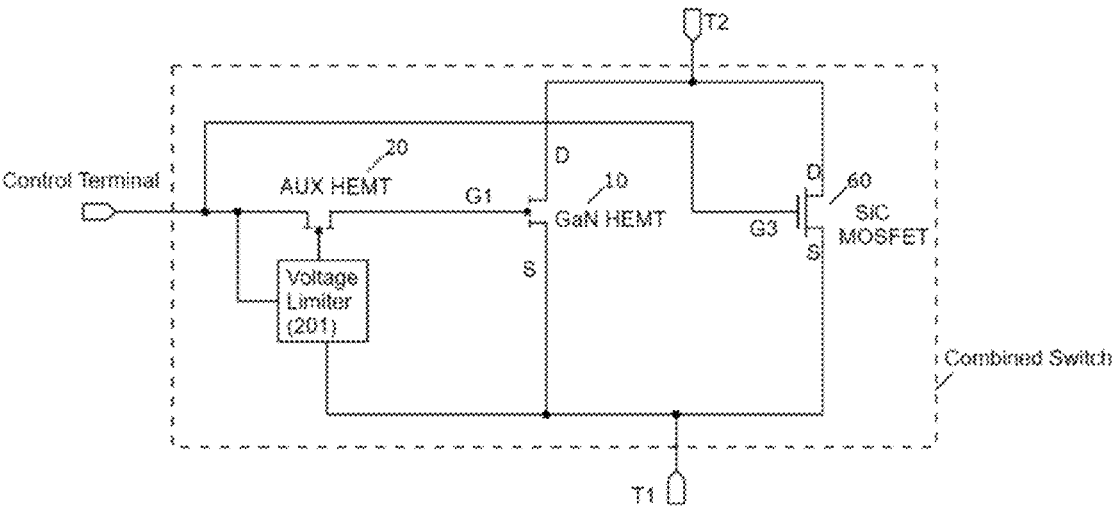
FIG. 13 illustrates an example of a semiconductor switch featuring a lateral high voltage GaN HEMT, an auxiliary low voltage HEMT, and a high voltage SiC MOSFET (or superjunction) in parallel with the lateral high voltage GaN HEMT, according to the present disclosure.

FIG. 13 illustrates a combined switch according to another aspect of the present disclosure, featuring a lateral high voltage GaN HEMT (10), an auxiliary low voltage HEMT (20), and a high voltage SiC MOSFET (or superjunction MOSFET) (60) in parallel with the lateral high voltage GaN HEMT (10).

Figure 14:
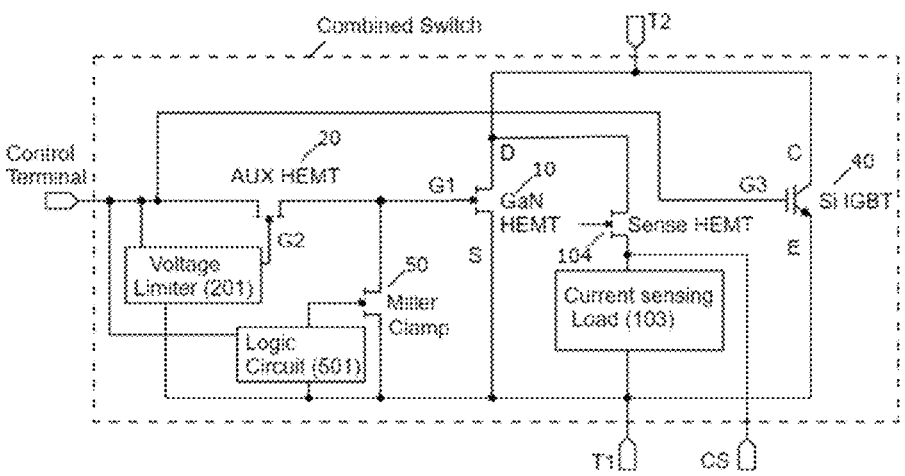
FIG. 14 illustrates a semiconductor switch according to the present disclosure featuring a lateral GaN HEMT, an auxiliary low voltage HEMT, a pull down device and a high voltage IGBT placed in parallel with the lateral high voltage GaN HEMT.
Figure 15:
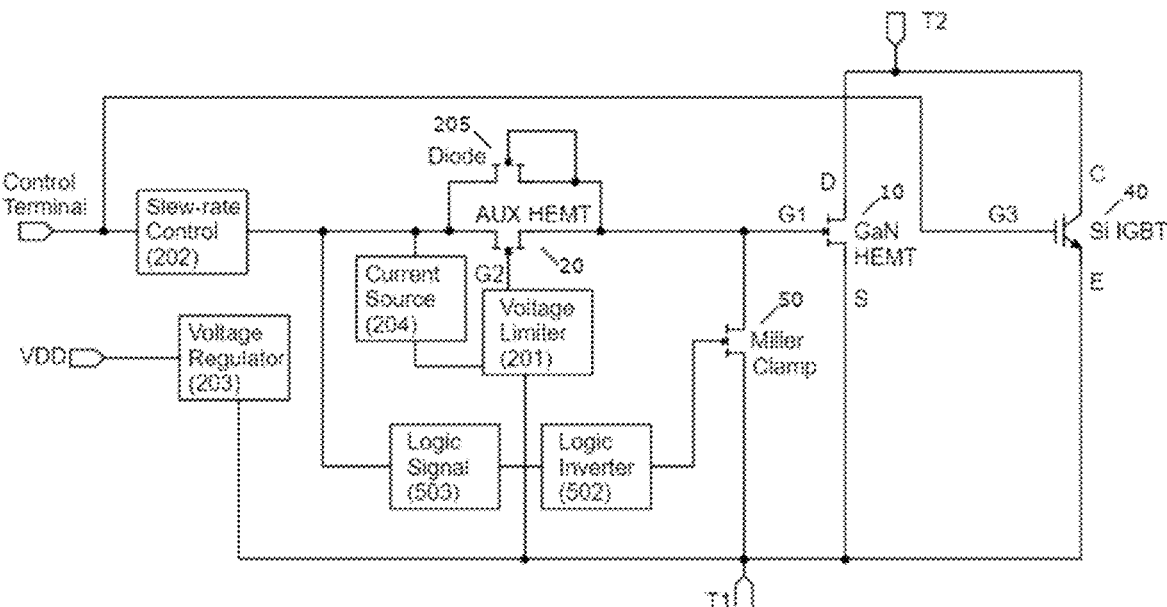
FIG. 15 illustrates a semiconductor switch according to the present disclosure featuring a lateral GaN HEMT, an auxiliary low voltage HEMT, a pull down device and a high voltage IGBT placed in parallel with the lateral high voltage GaN HEMT.

FIG. 14 illustrates a combined switch according to the present disclosure featuring a lateral GaN HEMT (10), an auxiliary low voltage HEMT (20), a pull down device (Miller clamp, 50) and a high voltage IGBT (40) placed in parallel with the lateral high voltage GaN HEMT (10). A current sense HEMT (104) is monolithically integrated within the GaN chip (alongside the other GaN devices). The current sensing load (resistance) (103) could also be integrated or provided externally. Other circuit blocks such as logic circuits (501) to drive the miller clamp (50) (pull-down transistor) or voltage limiter (201) placed in the gate of the auxiliary HEMT are also monolithically integrated within the GaN chip. The logic circuit can have a connection to the control terminal (external gate) and may comprise an inverter. The voltage limiter can be driven by a current source from the control terminal as shown in FIG. 15. The circuit blocks (50) (501) (20) (201) may be described as being blocks of an overall interface circuit which operates in order to limit the maximum voltage at the gate of the GaN HEMT (for example to 7V) while a higher voltage is applied to the control terminal (for example 20V). The interface circuit is additionally configured to allow a switching signal at the gate of the GaN HEMT when a switching signal is applied to the control terminal. The switching signal may be limited in voltage as described. The interface circuit may also be configured to provide a threshold voltage increase when considering the GaN HEMT and the interface circuit in combination compared to considering the threshold voltage of the GaN HEMT as a discrete device. Through the operation of the interface circuit compatibility between the driving requirements of the GaN HEMT and the IGBT may be ensured such that they may be driven by a control signal from a single gate driver.

In the embodiment of FIG. 15, the voltage limiter (201) is connected between the gate of the auxiliary HEMT (20), the HEMT source terminal and the control terminal (via the current source (204) and slew rate control circuit (202)). This is an additional example of how the voltage limiter may be connected. In this configuration, the voltage limiter can limit (or clamp) the maximum voltage at the gate of the auxiliary low voltage HEMT in relation to the voltage, VDD. FIG. 15 illustrates a combined switch according to the present disclosure featuring a lateral GaN HEMT (10), an auxiliary low voltage HEMT (20), a pull down device (Miller clamp, 50) and a high voltage IGBT (40) placed in parallel with the lateral high voltage GaN HEMT (10). Other circuit blocks such as logic signal (503)/logic inverter (502) circuits to drive the Miller clamp (50) or voltage limiter (201) placed in the gate of the auxiliary HEMT (20) are also monolithically integrated within the GaN chip. A voltage regulator (203), which may regulate an externally applied VDD to a suitable DC voltage to drive the on-chip logic circuits is included. A diode (205) (possibly made of a HEMT with the gate shorted to one of the source/drain terminals) could be placed in parallel with the AUX HEMT (20) to aid the turn-off of the high voltage GaN HEMT (10). The logic circuit (similar to that in FIG. 12) can have a connection to the control terminal and may comprise a logic signal (503) and an inverter (502). The voltage limiter (201) can be driven by a current source (204) from the control terminal. A slew rate control circuit (202) is included to adjust the speed of the turn-on and turn-off of the GAN HEMT. This could be monolithically integrated with the high voltage GaN HEMT or provided externally.

Figure 16:
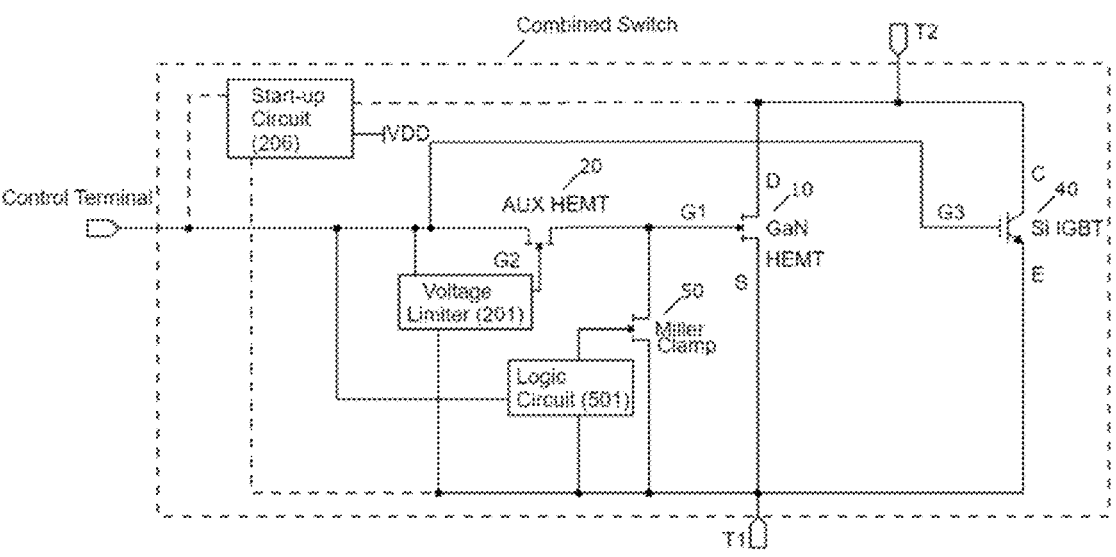
FIG. 16 illustrates a semiconductor switch comprising an additional start-up circuit.

FIG. 16 is similar to FIG. 14 but with an additional start-up circuit (206) which could avoid the need to apply an external VDD voltage for the operation of the combination circuit and the interface circuit blocks. In this embodiment the voltage rail required by the interface circuit blocks may be generated internally through the start-up circuit from either the control terminal or the high voltage terminal (or both).

Figure 17:
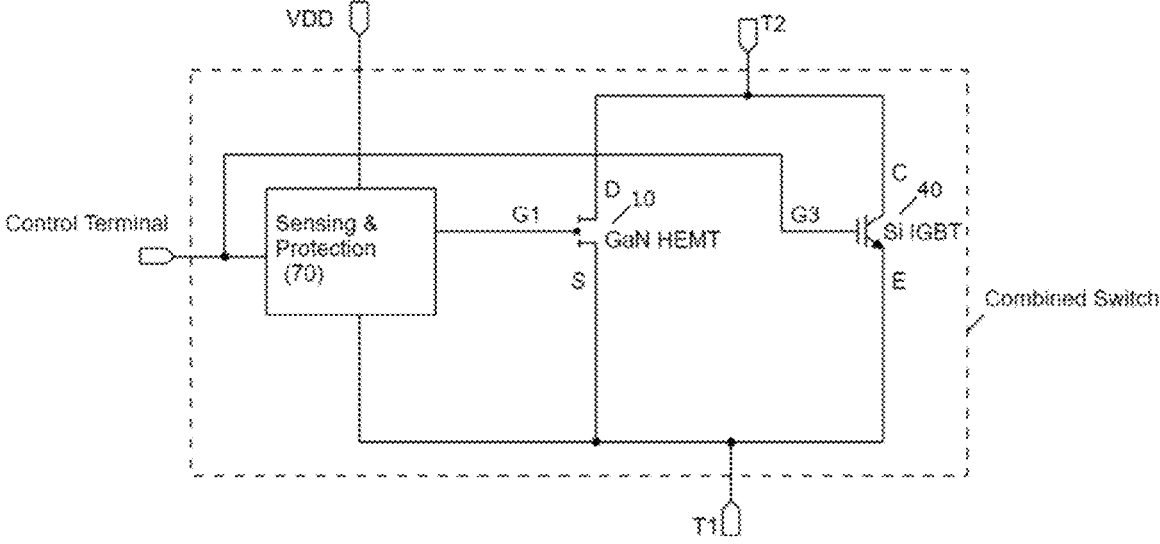
FIG. 17 illustrates a semiconductor switch in which auxiliary HEMT is embedded in a sensing and protection circuit block, which is monolithically integrated with a GaN HEMT.

FIG. 17 illustrates a more generic structure where the Aux HEMT is embedded in the sensing and protection circuit block (70) which is monolithically integrated with the GaN HEMT (10). The Sensing and protection circuit block could comprise various functions such as voltage clamping circuits and Miller clamp devices.

Figure 18:
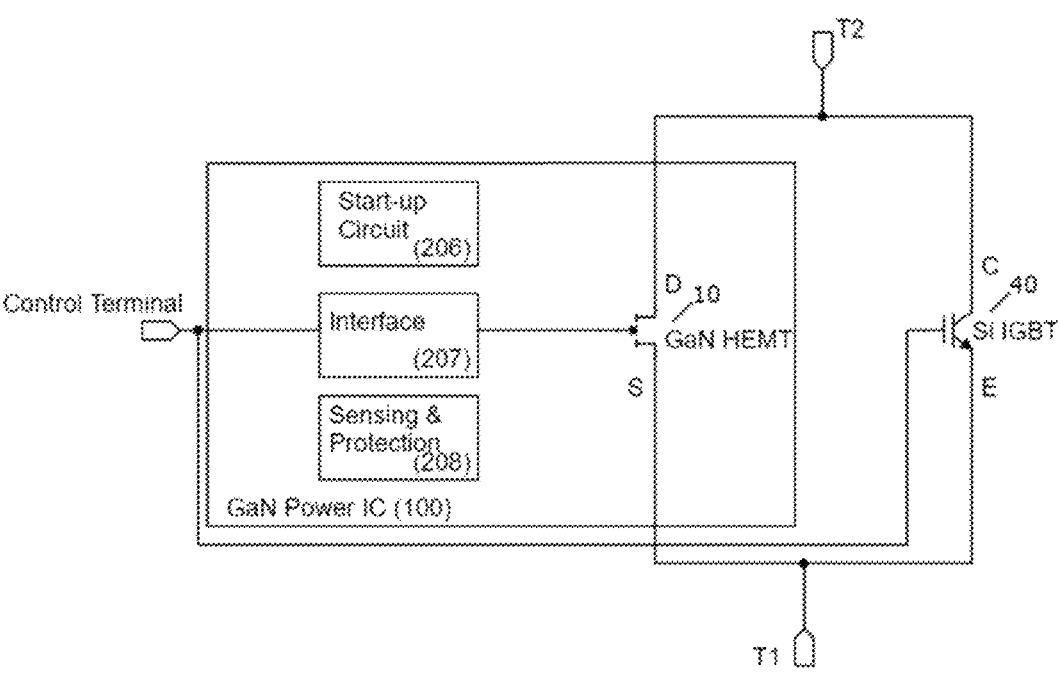
FIG. 18 illustrates an example of a semiconductor switch according to the present disclosure in which a high voltage HEMT is part of a power integrated circuit.

FIG. 18 illustrates another aspect of the first aspect of the present disclosure where the High Voltage GaN HEMT (10) could be part of a GaN Power IC (100). An interface circuit (207) has at least one connection to the control terminal and at least one connection to the internal gate of the high voltage GaN HEMT (10), wherein the interface allows driving voltage compatibility between the high voltage device (40) (e.g. IGBT) and the high voltage GaN HEMT (10). The GaN Power IC (100) may contain other devices/circuits, such as start-up (206) and sensing and protection circuits (208).

Figure 19:
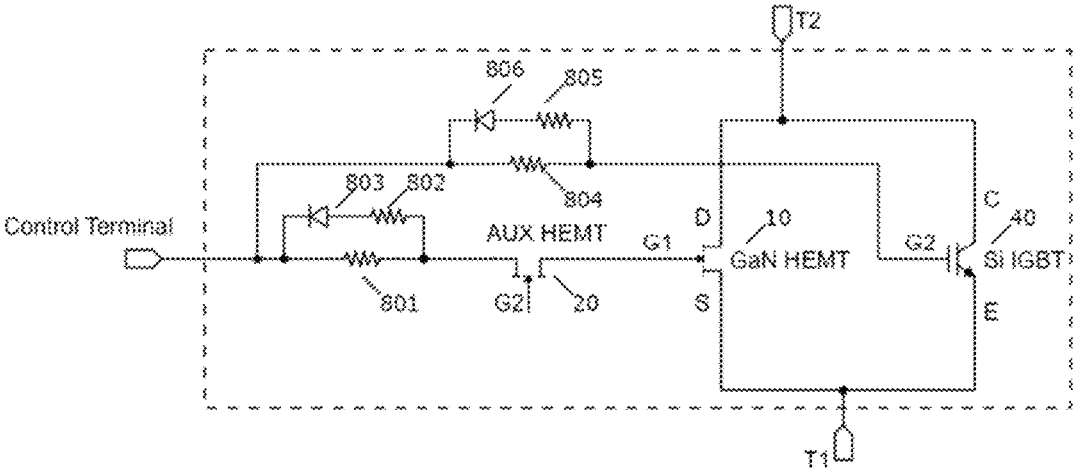
FIG. 19 illustrates an example of a semiconductor switch comprising slew rate control circuits.

FIG. 19 illustrates an example of simple slew rate control circuits that can be provided externally and inserted before the Aux HEMT or in the gate of the IGBT to adjust individually the speed of the two devices. This simple method can also be used for a more balanced (or more desirable) sharing of the current during the transient voltages. Instead of the resistors and resistors with diodes, more complex slew rate circuits can be integrated monolithically alongside the high voltage GaN HEMT.

Figure 20:
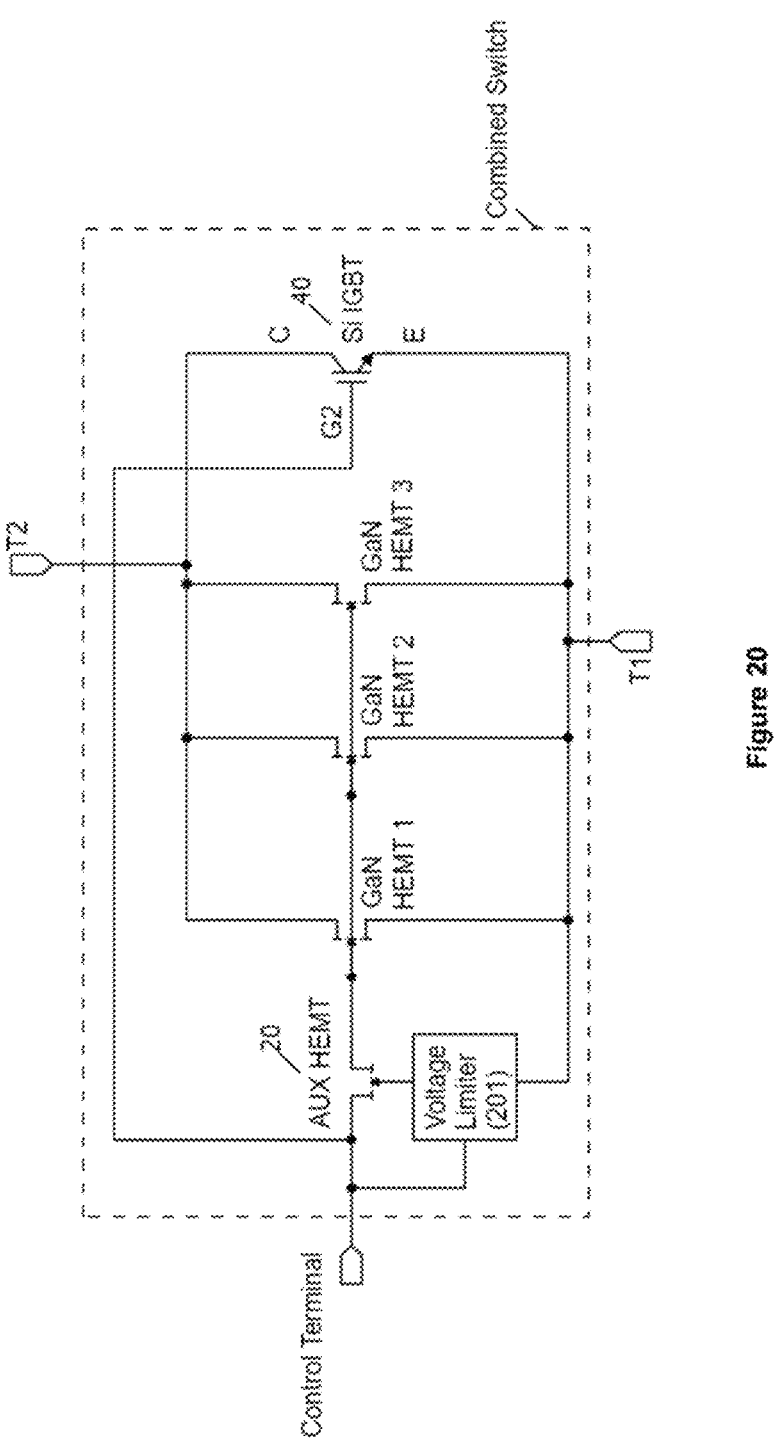
FIG. 20 illustrates an example of a semiconductor switch comprising multiple high voltage HEMTs in parallel with a high voltage transistor device.

FIG. 20 illustrates an example where multiple high voltage GaN HEMTs can be provided in parallel with the high voltage device (IGBT). One (shown) or multiple Aux HEMTs (not shown) can be connected to the internal gate of the high voltage GaN HEMTs. Multiple parallel IGBTs (not shown) can also be connected to scale up the current capability of the combined switch.

Figure 21:
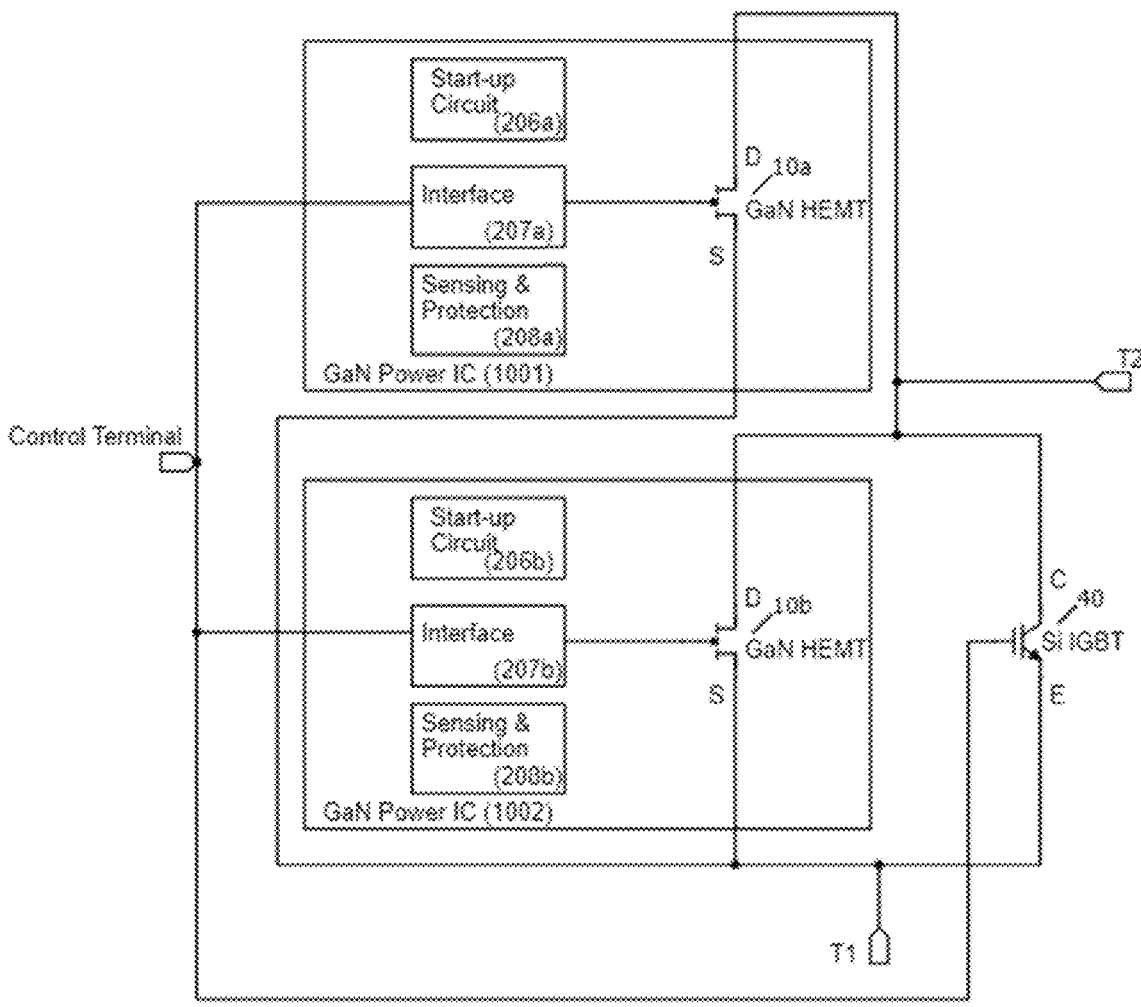
FIG. 21 illustrates an example of a semiconductor switch comprising two power integrated circuits, each comprising a high voltage HEMT, in parallel with a high voltage transistor device.

FIG. 21 shows multiple (shown two) Power ICs as were illustrated in FIG. 17. The two Power ICs are connected in parallel. Additionally, the combination of two Power ICs in parallel, can be provided in parallel with the high voltage device (IGBT).

Figure 22:
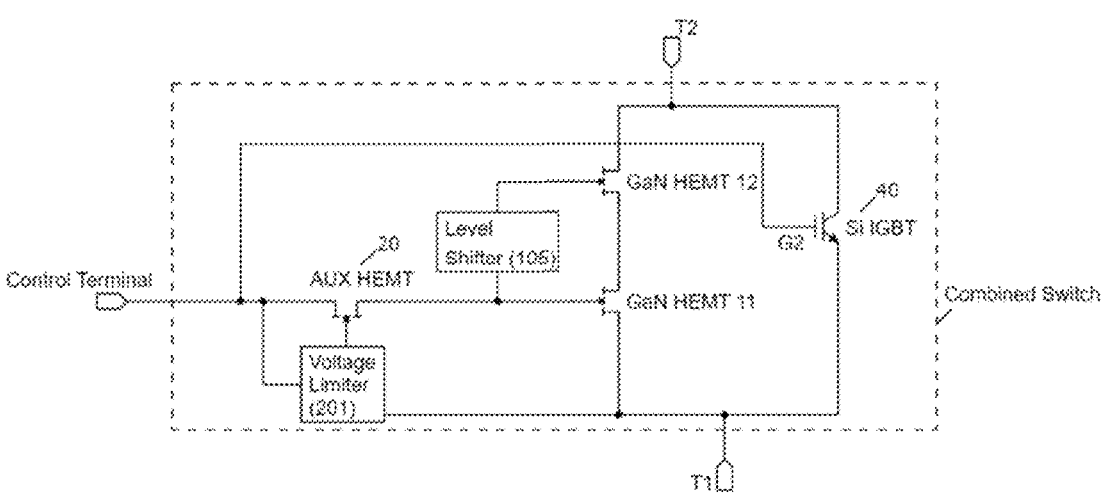
FIG. 22 illustrates an example of a semiconductor switch comprising multiple high voltage HEMTs.

FIG. 22 shows series of multiple high voltage HEMTs (here shown only two) can be provided instead of a single GaN HEMT. This could be a solution if higher blocking voltages (e.g. in excess of 1.2 kV) are needed. A level shifter (105) could be used for the upper GaN HEMT (12). The level shifter could be monolithically integrated with the lower GaN HEMT (11) or provided externally.

Figure 23:
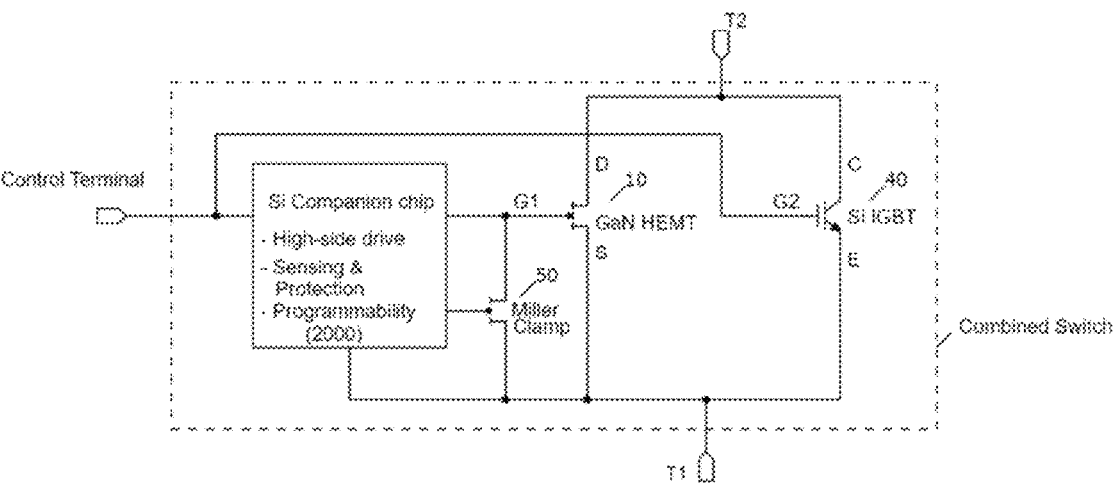
FIG. 23 illustrates an example of a semiconductor switch comprising a silicon companion chip, or integrated circuit.

FIG. 23 illustrates another embodiment of the present disclosure where a silicon companion chip (2000) can be co-packaged with the Power HEMT (10). The Miller clamp (50) can be monolithically integrated with the GaN HEMT (10). The silicon companion chip can provide an interface allowing a compatible voltage range for driving the GaN HEMT (10) and the IGBT (40). The companion chip (2000) can provide voltage clamping action, slew rate control, high side drive and other sensing and protection features. It can have programmable functions and can be made in mix-signal processes which allow both digital and analogue components to be integrated. A BCD (Bipolar CMOS DMOS) process can be used as an example.

Figure 24:
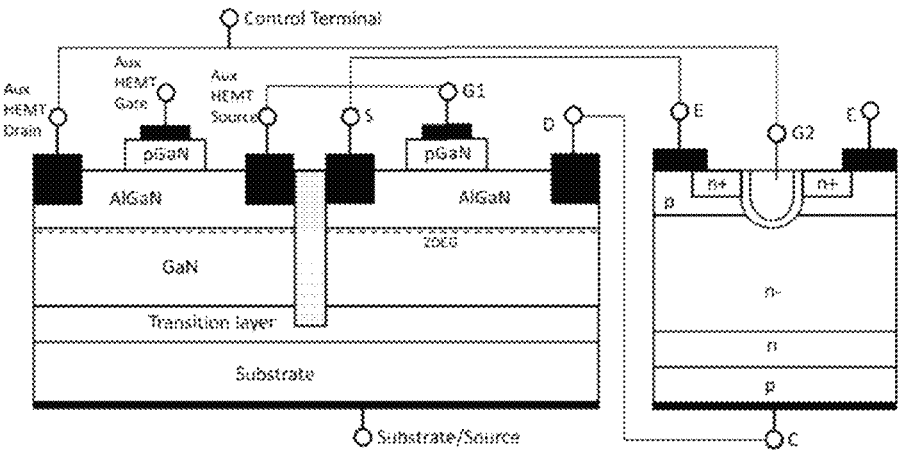
FIG. 24 illustrates a schematic cross-section representation and connections between a lateral high voltage HEMT, an auxiliary HEMT, and a trench IGBT.

FIG. 24 illustrates a schematic cross-section representation and connections between the lateral high voltage GaN HEMT, the Aux GaN HEMT and a trench IGBT.

Figure 25:
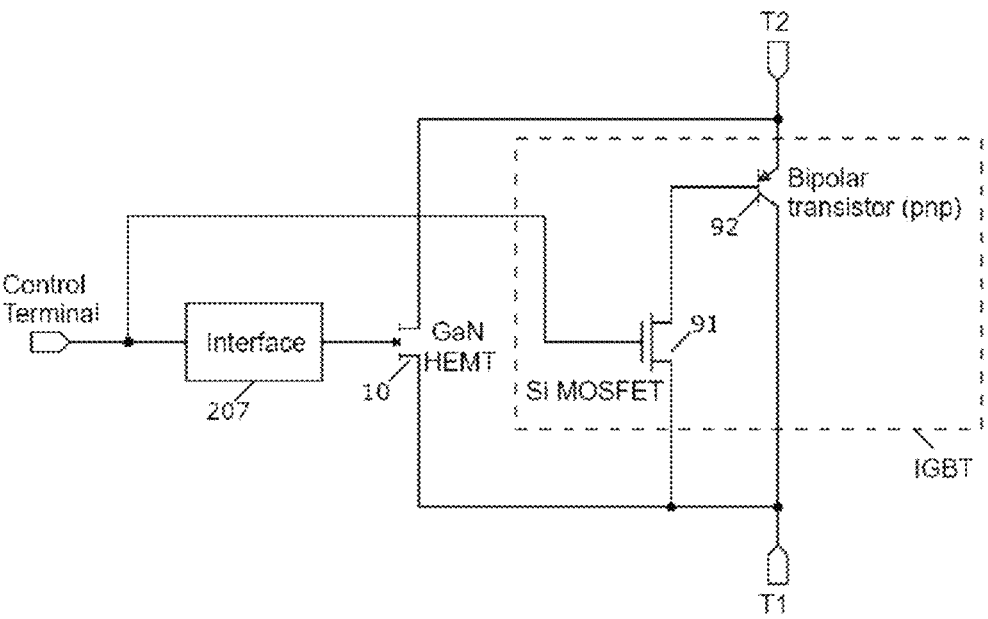
FIG. 25 illustrates a schematic equivalent circuit representation and connections between a lateral high voltage HEMT, an auxiliary HEMT, and an IGBT.

FIG. 25 illustrates a schematic representation of the equivalent circuit and connections between the lateral high voltage GaN HEMT (10), an interface circuit (207) comprising the Aux GaN HEMT, and an IGBT. The IGBT is described as a combination between an n-channel MOSFET (91) and a bipolar PNP transistor (92) with the drain of the n-channel MOSFET being connected to the base of the PNP transistor.

Figure 26:
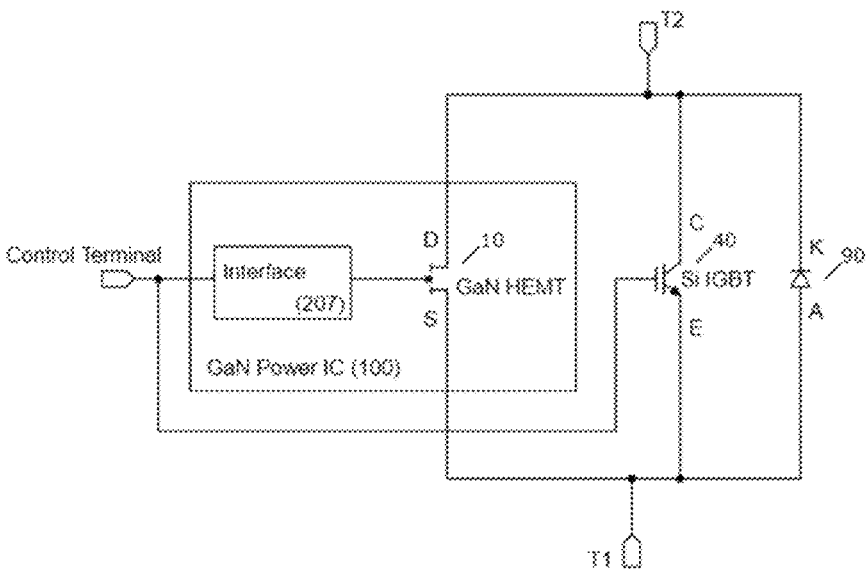
FIG. 26 illustrates a semiconductor switch comprising an IGBT and a GaN Power IC, further comprising a high voltage GaN HEMT and an interface which has at least one connection to the control terminal and at least one connection to the internal gate of the high voltage GaN HEMT.

FIG. 26 illustrates a combined switch comprising an IGBT (40) and a GaN Power IC (100) further comprising a high voltage GaN HEMT (10) and an interface (207) which has at least one connection to the control terminal and at least one connection to the internal gate of the high voltage GaN HEMT. An extra high voltage anti-parallel diode (90) is added to aid the reverse conduction. This diode could become in parallel with the existing intrinsic 2DEG reverse conducting diode of the high voltage GaN HEMT. The extra diode could be part of a Reverse Conducting IGBT (RC IGBT) or could be an independent bipolar or Schottky or Schottky-based diode made in silicon or silicon carbide.

Figure 27:
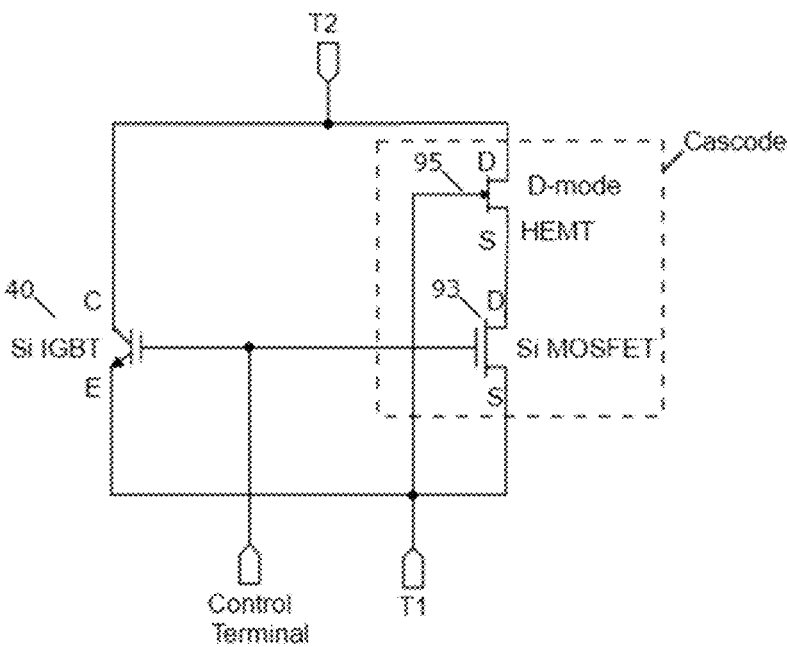
FIG. 27 illustrates a semiconductor switch according to the third aspect of this invention and based on a Cascode HEMT in parallel with an IGBT.

FIG. 27 illustrates a device according to a third aspect of the present disclosure, comprising a Cascode device in parallel with an IGBT. The Cascode device comprises a MOSFET (93) (an n-channel MOSFET made preferably in silicon or silicon carbide technology) in series with a high voltage depletion mode HEMT (95) (made in III-Nitride material). The gate of the depletion mode GaN HEMT is connected to the source of the MOSFET.

Figure 28:
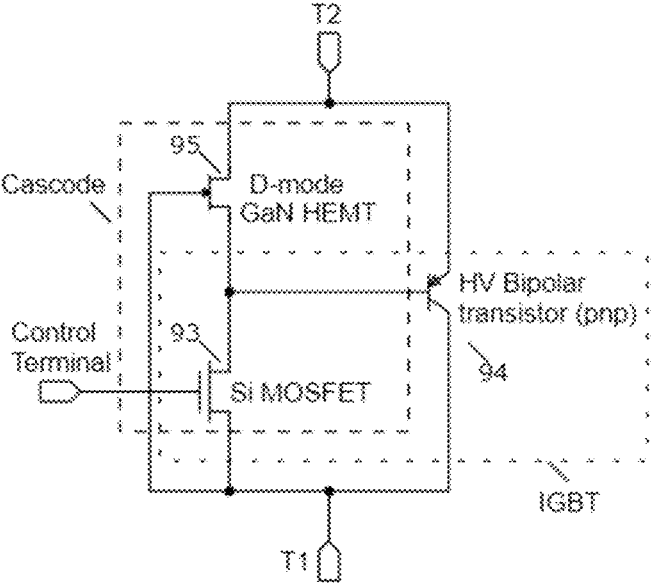
FIG. 28 illustrates a semiconductor switch according to a fourth aspect of this invention, comprising a depletion MODE HEMT, a MOSFET and a PNP transistor.

FIG. 28 illustrates a device according to a fourth aspect of the present disclosure, comprising a MOSFET (93) (n-channel MOSFET, preferably in silicon or silicon-carbide technology), a high voltage depletion mode HEMT (95) and a PNP transistor (94) (bipolar junction transistor). The drain of the n-channel MOSFET is connected to the base of the high voltage PNP transistor and also to the source of the high voltage depletion mode HEMT.

The n-channel MOSFET is responsible for both (i) enabling a negative gate-source voltage for the depletion HEMT during the blocking mode and (ii) providing the electron current to the base of the pnp transistor in the on-state. Preferably the MOSFET is an n-channel stand-alone component made in silicon or silicon-carbide technology and the high voltage PNP transistor could be made in silicon or silicon-carbide technology. The high voltage PNP transistor could have a vertical configuration with a wide n base and a relatively narrow p collector or a relatively narrow n base and a relatively wide p collector.

Figure 29:
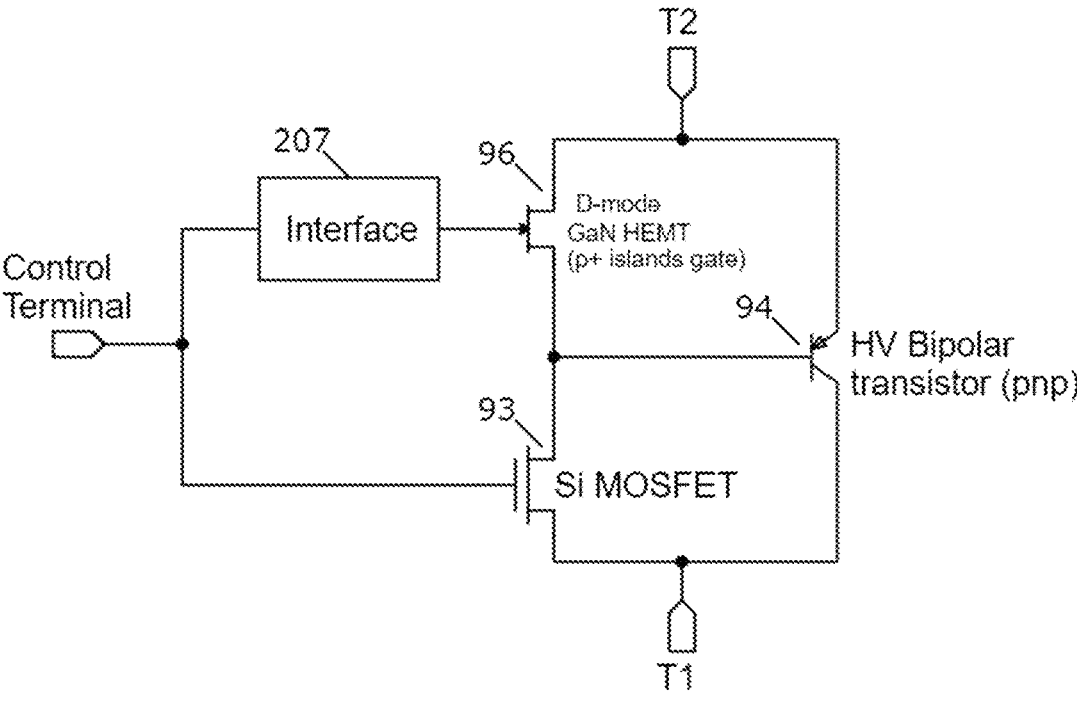
FIG. 29 illustrates a semiconductor switch according to a fifth aspect of this invention, comprising a depletion MODE HEMT with p+ islands, an interface between a control terminal and the gate terminal of the depletion mode HEMT with p+ islands, a MOSFET and a PNP transistor.

FIG. 29 illustrates a device according to a fifth aspect of the present disclosure. The Cascode device in FIG. 28 is replaced with a high voltage depletion mode HEMT based on p+ islands in series with a MOSFET (as described in U.S. Pat. No. 11,081,578). The two series devices are further placed in parallel with the pnp transistor.

The gate of the p+ islands depletion mode HEMT could be connected through an interface (207) to the control terminal. The interface could be the same as the one described earlier in the first aspect of this disclosure. The role of such interface is to adapt the driving voltage of the control terminal to that suitable and allowable for the p+ islands depletion mode GAN HEMT.

Figure 30:
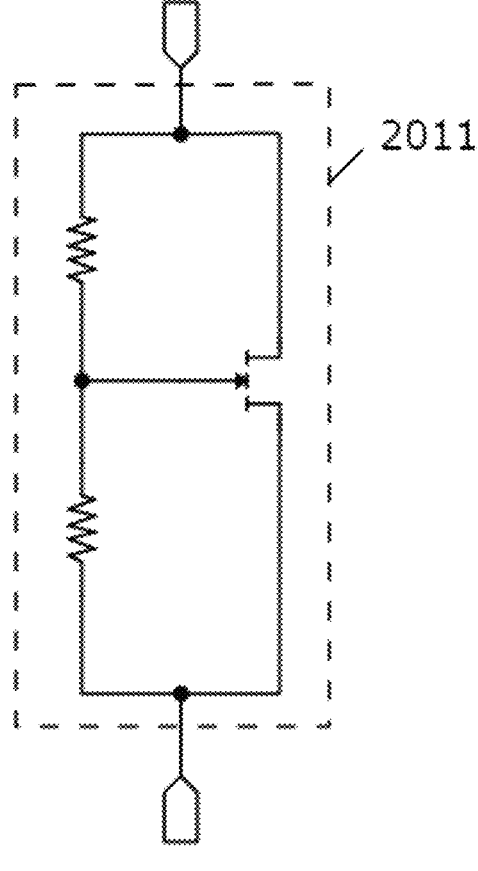
FIG. 30 illustrates an example of a voltage limiter.

FIG. 30 illustrates an example of a voltage limiter (2011). In this example the voltage limiter comprises an enhancement mode HEMT and two resistors. One terminal of the voltage limiter may be connected to the gate of the auxiliary HEMT and the other terminal may be connected to the source terminal of the GaN HEMT or to a voltage VDD as illustrated in previous examples.

Figure 31:
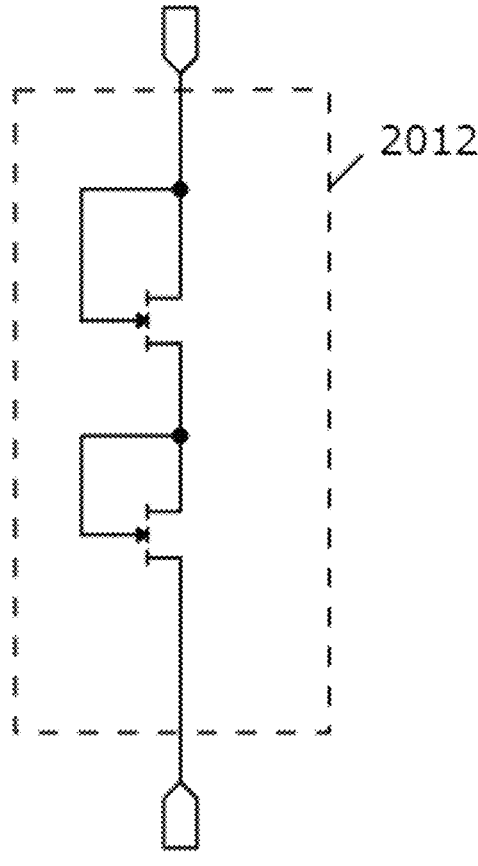
FIG. 31 illustrates an additional example of a voltage limiter.

FIG. 31 illustrates an additional example of a voltage limiter (2012). In this example the voltage limiter comprises two enhancement mode HEMTs in series connected in a diode-like manner. A different number of enhancement mode HEMTs in series may be used in other examples depending on the desirable voltage limit of the circuit.

Figure 32:
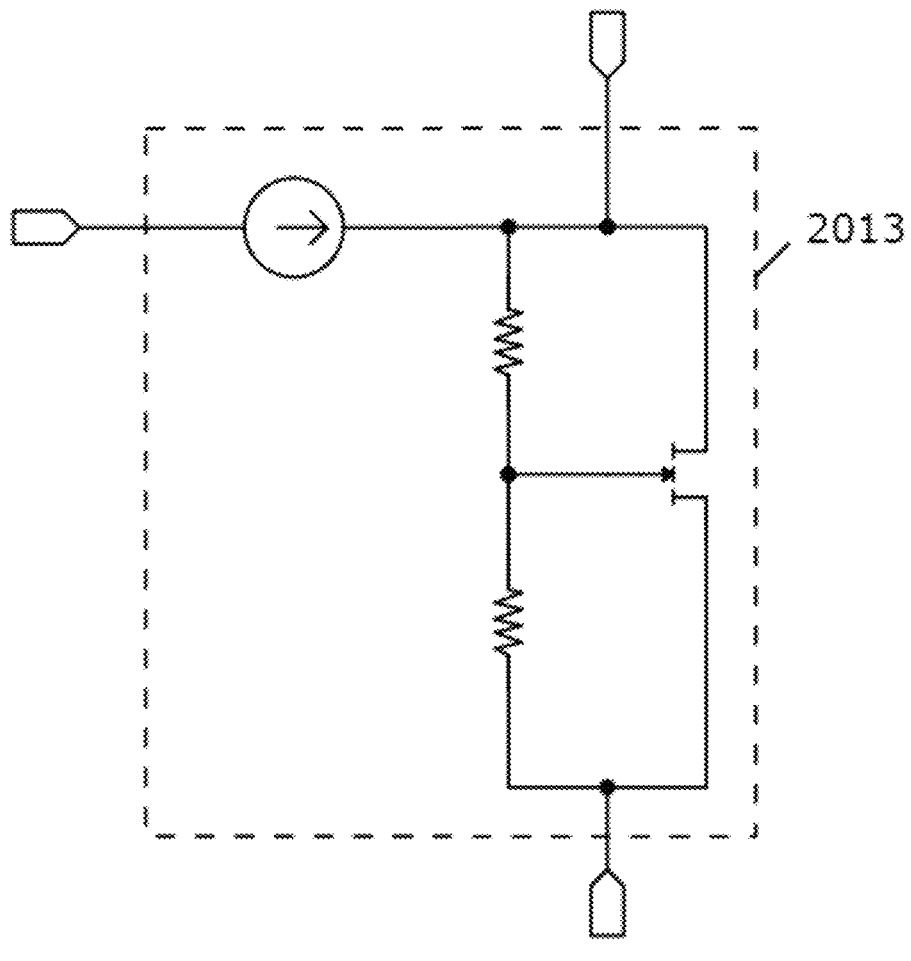
FIG. 32 illustrates an additional example of a voltage limiter which comprises a current source.

FIG. 32 illustrates an additional example of the voltage limiter (2013), similar to FIG. 30, which also comprises a current source. The current source is useful in setting the voltage limit of the voltage limiter while controlling the power dissipation of the circuit in operation.

Returning to FIG. 4, a combined switch may comprise, in examples, a lateral GaN Power HEMT (10) (i.e. a high voltage HEMT), an interface circuit (207) and a high voltage transistor device (30) (e.g. an IGBT). The turn-on of the combined switch is faster than that of an IGBT alone as the internal input capacitance of the high voltage HEMT is very small compared to the input capacitance of the IGBT and therefore it could be charged quickly. The turn-off the combined switch is faster than that of an IGBT alone as the GaN HEMT is a unipolar device and there is no excess charge (i.e. plasma) present in the GaN HEMT. Moreover during the turn-off the current may redistribute compared to the on-state or steady-state. Thus a larger proportion of the current may be switched off by the high voltage GaN HEMT, minimizing the tail of the IGBT component in the combined switch. As a result the turn-off tail and turn-off losses can be smaller in a combined switch than an IGBT alone.

Figure 33A:
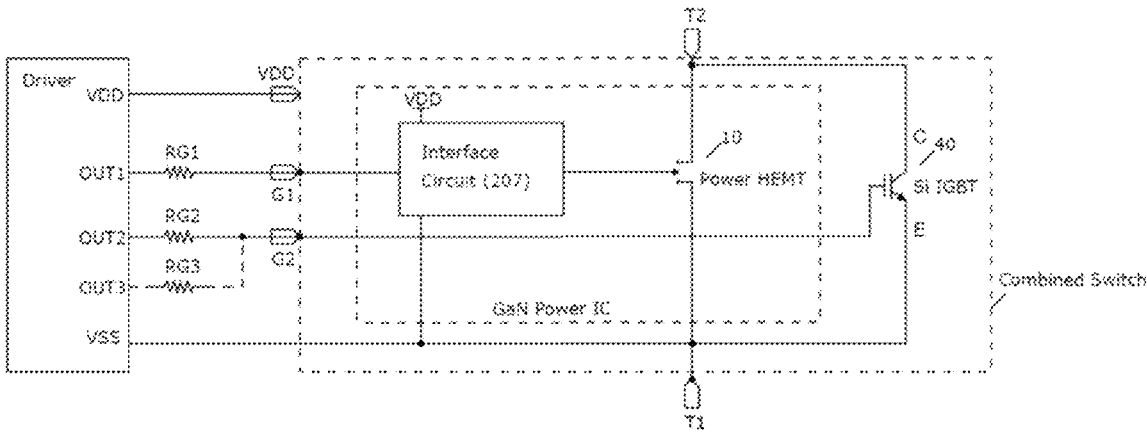
FIG. 33a illustrates an example of a semiconductor switch wherein a control terminal and a transistor device gate terminal are configured to be driven by a driver.

FIG. 33*a* illustrates an example according to the present disclosure, featuring a multiple input III-nitride (e.g. GaN) power HEMT with individual connections for driving the gates of the GaN power HEMT (10) and high voltage switch (40). In the example illustrated in FIG. 33*a*, HEMT is part of a GaN power integrated circuit (IC). The symbol for the high voltage switch in FIG. 33*a* is that of an IGBT, but the high voltage switch could be another type of power semiconductor device, such as a power MOSFET or a superjunction MOSFET preferably comprising a wide band-gap (such as Silicon Carbide) or ultra-wide bandgap (such as Aluminium Nitride) material. An optional interface circuit (207) may be placed in front of the gate of the lateral GaN power HEMT (10) to adapt the driving voltage from the driver to that suitable and allowable for the GaN power HEMT (10). This interface could be preferably monolithically integrated with the power HEMT for providing lower parasitics, ease of manufacturing and fast reaction time. Alternatively, this interface could be part of a separate chip (such as a silicon companion chip, or a driver chip). Alternatively, this interface could be integrated within the driver. The interface circuit may additionally include pass transistors (e.g. a low power HEMT), diodes, voltage regulators, voltage limiters, clamping circuits, sensing and protection functions, pull-down devices, such as a Miller clamp, to ensure a fast and safe turn-off, to enhance immunity against dV/dt and to absorb any transient voltage peaks on the gate.

Multiple inputs of the GaN power IC are configured to have different driving voltage levels and/or slew rates and and/or timing sequences when the power IC is in the on-state, off-state, turn-on and turn-off modes. This may enable dynamic control of the IGBT slew rate and turn on and turn off curves while GaN power IC has its own input from the driver. The resistors RG1, RG2, RG3 can be provided externally or inserted before the interface circuit for the power HEMT (10) and the gate of the IGBT (40) to adjust individually the turn-on and turn-off speed of the two devices. The VDD voltage needed as a DC rail for the interface circuit, could be provided internally via a start-up structure (not shown) or could be the same as the VDD supplied to the driver.

In the example shown in FIG. 33*a*, the turn-on and turn-off of the GaN Power IC are driven by gate G1 through the same path OUT1. Gate G2 of IGBT may receive driving signal from two outputs of the driver OUT1 and OUT2 which can be configured for turn-on and turn-off signals, respectively. This helps in controlling the slew rate of the IGBT by adjusting the resistor values and delaying the gate driving signals. The resistors RG1, RG2 etc. can help dynamically control and modulate the turn-on speeds of the switches. During the turn-on, the GaN power HEMT can take higher current than during the on-state or steady state (as much as the saturation current) until the IGBT turns-on fully and the current is redistributed (part of the current from the GaN power HEMT would be redistributed in the IGBT). As a result, the turn-on losses in a combined switch may be smaller than in an IGBT or a first transistor alone. Alternatively, the connections between the outputs (e.g. OUT1, OUT2, OUT3) of the driver and the inputs of the interface circuit or the gate of the high voltage switch (e.g. G1, G2) may contain resistors in parallel with series branches of resistors and diodes to differentiate between turn-on and turn-off speeds. In FIG. 33*a* only one power HEMT 10 and one high voltage switch 40 are shown. It may be understood that multiple HEMT devices in parallel could replace the HEMT 10, or multiple high voltage switches (e.g. vertical IGBTs or Silicon Carbide MOSFETs) could replace the high voltage switch 40. It may also be understood that the semiconductor switch may comprise the combination of a cascode device with a high voltage switch or other alternative configurations as illustrated in previous embodiments. For example, a module or a package can house a combined switch which could comprise multiple vertical IGBTs in a combination with a single Power HEMT. A multiple output driver can drive the module as described above.

Figure 33B:
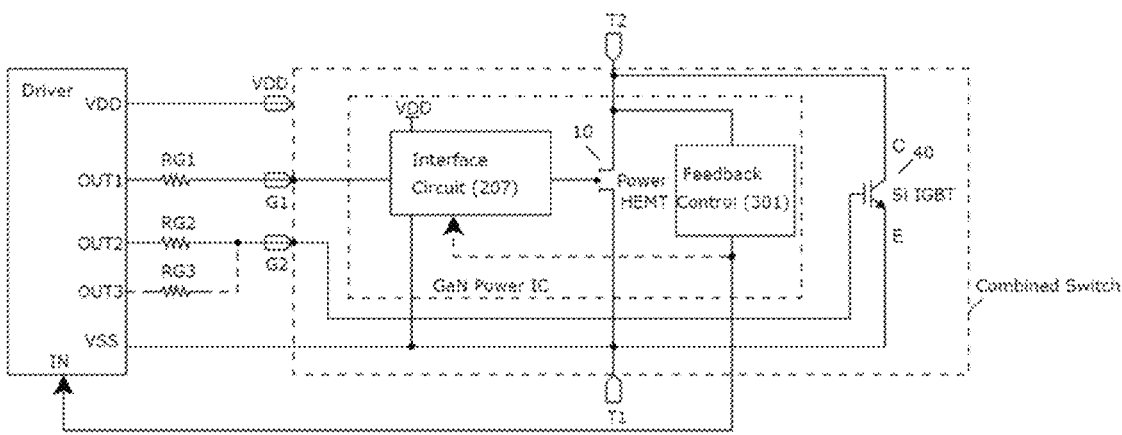
FIG. 33b illustrates an example of a semiconductor switch wherein a control terminal and a transistor device gate terminal are configured to be driven by a driver along with a feedback control circuit.

FIG. 33*b* illustrates a further example of the first aspect of the present disclosure, featuring a multiple input semiconductor switch power IC with individual connections for driving the gates of the GaN power HEMT (10) and high voltage switch (40). Compared to FIG. 33*a*, FIG. 33*b* shows an additional feedback control circuit (301) preferably integrated within the GaN Power IC. The role of this circuit is to provide a feedback signal to the driver about the state of the combined switch. The feedback control circuit could comprise sensing circuits such as current sensing or short-circuit sensing and provide this information to the driver. The driver could utilize this information to adjust the voltage levels on OUT1, OUT2, OUT3, or the time sequence or the slew-rates to provide (i) increased performance (ii) enhanced reliability. The decision regarding the feedback can come from an additional controller or can be embedded within the driver. As an example, the feedback control may detect the voltage across the combined switch and at higher voltages (e.g. above 5V) it may lower the voltage level applied to the gate of the GaN Power HEMT 10. The switching frequency or time sequences could also change as a function of the feedback loop control. Another scenario can be when the feedback control circuit detects the current or the temperature in the GaN Power HEMT 10 exceed a certain level, the driver output voltage is configured to take certain actions such as either lower the gate voltage applied to the gate of the Power HEMT 10 or shut off the GaN Power HEMT for a period of time or depending on other threshold levels for current or temperature. In this period, the vertical switch 40 driving signal may not be affected, and the vertical switch may handle the extra load current. The feedback loop circuit can be monolithically integrated with the Power HEMT, 10. It can also be a part of or regarded as being a part of the interface circuit. The feedback loop circuit can gather certain information regarding the status of the GaN Power IC, such as the current in the Power HEMT 10 or the voltage across the drain-source terminals of Power HEMT 10 or the temperature within the GaN Power IC, however not limiting to only these conditions. As an additional control, the feedback signal may also be provided to the interface circuit to internally control the GaN power HEMT while the driver controls the device externally. The feedback control circuit may be provided in the subsequent embodiments of the invention, however it is not shown for simplicity.

Figure 33C:
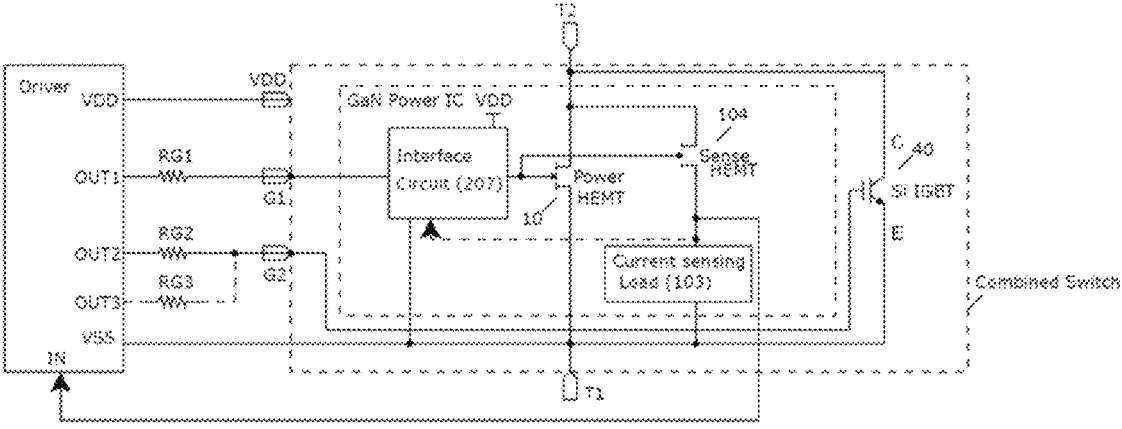
FIG. 33c illustrates an example of a semiconductor switch wherein a control terminal and a transistor device gate terminal are configured to be driven by a driver along with a feedback control circuit, wherein a current sensing HEMT acts as a feedback control circuit.

FIG. 33*c* illustrates a further example of the first aspect of the present disclosure, featuring a multiple input semiconductor switch power IC with individual connections for driving the gates of the GaN power HEMT (10) and high voltage switch (40). In this embodiment, the feedback control circuit 301 shown in FIG. 33*b* is exemplified by a Sense HEMT 104. The Sense HEMT 104 is a scaled down, identical version of the Power HEMT (e.g. by an area of 10 to 1000×). The Sense HEMT could be integrated monolithically with the Power HEMT. The Sense HEMT can directly sense the current of the Power HEMT and this information can be communicated directly or indirectly (for example through the voltage signal across a current sensing load as shown in FIG. 14) to the driver. The driver (or a separate controller—not shown) could decide to change the driving voltages, time sequence, slew rates or frequency of the output pins to the combination switch, function of the feedback provided. As an additional control, the feedback signal may also be provided to the interface circuit to internally control the GaN power HEMT while the driver controls the device externally.

Figure 34:
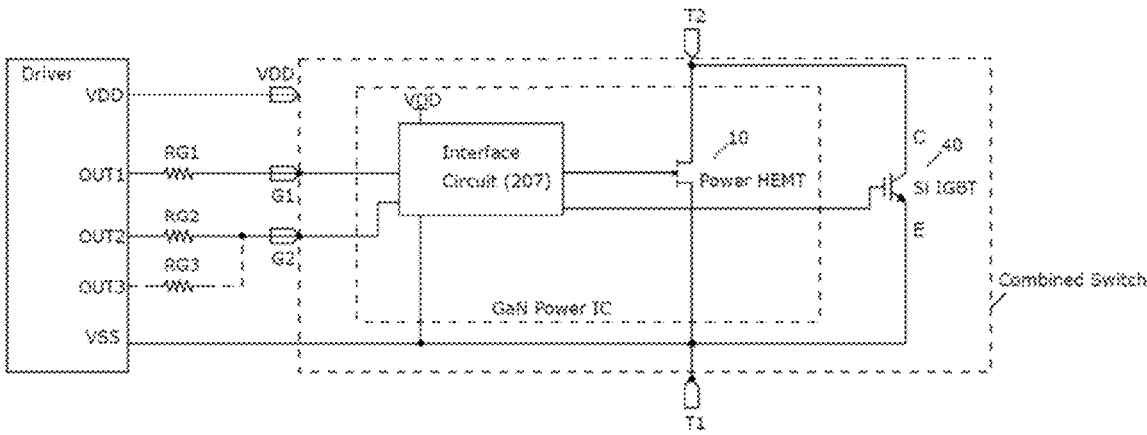
FIG. 34 illustrates an example of a semiconductor switch wherein the transistor device gate terminal is driven via an interface circuit.

FIG. 34 illustrates another example according to the present disclosure, where the gate of the high voltage switch 40 (e.g. IGBT) is also driven through the interface circuit 207, preferably incorporated within the GaN Power IC. The interface circuit 207 can internally control the lead/lag and slew rates of the operation of the switches through additional circuits such as logic circuits, signal conditioning circuits, latch circuits, delay circuits, networks of resistors and capacitors etc. Additionally, the interface circuit can provide functionality of clamping, voltage limiting, voltage regulation, sensing and protection and other control functions for the high voltage transistor (40), and/or for the GaN Power HEMT (10).

Figure 35:
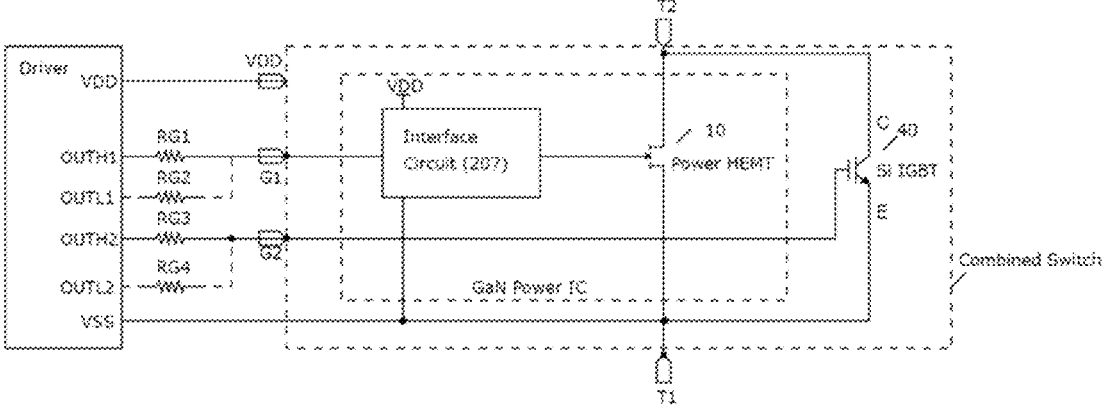
FIG. 35 illustrates an example of a (combined) semiconductor switch wherein each device forming the semiconductor switch may be driven by respective gate signals where turn-on and turn-off signals are provided separately.

FIG. 35 illustrates a further example according to the present disclosure, where each switch or device (10) or (40) may be driven by respective gate signals where the turn-on and turn-off signals are provided separately. This may assist in adjusting the speed of the switches by selecting the values of the resistors. This can also be used for a more balanced (or more desirable) sharing of the current during the transient voltages. These resistors may be provided externally or incorporated already in the driver. Monolithically integrated slew rate circuits can also serve this purpose, however, having this external mechanism provides flexibility of dynamically controlling and adjusting the speeds and slew rate resulting in a universal switch that can be adapted for various applications.

Figure 36:
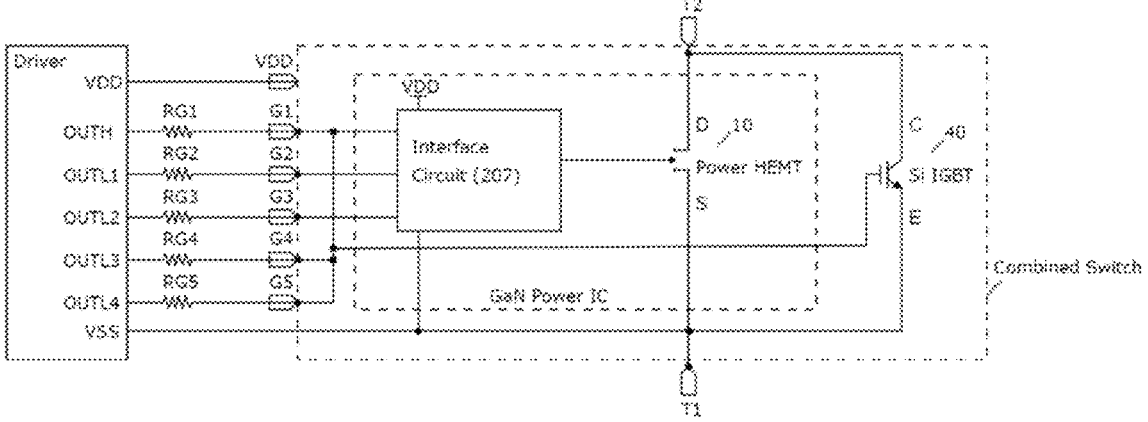
FIG. 36 illustrates an example of a semiconductor switch wherein the multiple turn-off driving inputs are provided to adjust the turn-off speed of the power integrated circuit.

FIG. 36 illustrates an example according to the present disclosure, wherein the power IC is configured to have multiple turn-off gate driving inputs to adjust the turn-off speed. These turn-off inputs may be independently provided for the GaN power HEMT 10 and the high voltage switch 40 (IGBT). A multi-output driver with independent outputs for High and Low signals would drive this switch. For example, as shown in FIG. 36, there may be a single turn-on pin G1 to turn-on the GaN power HEMT 10 through the interface circuit 207 and the high voltage switch 40 (IGBT) directly. There may be multiple turn-off pins such as G2 and G3 for GaN power HEMT 10, and G4 and G5 for high voltage switch 40 (IGBT).

In the example illustrated in FIGS. 36, G2 and G4 may be providing the regular turn-off signal to the GaN Power HEMT 10 (through the interface circuit 207) and the high voltage switch 40 (IGBT), respectively. Additionally, G3 and G5 are configured to provide delayed or slower turn-off signal for slow turn-off of the GaN power HEMT 10 and high voltage switch 40 (IGBT), respectively. Based on the application of the switch, RG3 and RG5 would be significantly higher than RG2 and RG4 to enable the slower turn-off. As an example, if RG2 is 5 Ohm then RG3 may be 10 Ohm.

Figure 37:
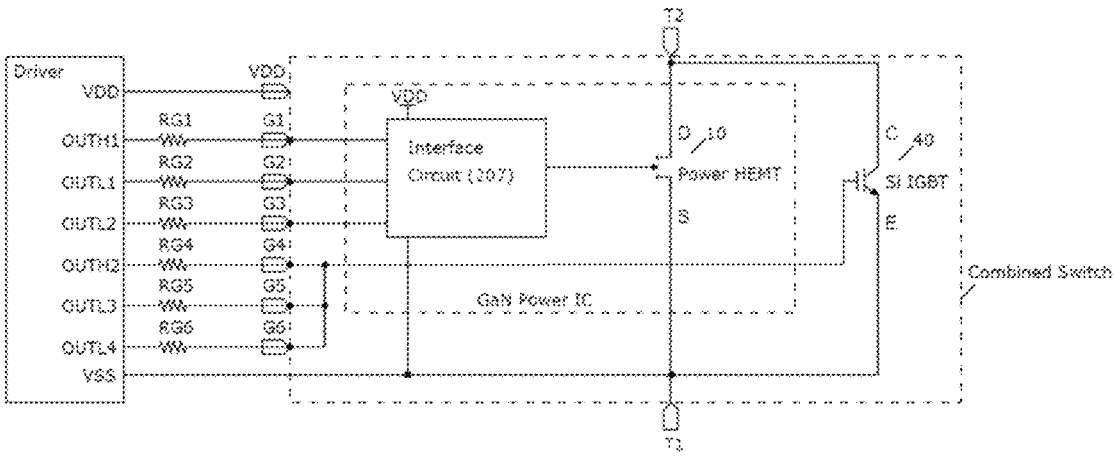
FIG. 37 illustrates an example of a semiconductor switch comprising a power HEMT and a high voltage switch each configured to have their own turn-on pins.

FIG. 37 illustrates an example of a semiconductor switch according to the present disclosure where the power HEMT 10 and high voltage switch 40 (IGBT) are configured to have their own turn-on pins (G1, G4). Although the example shows one turn-on input and two turn-off inputs for each transistor (HEMT and IGBT), it will be understood that there may be additional turn-on/turn-off connections based on the requirement of the application of the power IC. These may provide options for additional slew rate control during turn-on/turn-off. The power IC can be operated through a conventional single output driver, by shorting the gate pins and providing resistances internally. Alternatively, the slow turn-on/turn-off pins may be left unconnected if there is no need to modulate the turn-on/turn-off speed or slew rate. Thus, the proposed power IC is a configurable semiconductor switch power IC where the turn-on/turn-off speeds/slew-rate can be dynamically controlled.

Figure 38:
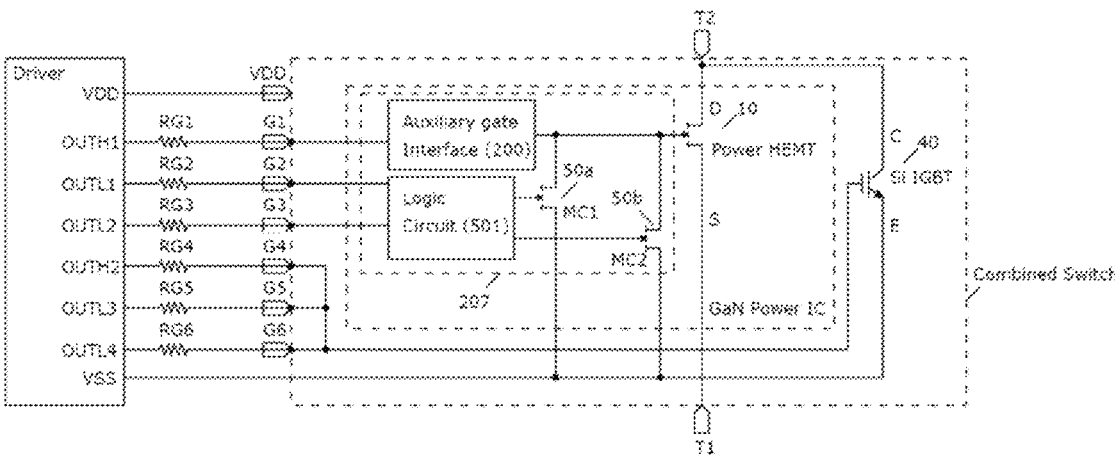
FIG. 38 illustrates an example of a semiconductor switch comprising an example of an interface circuit.

FIG. 38 illustrates a simplified example of the interface circuit 207. Other examples of interface circuits 207 described herein, such as the example illustrated in FIG. 15, may also be suitable for use with the examples illustrated in FIGS. 33 to 37 of the present disclosure. As an example, the auxiliary gate interface (200) comprises an auxiliary low power HEMT and a voltage limiter. The voltage limiter may be a circuit block which can limit (or clamp) the maximum voltage at the gate of the auxiliary low power HEMT. Through this manner of operation, the voltage limiter may overall act to provide a limit on the maximum voltage on the gate terminal of the GaN power HEMT. The auxiliary low power HEMT and the voltage limiter may be monolithically integrated with the GaN power HEMT.

Additionally, the interface circuit 207 may include a pull down device (Miller clamp MC1) and its associated driving circuit. For simplicity, the Miller clamp may be an active device (e.g. a low voltage HEMT), for example it may switch according to a signal applied to its gate terminal.

It may be desirable to have two pull-down transistors (i.e. two Miller Clamp transistors) connected in the same manner as they may be optimized for different functions. One of the Miller clamp transistors (50*a*) may be optimized to enable fast turn-off the GaN power HEMT (10) and/or to avoid a false turn-on of the GaN power HEMT (10) during regular operation of the power electronics circuit. In this case, it may be preferable for the Miller clamp transistor to have a low on-state resistance, for example <10Ω. The second transistor (50*b*) may be optimized to turn-off the power HEMT when a slow turn-off is selected based on the input on the slow turn-off pin G3, as described in previous examples. In this case, it may be preferable for the transistor 50*b* to have a higher on-state resistance (e.g. >10Ω) than the Miller clamp transistor (50*a*) intended to operate during regular operation of the device. This may be desirable in order to slow down the turn-off of the power HEMT (or decrease its slew rate during turn-off) and avoid any overvoltage across the power HEMT (for example between its drain and source terminals) due to parasitics in the circuit, for example due to a L*dI/dt voltage being generated across parasitic inductances in the power loop.

During the slow turn-off, the logic circuit may also activate the Miller Clamp HEMT intended for regular operation (50*a*) subsequently (e.g. through a delay circuit), enabling slow turn off via the slow miller clamp (MC2), but ensuring high dV/dt immunity in steady state from the main miller clamp (MC1). As an example, the delay circuit may be triggered through an AND operation of the high signal on G3 and the gate voltage of power HEMT below a threshold voltage to activate MC1 to provide additional dV/dt immunity.

Figure 39:
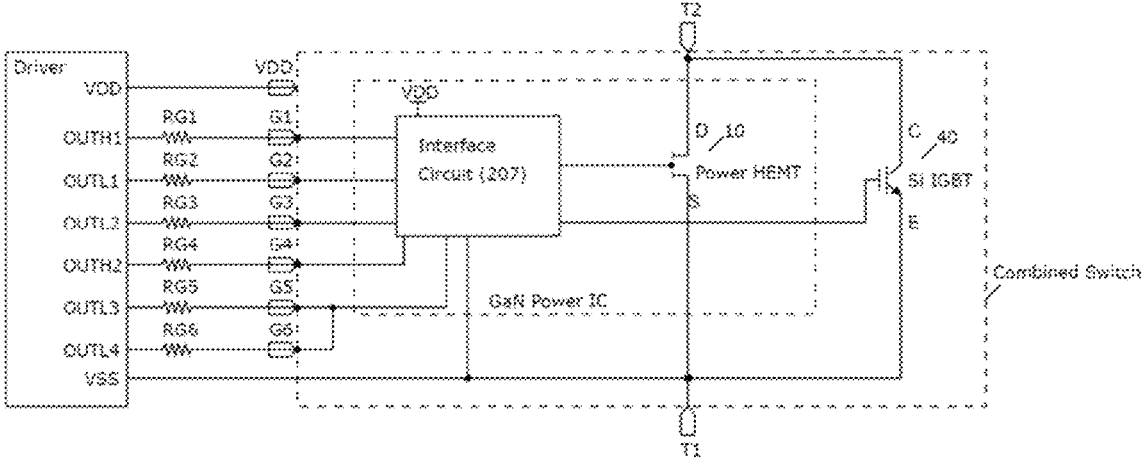
FIG. 39 illustrates an example of a semiconductor switch wherein all of the gate driving signals pass through an interface circuit.

FIG. 39 illustrates an alternative example according to the present disclosure, where all the gate driving signals pass through the interface circuit. In this example, the various output low pins may operate like 'turn off mode selectors' and the resultant turn off speed would be set inside the interface circuit, depending on which driver pin was pulled low.

Figure 40:
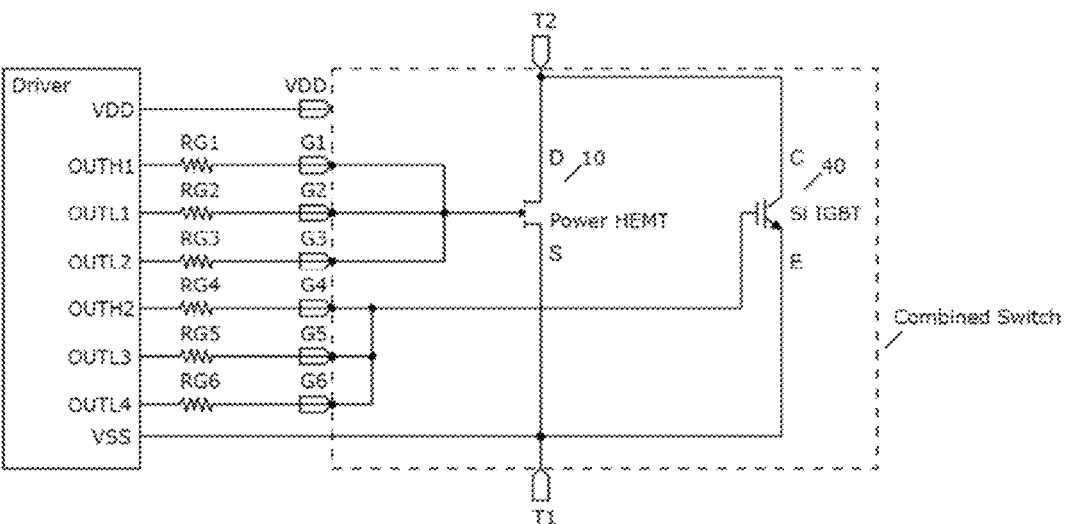
FIG. 40 illustrates an example of a semiconductor switch wherein different driving voltages can be provided at the gates of the devices forming the switch.

FIG. 40 illustrates another example according to the present disclosure, comprising a combined switch with a discrete GaN switch (Power HEMT, 10) and a vertical high voltage switch 40 (e.g. IGBT). As already mentioned, the vertical high voltage switch 40 can also be a Silicon Carbide vertical power MOSFET or a Silicon Carbide Superjunction. The possibility of having different driving voltages at the independent gates of the GaN power HEMT and the vertical high voltage switch can eliminate the requirement of an interface circuit which is needed to limit the voltage at the gate of the GaN power HEMT. As the voltage is externally controlled, the voltage levels and the turn-on and turn-off speeds and timings can be directly controlled through the external driver, and possibly other external components such as resistors and diodes. The resistors RG1, RG2 and RG3 can be external (preferably) or integrated in the driver (alternatively) and can set the speed of the turn-off and turn-on of the GaN power HEMT (10). To increase the dv/dt immunity and avoid false turn-on events, a Miller clamp may still be connected between the gate and source of the power HEMT. As an example, assuming G1 is the fastest, G2 and G3 the resistors RG1, RG2, RG3 may have a ratio of 1:5:10 of the resistance values. As an example, the voltage levels associated with the high voltage switch, 40 (e.g. IGBT) can be from −5V to 15V, while the voltage levels associated with the discrete GaN power HEMT (10) could be −3V to 7V.

Figure 41:
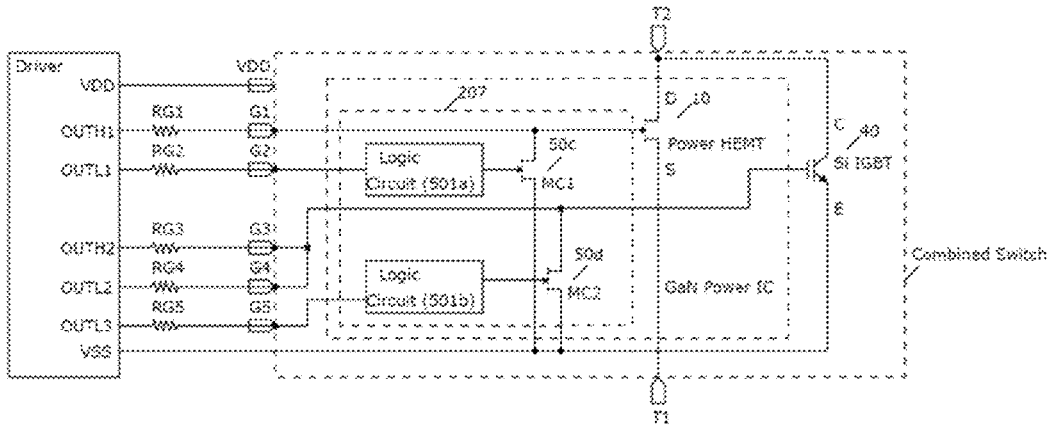
FIG. 41 illustrates an example of a semiconductor switch comprising respective Miller clamp transistors connected to the gates of each transistor device forming the switch.

FIG. 41 illustrates another example similar to the example shown in FIG. 40, the example of FIG. 41 comprising a combined switch with a discrete GaN switch (Power HEMT, 10) and a vertical high voltage switch 40 (e.g. IGBT) driven through different voltages at the independent gates of the GaN power HEMT and the vertical high voltage switch (e.g. IGBT). Additionally, one Miller Clamp each (50c, 50d) is connected to the gate of the power HEMT and the IGBT, respectively. The additional Miller clamp, 50d enables on-chip regulation or pull-down of the gate voltage of the IGBT. Both Miller clamps could be preferably integrated monolithically with the Power HEMT in the GaN Power IC.

Figure 42:
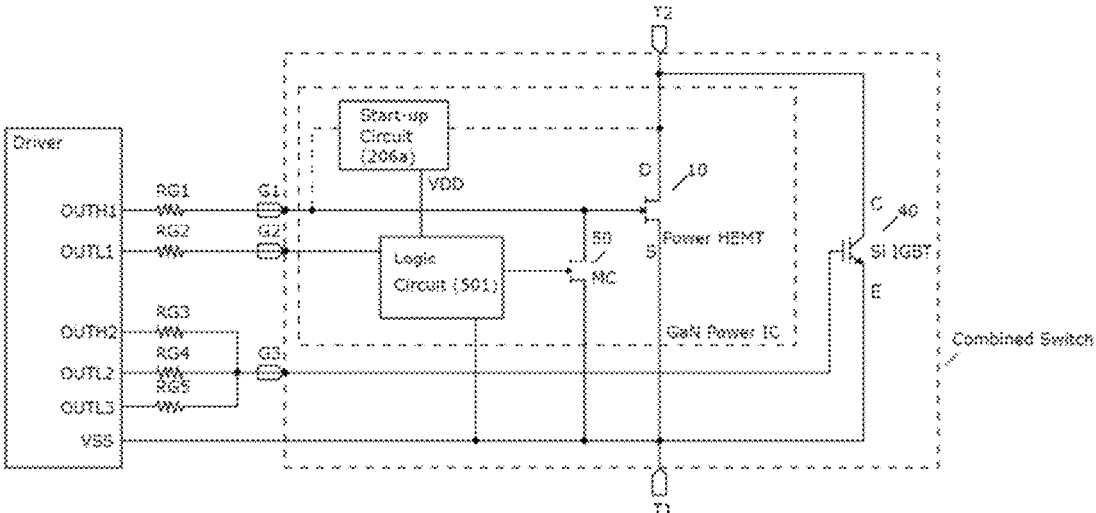
FIG. 42 illustrates an example of a semiconductor switch additionally comprising a start-up circuit.

FIG. 42 illustrates an example according to the present disclosure comprising the semiconductor switch power IC with an additional start-up circuit (206a) which may avoid the need to apply an external VDD voltage for the operation of the integrated circuit and the interface circuit blocks. In this example the voltage rail required by the interface circuit blocks may be generated internally through the start-up circuit from either the control terminal or the high voltage terminal (or both). The start-up circuit may comprise voltage regulators, voltage limiters, capacitors, depletion mode transistors, pass transistors and/or diodes.

Figure 43:
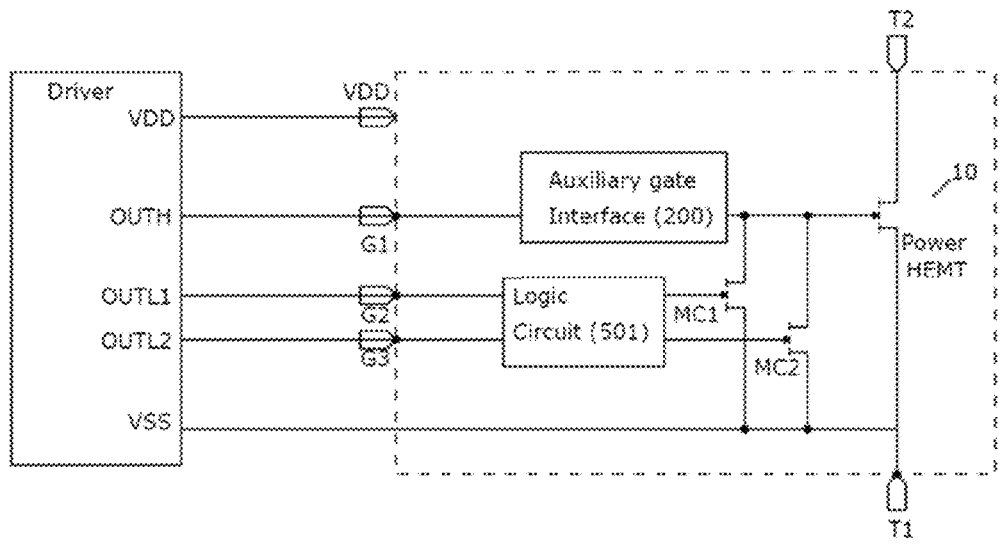
FIG. 43 illustrates an example of a semiconductor switch comprising a high voltage HEMT configured to enable dynamic adjustment of the turn-on and/or turn-off speeds of the high voltage HEMT.

FIG. 43 illustrates another example according to the present disclosure. The dynamic adjustment of turn-off/turn-on speeds of the switch can also be applied to a GaN power IC that may not have an IGBT in parallel. As described above, one of the Miller clamp transistors (MC1) may be optimized to enable fast turn-off the power HEMT and/or to avoid a false turn-on of the power HEMT during regular operation of the power electronics circuit through G2. In this case, it may be preferable for the Miller clamp transistor to have a low on-state resistance, for example <10Ω. The second transistor (50b) may be optimized to turn-off the power HEMT when a slow turn-off is selected based on the input on the low turn-off pin G3, to delay the turn-off of the device as described in previous examples. In this case it may be preferable for the transistor 50b to have a higher on-state resistance (e.g. >10Ω) than the Miller clamp transistor (50a) intended to operate during regular operation of the device.

This may be desirable in order to slow down the turn-off of the power HEMT and avoid any overvoltage across the power HEMT (for example between its drain and source terminals) due to parasitics in the circuit, for example due to a L*dl/dt voltage being generated across parasitic inductances in the power loop. Therefore, this multi-input configuration is beneficial for modulating even a GaN power IC. The Auxiliary gate interface 200 in FIG. 43 plays the role of a voltage regulator, and may be absent if the driver is capable to drive the GaN HEMT at lower voltages (e.g. −3 V to 7V) than those specific to the high voltage switch (e.g. −5 to 15V).

Figure 44:
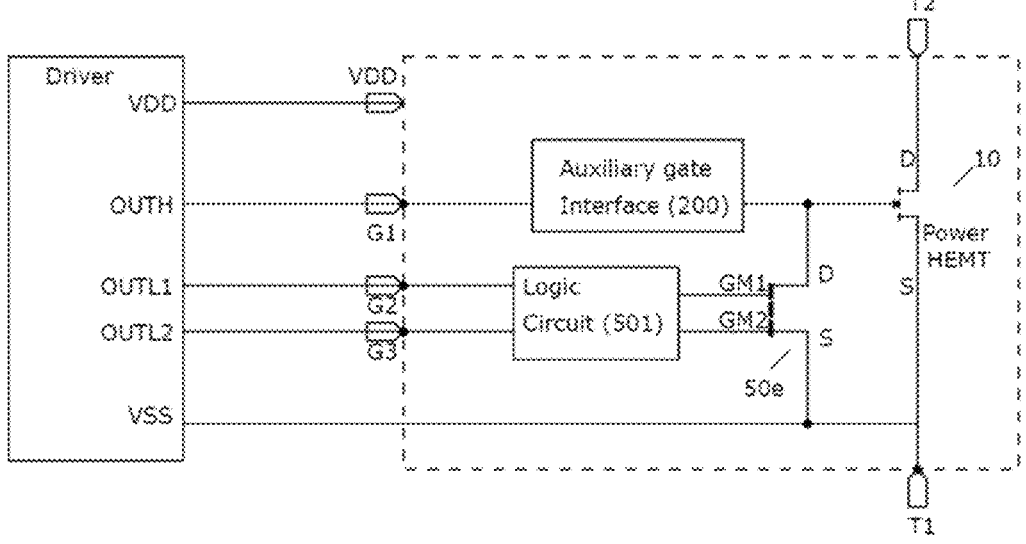
FIG. 44 illustrates an example of a semiconductor switch comprising a high voltage HEMT and a Miller clamp transistor comprising multiple gates.

FIG. 44 illustrates an alternative example of the example shown in FIG. 44, wherein a single low voltage HEMT with multiple gates may be used as a Miller Clamp (50e) to pull down the power HEMT during turn-off operations. The multiple gates can provide different on-resistances of the Miller Clamp when active. As described herein, the Auxiliary gate interface in FIG. 44 plays the role of a voltage regulator, and may be absent if the driver is capable to drive the GaN HEMT at lower voltages (e.g. −3V to 7V) than those specific to the high voltage switch (e.g. −5 to 15V).

Figure 45:
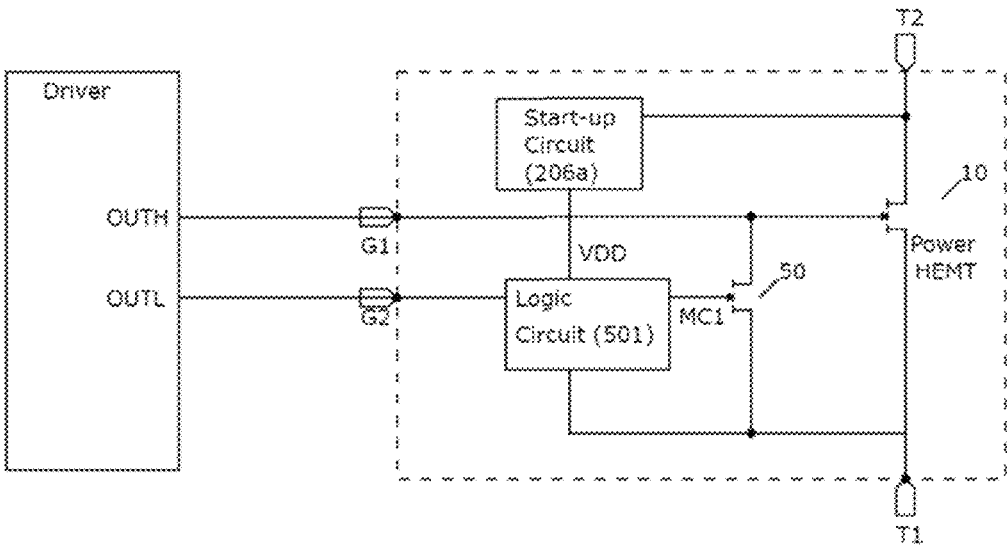
FIG. 45 illustrates an example of a semiconductor switch comprising a high voltage HEMT without an auxiliary interface circuit.

FIG. 45 illustrates an alternative example of the power IC comprising a power HEMT switch without an auxiliary interface circuit. This may be possible if the driver is capable to drive the GaN HEMT at lower voltages (e.g. 0V to 7V) through the turn-on gate terminal and therefore, a voltage regulator may not be needed.

The power IC comprises a pull down device (Miller Clamp MC1) and its associated driving circuit (logic circuit 501). For simplicity, the Miller clamp may be an active device, for example it may switch according to a signal applied to the turn-off terminals. The Miller clamp transistor is configured to enable fast turn-off the power HEMT and/or to avoid a false turn-on of the power HEMT during regular operation of the power electronics circuit. In this case, it may be preferable for the Miller clamp transistor to have a low on-state resistance, for example <10Ω.

Figure 46:
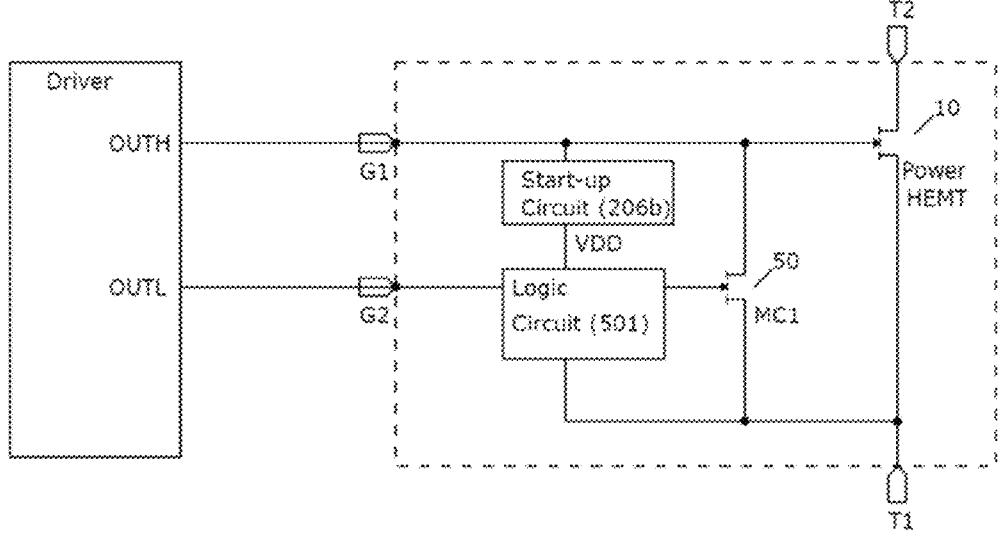
FIG. 46 illustrates an example of a semiconductor switch comprising a high voltage HEMT and a start-up circuit.

Additionally, a start-up circuit (206a) is provided which is configured to avoid the need to apply an external VDD voltage for the operation of the integrated circuit and the interface circuit blocks. In this embodiment, the voltage rail required by the interface circuit blocks may be generated internally through the start-up circuit from the high voltage terminal. Alternatively, the voltage rail required by the interface circuit blocks may be generated through the start-up circuit (206b) from the external gate terminal (turn-on gate terminal) as shown in FIG. 46.

Figure 47:
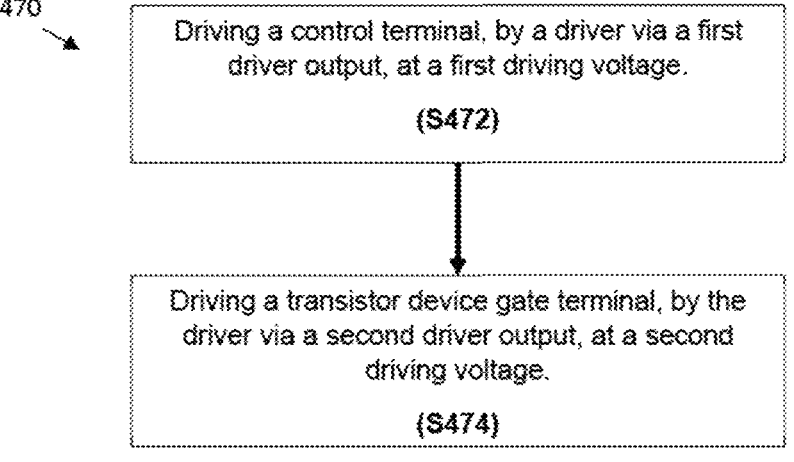
FIG. 47 schematically illustrates an example of a method of operating a semiconductor switch according to the present disclosure.

FIG. 47 illustrates an example of a method 470 of operating a semiconductor switch according to the present disclosure. The semiconductor switch may comprise any of the example semiconductor switches (also referred to as 'combined switches') illustrated in FIGS. 33 to 46, and described herein, and may comprise a high voltage HEMT (e.g. a GaN HEMT) comprising a high voltage HEMT terminal operatively connected to a control terminal, and a high voltage transistor device (e.g. a vertical device such as an IGBT), the high voltage transistor device comprising a transistor device gate terminal. For example, in a step S472, the method 470 comprises driving the control terminal, by a driver via a first driver output, at a first driving voltage. In a step S474, the method 470 comprises diving the transistor device gate terminal, by the driver via a second driver output, at a second driving voltage.

Further examples according to the present disclosure are provided in the following clauses:

1. A semiconductor switch comprising a first main terminal, a second main terminal, and a control terminal, the semiconductor switch comprising:

a III-nitride integrated circuit, the III-nitride integrated circuit comprising:

a high voltage HEMT, the high voltage HEMT comprising a high voltage HEMT source terminal, a high voltage HEMT drain terminal, and a high voltage HEMT gate terminal; and at least part of an interface circuit;

wherein the semiconductor switch further comprises a high voltage transistor device, the high voltage transistor device comprising a transistor device first terminal, a transistor device second terminal, and a transistor device gate terminal;

wherein the high voltage HEMT source terminal and the transistor device first terminal are operatively connected to the first main terminal;

wherein the high voltage HEMT drain terminal and the transistor device second terminal are operatively connected to the second main terminal; and wherein the high voltage HEMT gate terminal is operatively connected to the control terminal via the interface circuit, wherein the interface circuit is configurable to adjust a voltage applied to the control terminal to be operatively compatible with the high voltage HEMT gate terminal.

2. A semiconductor switch according to clause 1, wherein the interface circuit is partly disposed on a silicon circuit separate from the III-nitride integrated circuit.

3. A semiconductor switch according to clause 1 or clause 2, wherein the interface circuit comprises:

a low voltage auxiliary HEMT, the low voltage auxiliary HEMT comprising an auxiliary HEMT source terminal, an auxiliary HEMT drain terminal, and an auxiliary HEMT gate terminal; and a voltage limiter operatively connected to the auxiliary HEMT gate terminal;

wherein the auxiliary HEMT source terminal is operatively connected to the high voltage HEMT gate terminal;

wherein the auxiliary HEMT drain terminal is operatively connected to the control terminal; and wherein the voltage limiter is operatively connected to the high voltage HEMT source terminal and to the auxiliary HEMT gate terminal, further wherein the voltage limiter is configurable to limit a voltage across the high voltage HEMT gate terminal and the high voltage HEMT source terminal.

4. A semiconductor switch according to any one of the preceding clauses, wherein the transistor device gate terminal is operatively connected to the control terminal, and/or wherein the transistor device gate terminal is connected to the control terminal via the interface circuit.

5. A semiconductor switch according to any one of the preceding clauses, wherein the auxiliary HEMT drain terminal is operatively connected to the control terminal via a first resistance, and wherein the transistor device gate terminal is operatively connected to the control terminal via a second resistance.

6. A semiconductor switch according to any one of the preceding clauses, wherein the high voltage transistor device is a silicon and/or silicon carbide transistor.

7. A semiconductor switch according to any one of the preceding clauses, wherein the high voltage transistor device comprises an insulated-gate bipolar transistor (IGBT), and wherein the transistor device first terminal is an IGBT emitter terminal and the transistor device second terminal is an IGBT collector terminal.

8. A semiconductor switch according to any one of the preceding clauses, wherein the high voltage transistor device comprises a metal-oxide-semiconductor field-effect transistor (MOSFET), and wherein the transistor device first terminal is a MOSFET source terminal and the transistor device second terminal is a MOSFET drain terminal.

9. A semiconductor switch according to any one of the preceding clauses, wherein the high voltage transistor device comprises a superjunction, and wherein the transistor device first terminal is a superjunction source terminal and the transistor device second terminal is a superjunction drain terminal.

10. A semiconductor switch according to any one of the preceding clauses, wherein the high voltage HEMT source terminal, the high voltage HEMT drain terminal, and the high voltage HEMT gate terminal are laterally spaced from one another; and wherein the transistor device first terminal and the transistor device second terminal are vertically spaced from one another.

11. A semiconductor switch according to any one of the preceding clauses, wherein the high voltage HEMT is disposed on a first semiconductor substrate, and wherein the high voltage transistor device is disposed on a second semiconductor substrate, different from the first semiconductor substrate.

12. A semiconductor switch according to any one of the preceding clauses, wherein the high voltage HEMT and the low voltage auxiliary HEMT are disposed on a same semiconductor substrate.

13. A semiconductor switch according to any one of the preceding clauses, wherein:

the semiconductor switch is configured to turn-on or be in an on-state when the control terminal is driven with a peak voltage of 10 V or more; and wherein the semiconductor switch is configured to turn-off or be in an off-state when the control terminal is driven with a minimum voltage of 0 V or negative, or with a voltage of less than a lower of:

a threshold voltage of the high voltage HEMT; and a threshold voltage of the high voltage transistor device.

14 A semiconductor switch according to any one of the preceding clauses, wherein the semiconductor switch comprises multiple high voltage HEMTs in parallel with one or more high voltage transistor devices; or multiple III-nitride integrated circuits in parallel with one or more high voltage transistor devices.

15. A semiconductor switch according to any one of the preceding clauses, wherein the semiconductor switch comprises a series combination of two or more III-nitride high voltage HEMTs in parallel with one or more high voltage transistor devices; or a series combination of two or more III-nitride integrated circuits connected in parallel with one or more high voltage transistor devices.

16. A semiconductor switch comprising a first main terminal, a second main terminal, and a control terminal, the semiconductor switch comprising:

a Cascode device, the Cascode device comprising:

a MOSFET comprising a MOSFET drain terminal, a MOSFET gate terminal and a MOSFET source terminal;

a high voltage depletion mode III-nitride HEMT comprising a depletion HEMT drain terminal, a depletion HEMT gate terminal and a depletion HEMT source terminal;

wherein the MOSFET drain terminal is operatively connected to the depletion HEMT source terminal;

wherein the semiconductor switch further comprises a high voltage transistor device comprising a transistor device first terminal, a transistor device second terminal, and a transistor device gate terminal;

wherein the MOSFET source terminal and the transistor device first terminal are operatively connected to the first main terminal;

wherein the depletion HEMT drain terminal and the transistor device second terminal are operatively connected to the second main terminal;

wherein the MOSFET gate terminal is operatively connected to the control terminal.

17. A semiconductor switch according to clause 16, wherein the high voltage transistor device comprises an IGBT, a silicon carbide MOSFET or a superjunction; and the MOSFET comprises an n-channel MOSFET in vertical or quasi-vertical configuration.

18. A semiconductor switch according to clause 16 or clause 17, wherein the depletion HEMT gate terminal is operatively connected to the MOSFET source terminal and the first main terminal; and wherein the transistor device gate terminal and the MOSFET gate terminal are operatively connected to the control terminal.

19. A semiconductor switch according to any one of clauses 16 to 18, wherein the high voltage transistor device is a bipolar junction transistor, and wherein the depletion HEMT gate terminal is operatively connected to the MOSFET source terminal and the first main terminal; and wherein the transistor device gate terminal is operatively connected to the MOSFET drain terminal and the depletion HEMT source terminal, and wherein the MOSFET gate terminal is operatively connected to the control terminal.

20. A semiconductor switch according to any one of clauses 16 to 19, wherein the high voltage transistor device is a bipolar junction transistor, and wherein the transistor device gate terminal is operatively connected to the MOSFET drain terminal and the depletion HEMT source terminal, and wherein the MOSFET gate terminal is operatively connected to the control terminal, and wherein the depletion HEMT gate terminal is operatively connected to the control terminal via an interface circuit, and wherein the interface circuit is configured to adjust a voltage applied to the control terminal to be operatively compatible with the depletion HEMT gate terminal.

21. A semiconductor switch according to any one of clauses 16 to 20, wherein the MOSFET gate terminal is operatively connected to the control terminal through a slew-rate control circuit.

22. A semiconductor switch according to any one of clauses 1 to 15, wherein the high voltage HEMT source terminal and the transistor device first terminal are electrically connected to the first main terminal via a first passive component; and/or wherein the high voltage HEMT drain terminal and the transistor device second terminal are electrically connected to the second main terminal via a second passive component.

23. A semiconductor switch according to any one of clauses 1 to 15, wherein the high voltage HEMT source terminal is operatively connected to the first main terminal via a first inductive component, the first inductive component being operable to produce a first temporal lag between the first main terminal and the high voltage HEMT source terminal; and wherein the transistor device first terminal is operatively connected to the first main terminal via a second inductive component, the second inductive component being operable to produce a second temporal lag between the first main terminal and the transistor device first terminal.

24. A semiconductor switch according to any one of clauses 1 to 15, wherein the III-nitride integrated circuit and the high voltage transistor device are disposed in a singular package.

25. A semiconductor switch comprising a first main terminal, a second main terminal, and a control terminal, the semiconductor switch comprising:

at least one high voltage HEMT, the high voltage HEMT comprising a high voltage HEMT source terminal, a high voltage HEMT drain terminal, and a high voltage HEMT gate terminal; and at least one high voltage transistor device, the high voltage transistor device comprising a transistor device first terminal, a transistor device second terminal, and a transistor device gate terminal;

wherein the high voltage HEMT source terminal and the transistor device first terminal are operatively connected to the first main terminal;

wherein the high voltage HEMT drain terminal and the transistor device second terminal are operatively connected to the second main terminal; and wherein the high voltage HEMT gate terminal is operatively connected to the control terminal;

wherein the control terminal is operatively connected to a first driver output of a driver, and wherein the transistor device gate terminal is operatively connected to a second driver output of a driver; and wherein the control terminal is configured to be driven, by the driver via the first driver output, within a first driving voltage range; and wherein the transistor device gate terminal is configured to be driven, by the driver via the second driver output, within a second driving voltage range.

26. A semiconductor switch according to clause 25, wherein voltage levels within at least one of the first driving voltage range and the second driving voltage range are configured to vary selectably in time, corresponding to the semiconductor switch being selectably in an on-state mode, an off-state mode, a turn-on mode, or a turn-off mode.

27. A semiconductor switch according to clause 25 or clause 26, wherein a slew rate at the control terminal and/or the transistor device gate terminal are configured to vary selectably, corresponding to the semiconductor switch being selectably in the turn-on mode or the turn-off mode.

28. A semiconductor switch according to any one of clauses 25 to 27, wherein the control terminal is operatively connected to the first driver output via a first resistor, or via a first resistor in series with a first diode.

29. A semiconductor switch according to any one of clauses 25 to 28, wherein the transistor device gate terminal is operatively connected to the second driver output via a second resistor, or via a second resistor in series with a second diode.

30. A semiconductor switch according to any one of clauses 25 to 29, further comprising an interface circuit, wherein the high voltage HEMT gate terminal is operatively connected to the control terminal via the interface circuit, wherein the interface circuit is configurable to adjust voltage levels within the first driving voltage range to be operatively compatible with the high voltage HEMT gate terminal.

31. A semiconductor switch according to clause 30 as dependent on clause 26, wherein the interface circuit comprises a feedback circuit, the feedback circuit comprising at least one output operatively connected to a driver feedback input; and
   wherein the feedback circuit is configured to provide a feedback signal to the driver feedback input, the feedback signal corresponding to a sensed current, a sensed voltage, and/or a sensed temperature in the semiconductor switch.

32. A semiconductor switch according to clause 30 as dependent on clause 27, wherein the interface circuit comprises a feedback circuit, the feedback circuit comprising at least one output operatively connected to a driver feedback input; and
   wherein the feedback circuit is configured to provide a feedback signal to the driver feedback input, the feedback signal corresponding to sensed driving slew rates at the control terminal and/or the transistor device gate terminal.

33. A semiconductor switch according to any one of clauses 30 to 32, wherein the interface circuit is monolithically integrated with the high voltage HEMT.

34. A semiconductor switch according to any one of clauses 25 to 33, wherein the high voltage HEMT is a lateral III-nitride HEMT, optionally a GaN HEMT; and
   wherein the high voltage transistor device is any of:
      a vertical IGBT comprising silicon,
      a vertical power MOSFET comprising silicon, silicon carbide, and/or any other wide bandgap material, or
      a vertical superjunction device comprising silicon, silicon carbide, and/or any other wide bandgap material.

35. A semiconductor switch according to clause 30, wherein the interface circuit comprises:
   a low voltage auxiliary HEMT, the low voltage auxiliary HEMT comprising an auxiliary HEMT source terminal, an auxiliary HEMT drain terminal, and an auxiliary HEMT gate terminal; and
   a voltage limiter operatively connected to the auxiliary HEMT gate terminal;
   wherein the auxiliary HEMT source terminal is operatively connected to the high voltage HEMT gate terminal;
   wherein the auxiliary HEMT drain terminal is operatively connected to the control terminal; and
   wherein the voltage limiter is operatively connected to the high voltage HEMT source terminal and to the auxiliary HEMT gate terminal, further wherein the voltage limiter is configurable to limit a voltage across the high voltage HEMT gate terminal and the high voltage HEMT source terminal.

36. A semiconductor switch according to any one of clauses 25 to 35, wherein the interface circuit comprises a Miller clamp transistor, the Miller clamp transistor comprising a plurality of Miller clamp gates, wherein the interface circuit is configured such that an on-state resistance of the Miller clamp transistor depends on which Miller clamp gate(s) of the plurality of Miller clamp gates is active.

37. A semiconductor switch according to any one of clauses 25 to 36, wherein the interface circuit comprises a plurality of Miller clamp transistors having different on-state resistances.

38. A semiconductor switch according to clause 37, wherein the interface circuit further comprises a logic circuit configured to control activation of each Miller clamp transistor of the plurality of Miller clamp transistors.

39. A semiconductor switch according to clause 30, wherein the transistor device gate terminal is operatively connected to the second driver output via the interface circuit.

40. A semiconductor switch according to any one of clauses 25 to 39, wherein the control terminal is further operatively connected to a third driver output of the driver, wherein:
   when the semiconductor switch is in the turn-off mode, the control terminal is configured to selectably receive either:
      a regular turn-off signal comprising a first driving voltage level within the first driving voltage range, from the driver via the first driver output; or
      a delayed turn-off signal, or a slower turn-off signal, comprising a third driving voltage level within the first driving voltage range, from the driver via the third driver output.

41. A semiconductor switch according to any one of clauses 25 to 40, wherein the transistor device gate terminal is operatively connected to a fourth driver output of the driver, wherein:
   when the semiconductor switch is in the turn-off mode, the transistor device gate terminal is configured to selectably receive either:
      a regular turn-off signal comprising a second driving voltage level within the second driving voltage range, from the driver via the second driver output; or
      a delayed turn-off signal, or a slower turn-off signal, comprising a fourth driving voltage level within the second driving voltage range, from the driver via the fourth driver output.

42. A semiconductor switch according to clauses 28 and 40, wherein the control terminal is operatively connected to the third driver output via a third resistor, wherein a resistance of the third resistor is greater than a resistance of the first resistor.

43. A semiconductor switch according to clauses 29 and 41, wherein the transistor device gate terminal is operatively connected to the fourth driver output via a fourth resistor, wherein a resistance of the fourth resistor is greater than a resistance of the second resistor.

44. A semiconductor switch according to clause 40, comprising a first Miller clamp transistor and a second Miller clamp transistor, the first Miller clamp transistor and the second Miller clamp transistor being operatively connected to the High voltage HEMT gate terminal, the second Miller clamp transistor having a higher on-state resistance than the first Miller clamp transistor;

wherein the regular turn-off signal is configured to activate the first Miller clamp transistor;

and wherein the delayed turn-off signal, or the slower turn-off signal, is configured to activate the second Miller clamp transistor.

45. A semiconductor switch according to clause 30, wherein the interface circuit comprises a third Miller clamp transistor, the third Miller clamp transistor comprising a third Miller clamp drain terminal, wherein the third Miller clamp drain terminal is operatively connected to the high voltage HEMT gate terminal.

46. A semiconductor switch according to clause 45, wherein the interface circuit further comprises a fourth Miller clamp transistor, the fourth Miller clamp transistor comprising a fourth Miller clamp drain terminal, wherein the fourth Miller clamp drain terminal is operatively connected to the transistor device gate terminal.

47. A method of operating a semiconductor switch, the semiconductor switch comprising a first main terminal, a second main terminal, and a control terminal, the semiconductor switch comprising:

a high voltage HEMT, the high voltage HEMT comprising a high voltage HEMT source terminal, a high voltage HEMT drain terminal, and a high voltage HEMT gate terminal; and a high voltage transistor device, the high voltage transistor device comprising a transistor device first terminal, a transistor device second terminal, and a transistor device gate terminal;

wherein the high voltage HEMT source terminal and the transistor device first terminal are operatively connected to the first main terminal; and wherein the high voltage HEMT drain terminal and the transistor device second terminal are operatively connected to the second main terminal;

wherein the method comprises:

driving the control terminal, by a driver via a first driver output, within a first driving voltage range; and driving the transistor device gate terminal, by a driver via a second driver output, within a second driving voltage range.

48. A system comprising:

a semiconductor switch comprising a first main terminal, a second main terminal, and a control terminal, the semiconductor switch comprising:

a high voltage HEMT, the high voltage HEMT comprising a high voltage HEMT source terminal, a high voltage HEMT drain terminal, and a high voltage HEMT gate terminal; and a high voltage transistor device, the high voltage transistor device comprising a transistor device first terminal, a transistor device second terminal, and a transistor device gate terminal;

wherein the high voltage HEMT source terminal and the transistor device first terminal are operatively connected to the first main terminal;

wherein the high voltage HEMT drain terminal and the transistor device second terminal are operatively connected to the second main terminal; and wherein the high voltage HEMT gate terminal is operatively connected to the control terminal;

the system further comprising a driver, the driver comprising a first driver output and a second driver output;

wherein the control terminal is operatively connected to the first driver output, and wherein the transistor device gate terminal is operatively connected to the second driver output; and wherein the driver is configured to drive the controller, via the first driver output, within a first driving voltage range; and wherein driver is further configured to drive the transistor device gate terminal, via the second driver output, within a second driving voltage range.

49. A semiconductor switch comprising a HEMT, the HEMT comprising a gate terminal, the gate terminal being operatively connected to a first driver output of a driver and to a second driver output of the driver; wherein:

when the semiconductor switch is in a turn-off mode, the gate terminal is configured to selectably receive either:

a regular turn-off signal from the first driver output; or a delayed turn-off signal, or a slower turn-off signal, from the second driver output.

It will be appreciated that terms such as "top" and "bottom", "above" and "below", "lateral" and "vertical", and "under" and "over", "front" and "behind", "underlying", etc. may be used in this specification by convention and that no particular physical orientation of the device as a whole is implied.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A semiconductor switch comprising a first main terminal, a second main terminal, and a control terminal, the semiconductor switch comprising:

at least one high voltage HEMT, the high voltage HEMT comprising a high voltage HEMT source terminal, a high voltage HEMT drain terminal, and a high voltage HEMT gate terminal; and at least one high voltage transistor device, the high voltage transistor device comprising a transistor device first terminal, a transistor device second terminal, and a transistor device gate terminal;

wherein the high voltage HEMT source terminal and the transistor device first terminal are operatively connected to the first main terminal;

wherein the high voltage HEMT drain terminal and the transistor device second terminal are operatively connected to the second main terminal; and wherein the high voltage HEMT gate terminal is operatively connected to the control terminal;

wherein the control terminal is operatively connected to a first driver output of a driver, and wherein the transistor device gate terminal is operatively connected to a second driver output of the driver; and wherein the control terminal is configured to be driven, by the driver via the first driver output, within a first driving voltage range; and wherein the transistor device gate terminal is configured to be driven, by the driver via the second driver output, within a second driving voltage range;

wherein the control terminal is further operatively connected to a third driver output of the driver, wherein:

when the semiconductor switch is in the turn-off mode, the control terminal is configured to selectably receive either:

a regular turn-off signal comprising a first driving voltage level within the first driving voltage range, from the driver via the first driver output; or a delayed turn-off signal, or a slower turn-off signal, comprising a third driving voltage level within the first driving voltage range, from the driver via the third driver output.

2. The semiconductor switch according to claim 1, wherein voltage levels within at least one of the first driving voltage range and the second driving voltage range are configured to vary selectably in time, corresponding to the semiconductor switch being selectably in an on-state mode, an off-state mode, a turn-on mode, or the turn-off mode.

3. The semiconductor switch according to claim 1, wherein a slew rate at the control terminal and/or the transistor device gate terminal are configured to vary selectably, corresponding to the semiconductor switch being selectably in a turn-on mode or the turn-off mode.

4. The semiconductor switch according to claim 1, further comprising an interface circuit, wherein the high voltage HEMT gate terminal is operatively connected to the control terminal via the interface circuit, wherein the interface circuit is configurable to adjust voltage levels within the first driving voltage range to be operatively compatible with the high voltage HEMT gate terminal.

5. The semiconductor switch according to claim 2, further comprising a feedback circuit comprising at least one output operatively connected to a driver feedback input; and wherein the feedback circuit is configured to provide a feedback signal to the driver feedback input, the feedback signal corresponding to a sensed current, a sensed voltage, and/or a sensed temperature in the semiconductor switch.

6. The semiconductor switch according to claim 4, wherein the interface circuit comprises a Miller clamp transistor, the Miller clamp transistor comprising a plurality of Miller clamp gates, wherein the interface circuit is configured such that an on-state resistance of the Miller clamp transistor depends on which Miller clamp gate(s) of the plurality of Miller clamp gates is active.

7. The semiconductor switch according to claim 4, wherein the interface circuit comprises a plurality of Miller clamp transistors having different on-state resistances, wherein the interface circuit further comprises a logic circuit configured to control activation of each Miller clamp transistor of the plurality of Miller clamp transistors.

8. The semiconductor switch according to claim 4, wherein the transistor device gate terminal is operatively connected to the second driver output via the interface circuit.

9. The semiconductor switch according to claim 1, wherein the control terminal is operatively connected to the first driver output via a first resistor, or via a first resistor in series with a first diode, and wherein the control terminal is operatively connected to the third driver output via a third resistor, wherein a resistance of the third resistor is greater than a resistance of the first resistor.

10. The semiconductor switch according to claim 1, comprising a first Miller clamp transistor and a second Miller clamp transistor, the first Miller clamp transistor and the second Miller clamp transistor being operatively connected to the High voltage HEMT gate terminal, the second Miller clamp transistor having a higher on-state resistance than the first Miller clamp transistor;

wherein the regular turn-off signal is configured to activate the first Miller clamp transistor; and wherein the delayed turn-off signal, or the slower turn-off signal, is configured to activate the second Miller clamp transistor.

11. The semiconductor switch according to claim 4, wherein the interface circuit comprises a third Miller clamp transistor, the third Miller clamp transistor comprising a third Miller clamp drain terminal, wherein the third Miller clamp drain terminal is operatively connected to the high voltage HEMT gate terminal.

12. The semiconductor switch according to claim 11, wherein the interface circuit further comprises a fourth Miller clamp transistor, the fourth Miller clamp transistor comprising a fourth Miller clamp drain terminal, wherein the fourth Miller clamp drain terminal is operatively connected to the transistor device gate terminal.

13. A method of operating a semiconductor switch, the semiconductor switch comprising a first main terminal, a second main terminal, and a control terminal, the semiconductor switch comprising:

a high voltage HEMT, the high voltage HEMT comprising a high voltage HEMT source terminal, a high voltage HEMT drain terminal, and a high voltage HEMT gate terminal; and a high voltage transistor device, the high voltage transistor device comprising a transistor device first terminal, a transistor device second terminal, and a transistor device gate terminal;

wherein the high voltage HEMT source terminal and the transistor device first terminal are operatively connected to the first main terminal; and wherein the high voltage HEMT drain terminal and the transistor device second terminal are operatively connected to the second main terminal;

wherein the method comprises:

driving the control terminal, by a driver via a first driver output, within a first driving voltage range; and driving the transistor device gate terminal, by the driver via a second driver output, within a second driving voltage range;

wherein the control terminal is further operatively connected to a third driver output of the driver, and wherein the method further comprises:

when the semiconductor switch is in a turn-off mode, providing to the control terminal by a third driver output of the driver to selectably receive either:

a regular turn-off signal comprising a first driving voltage level within the first driving voltage range, from the driver via the first driver output; or a delayed turn-off signal, or a slower turn-off signal, comprising a third driving voltage level within the first driving voltage range, from the driver via the third driver output.

14. The semiconductor switch according to claim 4, comprising a feedback circuit comprising at least one output operatively connected to the interface circuit, wherein the feedback circuit is configured to provide a feedback signal to the interface circuit, the feedback signal corresponding to a sensed current, a sensed voltage, and/or a sensed temperature in the semiconductor switch.

15. A semiconductor switch comprising a first main terminal, a second main terminal, and a control terminal, the semiconductor switch comprising:

at least one high voltage HEMT, the high voltage HEMT comprising a high voltage HEMT source terminal, a high voltage HEMT drain terminal, and a high voltage HEMT gate terminal; and at least one high voltage transistor device, the high voltage transistor device comprising a transistor device first terminal, a transistor device second terminal, and a transistor device gate terminal;

wherein the high voltage HEMT source terminal and the transistor device first terminal are operatively connected to the first main terminal;

wherein the high voltage HEMT drain terminal and the transistor device second terminal are operatively connected to the second main terminal; and wherein the high voltage HEMT gate terminal is operatively connected to the control terminal;

wherein the control terminal is operatively connected to a first driver output of a driver, and wherein the transistor device gate terminal is operatively connected to a second driver output of a driver; and wherein the control terminal is configured to be driven, by the driver via the first driver output, within a first driving voltage range; and wherein the transistor device gate terminal is configured to be driven, by the driver via the second driver output, within a second driving voltage range;

wherein the transistor device gate terminal is operatively connected to a fourth driver output of the driver, wherein:

when the semiconductor switch is in a turn-off mode, the transistor device gate terminal is configured to selectably receive either:

a regular turn-off signal comprising a second driving voltage level within the second driving voltage range, from the driver via the second driver output; or a delayed turn-off signal, or a slower turn-off signal, comprising a fourth driving voltage level within the second driving voltage range, from the driver via the fourth driver output.

16. The semiconductor switch according to claim 15, wherein voltage levels within at least one of the first driving voltage range and the second driving voltage range are configured to vary selectably in time, corresponding to the semiconductor switch being selectably in an on-state mode, an off-state mode, a turn-on mode, or the turn-off mode.

17. The semiconductor switch according to claim 15, wherein a slew rate at the control terminal and/or the transistor device gate terminal are configured to vary selectably, corresponding to the semiconductor switch being selectably in a turn-on mode or the turn-off mode.

18. The semiconductor switch according to claim 15, further comprising an interface circuit, wherein the high voltage HEMT gate terminal is operatively connected to the control terminal via the interface circuit, wherein the interface circuit is configurable to adjust voltage levels within the first driving voltage range to be operatively compatible with the high voltage HEMT gate terminal, wherein the transistor device gate terminal is operatively connected to the second driver output via the interface circuit.

19. The semiconductor switch according to claim 18, wherein the interface circuit comprises a feedback circuit, the feedback circuit comprising at least one output operatively connected to a driver feedback input; and wherein the feedback circuit is configured to provide a feedback signal to the driver feedback input, the feedback signal corresponding to a sensed current, a sensed voltage, and/or a sensed temperature in the semiconductor switch.

20. The semiconductor switch according to claim 18 comprising a feedback circuit, the feedback circuit comprising at least one output operatively connected to the interface circuit, wherein the feedback circuit is configured to provide a feedback signal to the interface circuit, the feedback signal corresponding to a sensed current, a sensed voltage, and/or a sensed temperature in the semiconductor switch.

21. The semiconductor switch according to claim 18, wherein the interface circuit comprises a Miller clamp transistor, the Miller clamp transistor comprising a plurality of Miller clamp gates, wherein the interface circuit is configured such that an on-state resistance of the Miller clamp transistor depends on which Miller clamp gate(s) of the plurality of Miller clamp gates is active.

22. The semiconductor switch according to claim 18, wherein the interface circuit comprises a plurality of Miller clamp transistors having different on-state resistances, optionally wherein the interface circuit further comprises a logic circuit configured to control activation of each Miller clamp transistor of the plurality of Miller clamp transistors.

23. The semiconductor switch according to claim 15, wherein the transistor device gate terminal is operatively connected to the second driver output via a second resistor, or via a second resistor in series with a second diode; and wherein the transistor device gate terminal is operatively connected to the fourth driver output via a fourth resistor, wherein a resistance of the fourth resistor is greater than a resistance of the second resistor.

24. The semiconductor switch according to claim 18, wherein the interface circuit comprises a third Miller clamp transistor, the third Miller clamp transistor comprising a third Miller clamp drain terminal, wherein the third Miller clamp drain terminal is operatively connected to the high voltage HEMT gate terminal; and wherein the interface circuit further comprises a fourth Miller clamp transistor, the fourth Miller clamp transistor comprising a fourth Miller clamp drain terminal, wherein the fourth Miller clamp drain terminal is operatively connected to the transistor device gate terminal.

25. A method of operating a semiconductor switch, the semiconductor switch comprising a first main terminal, a second main terminal, and a control terminal, the semiconductor switch comprising:

a high voltage HEMT, the high voltage HEMT comprising a high voltage HEMT source terminal, a high voltage HEMT drain terminal, and a high voltage HEMT gate terminal; and a high voltage transistor device, the high voltage transistor device comprising a transistor device first terminal, a transistor device second terminal, and a transistor device gate terminal;

wherein the high voltage HEMT source terminal and the transistor device first terminal are operatively connected to the first main terminal; and wherein the high voltage HEMT drain terminal and the transistor device second terminal are operatively connected to the second main terminal;

wherein the method comprises:

driving the control terminal, by a driver via a first driver output, within a first driving voltage range; and driving the transistor device gate terminal, by a driver via
a second driver output, within a second driving voltage
range;

wherein the transistor device gate terminal is operatively
connected to a fourth driver output of the driver, and
wherein the method further comprises:

when the semiconductor switch is in a turn-off mode,
providing to the transistor device gate terminal select-
ably either:

a regular turn-off signal comprising a second driving
voltage level within the second driving voltage
range, from the driver via the second driver output;
or a delayed turn-off signal, or a slower turn-off signal,
comprising a fourth driving voltage level within the
second driving voltage range, from the driver via the
fourth driver output.

\* \* \* \* \*